United States Patent
Murata et al.

(10) Patent No.: US 12,520,607 B2
(45) Date of Patent: Jan. 6, 2026

(54) PHOTOELECTRIC CONVERSION ELEMENT, PHOTODETECTOR, PHOTODETECTION SYSTEM, ELECTRONIC APPARATUS, AND MOBILE BODY

(71) Applicant: SONY SEMICONDUCTOR SOLUTIONS CORPORATION, Kanagawa (JP)

(72) Inventors: Kenichi Murata, Kanagawa (JP); Masahiro Joei, Kanagawa (JP); Shintarou Hirata, Kanagawa (JP); Shingo Takahashi, Kanagawa (JP); Yoshiyuki Ohba, Kanagawa (JP); Takashi Kojima, Kanagawa (JP); Tomiyuki Yukawa, Kanagawa (JP); Yoshifumi Zaizen, Kanagawa (JP); Tomohiro Sugiyama, Kanagawa (JP); Masaki Okamoto, Kanagawa (JP); Takuya Masunaga, Kanagawa (JP); Yuki Kawahara, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 309 days.

(21) Appl. No.: 18/267,712

(22) PCT Filed: Dec. 14, 2021

(86) PCT No.: PCT/JP2021/046110
§ 371 (c)(1),
(2) Date: Jun. 15, 2023

(87) PCT Pub. No.: WO2022/131268
PCT Pub. Date: Jun. 23, 2022

(65) Prior Publication Data
US 2024/0055465 A1 Feb. 15, 2024

(30) Foreign Application Priority Data

Dec. 16, 2020 (JP) .................................. 2020-208716

(51) Int. Cl.
*H10F 39/12* (2025.01)
*H01L 21/3205* (2006.01)
(Continued)

(52) U.S. Cl.
CPC ....... *H10F 39/191* (2025.01); *H01L 21/3205* (2013.01); *H01L 21/768* (2013.01);
(Continued)

(58) Field of Classification Search
CPC ........ H10K 59/8722; H10K 30/00–353; H10F 39/184
See application file for complete search history.

(56) References Cited

U.S. PATENT DOCUMENTS

2009/0127440 A1   5/2009  Nakai
2011/0235017 A1   9/2011  Iwasaki
(Continued)

FOREIGN PATENT DOCUMENTS

JP   2002076312 A   3/2002
JP   2006121065 A   5/2006
(Continued)

OTHER PUBLICATIONS

International Search Report from corresponding PCT application PCT/JP2021/046110, dated Mar. 1, 2022.

*Primary Examiner* — Evren Seven
(74) *Attorney, Agent, or Firm* — K&L Gates LLP

(57) ABSTRACT

A highly functional photoelectric conversion element is provided. The photoelectric conversion element includes: a semiconductor substrate; a first photoelectric converter that is provided on the semiconductor substrate, and detects light
(Continued)

in a first wavelength range and photoelectrically converts the light; a second photoelectric converter that is provided at a position overlapping the first photoelectric converter in a thickness direction of the semiconductor substrate in the semiconductor substrate, and detects light in a second wavelength range and photoelectrically converts the light; an optical filter that is sandwiched between the first photoelectric converter and the second photoelectric converter in the thickness direction, and through which the light in the second wavelength range passes more easily than the light in the first wavelength range; and a first light-shielding member that surrounds the optical filter along a plane orthogonal to the thickness direction to at least partially overlap the optical filter in a plane direction along the plane, and shields at least the light in the second wavelength range.

45 Claims, 58 Drawing Sheets

(51) Int. Cl.
 H01L 21/768 (2006.01)
 H10F 39/00 (2025.01)
(52) U.S. Cl.
 CPC ....... H10F 39/8067 (2025.01); H10F 39/807 (2025.01); H10F 39/811 (2025.01)

(56) References Cited

U.S. PATENT DOCUMENTS

| | | |
|---|---|---|
| 2013/0234027 A1 | 9/2013 | Kurokawa |
| 2016/0037098 A1 | 2/2016 | Lee et al. |
| 2017/0094198 A1 | 3/2017 | Yun et al. |
| 2017/0170239 A1* | 6/2017 | Lee ........................ H10F 39/802 |
| 2017/0243913 A1 | 8/2017 | Lee et al. |
| 2019/0043911 A1 | 2/2019 | Honda et al. |
| 2019/0081191 A1* | 3/2019 | Manda .................... H04N 25/76 |
| 2019/0189696 A1 | 6/2019 | Yamaguchi et al. |
| 2020/0105812 A1 | 4/2020 | Sze |
| 2020/0119097 A1* | 4/2020 | Lee ........................ H10K 19/20 |
| 2020/0219914 A1 | 7/2020 | Kim et al. |
| 2021/0036061 A1* | 2/2021 | Leem ..................... H10K 30/30 |
| 2021/0273017 A1 | 9/2021 | Murata et al. |
| 2021/0296382 A1 | 9/2021 | Ono |
| 2022/0085110 A1 | 3/2022 | Shigetoshi et al. |
| 2022/0139978 A1 | 5/2022 | Kamei |

FOREIGN PATENT DOCUMENTS

| | | |
|---|---|---|
| JP | 2007189376 A | 7/2007 |
| JP | 2009063777 A | 3/2009 |
| JP | 2009267169 A | 11/2009 |
| JP | 2011199798 A | 10/2011 |
| JP | 2013217911 A | 10/2013 |
| JP | 2017069955 A | 4/2017 |
| JP | 2017152511 A | 8/2017 |
| JP | 2017208496 A | 11/2017 |
| JP | 2020113749 A | 7/2020 |
| KR | 20170099657 A | 9/2017 |
| KR | 20200085983 A | 7/2020 |
| WO | 2020026720 A1 | 2/2020 |
| WO | 2020026851 A1 | 2/2020 |
| WO | 2020158515 A1 | 8/2020 |
| WO | 2020166309 A1 | 8/2020 |

* cited by examiner

[ FIG. 1A ]
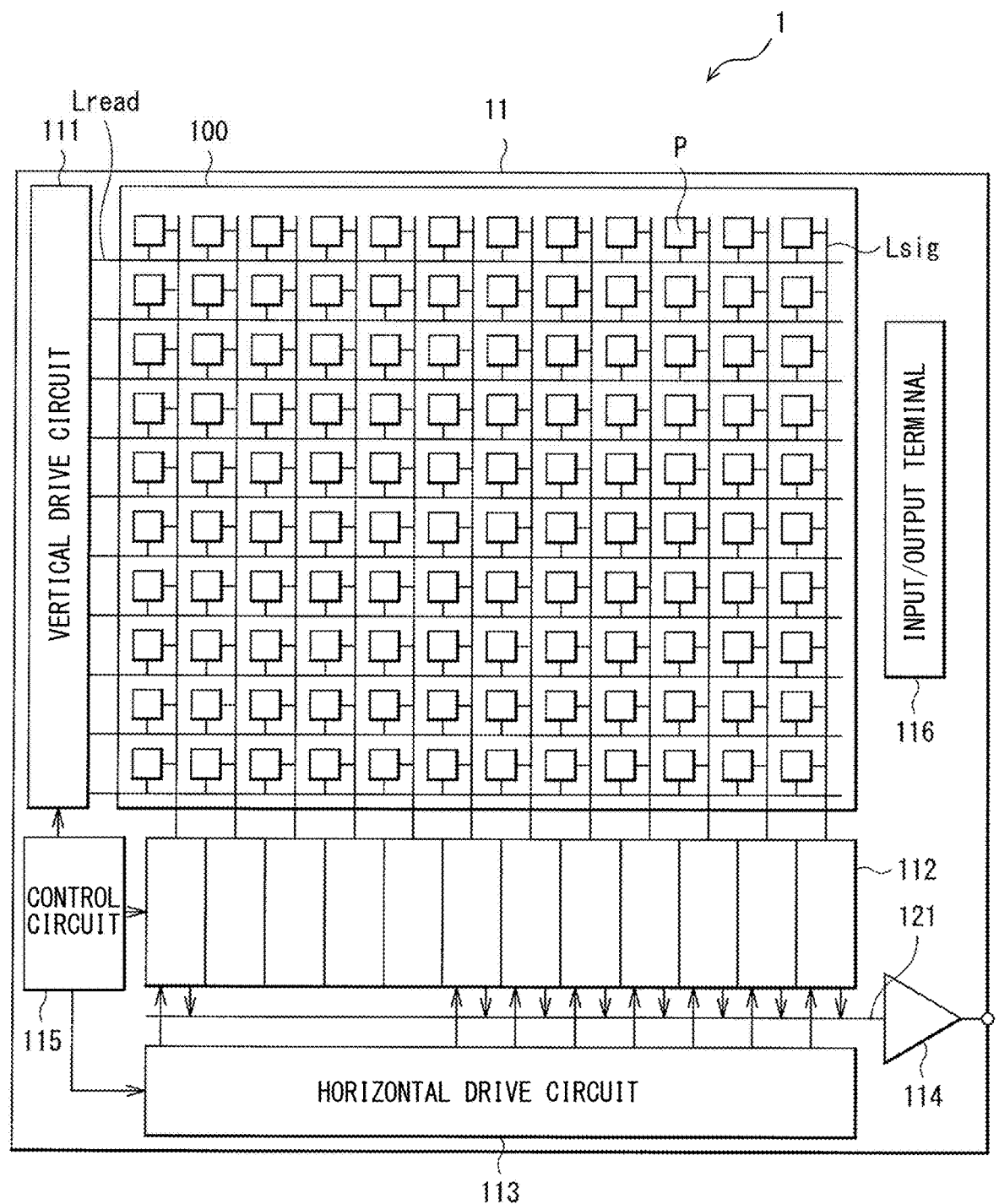

[ FIG. 1B ]
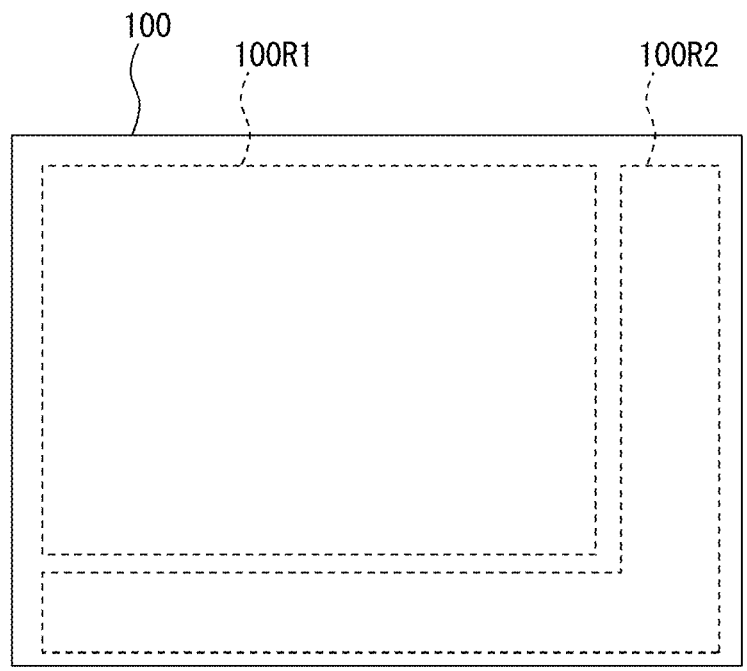

[ FIG. 2A ]
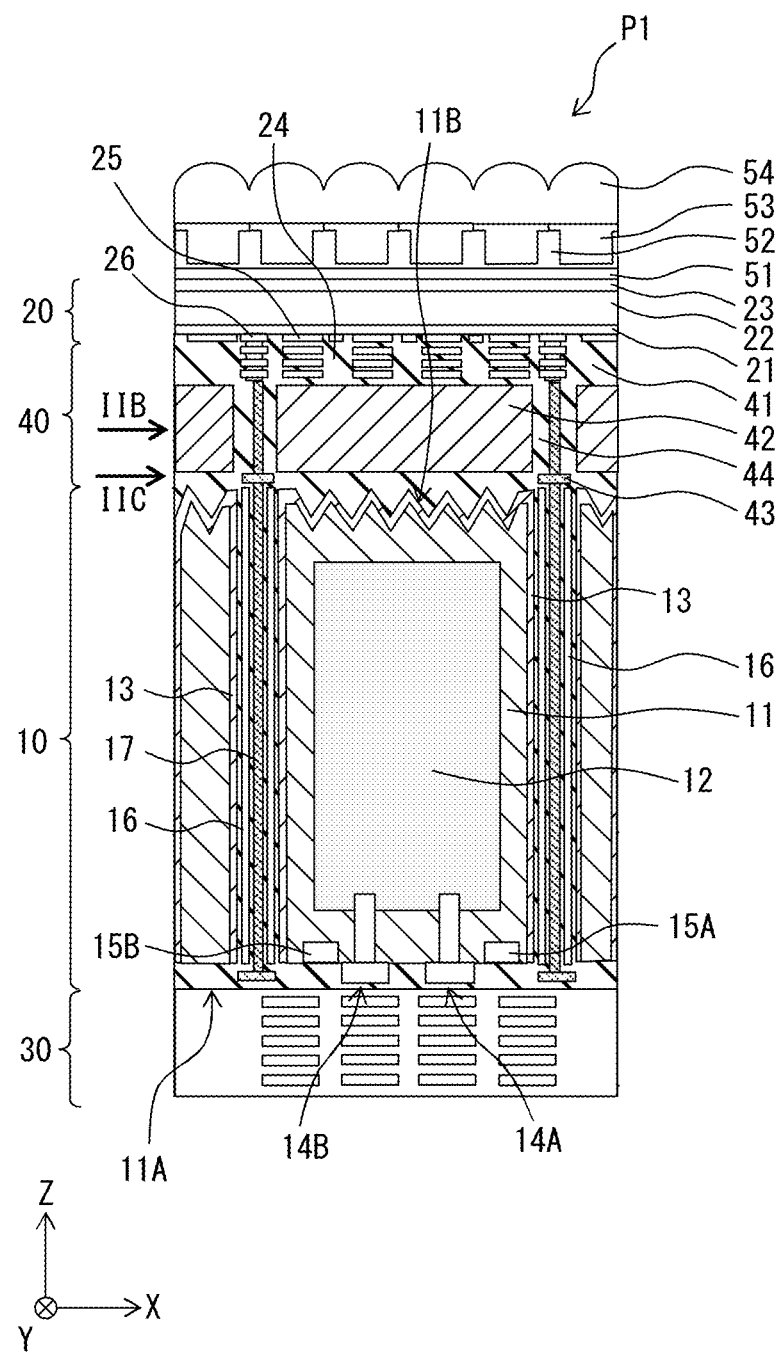

[ FIG. 2B ]
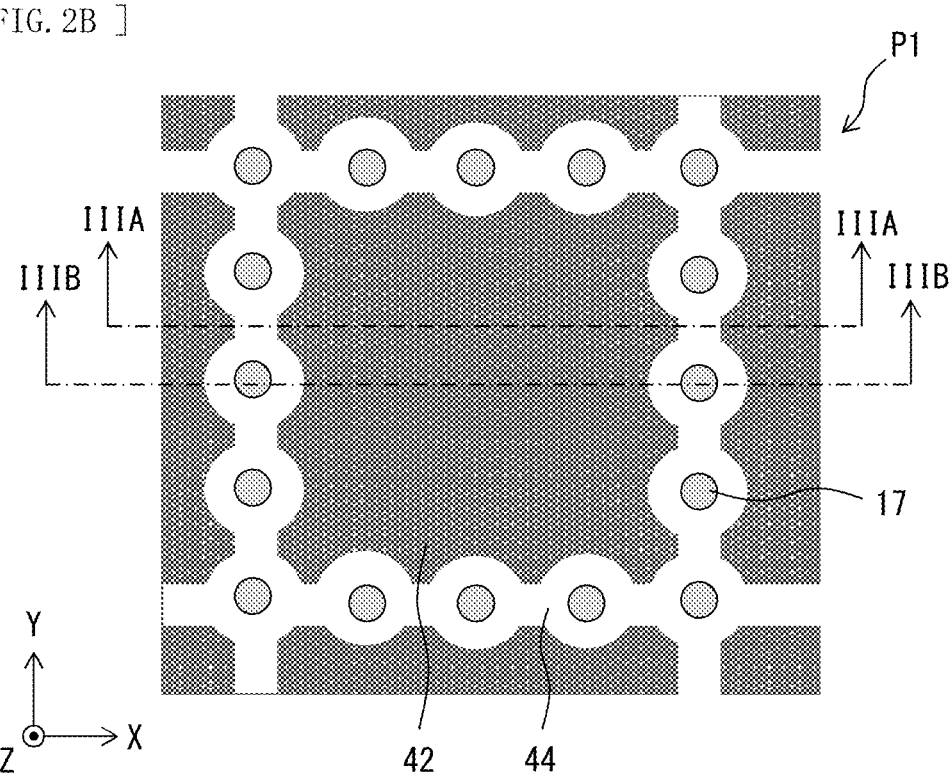
[ FIG. 2C ]
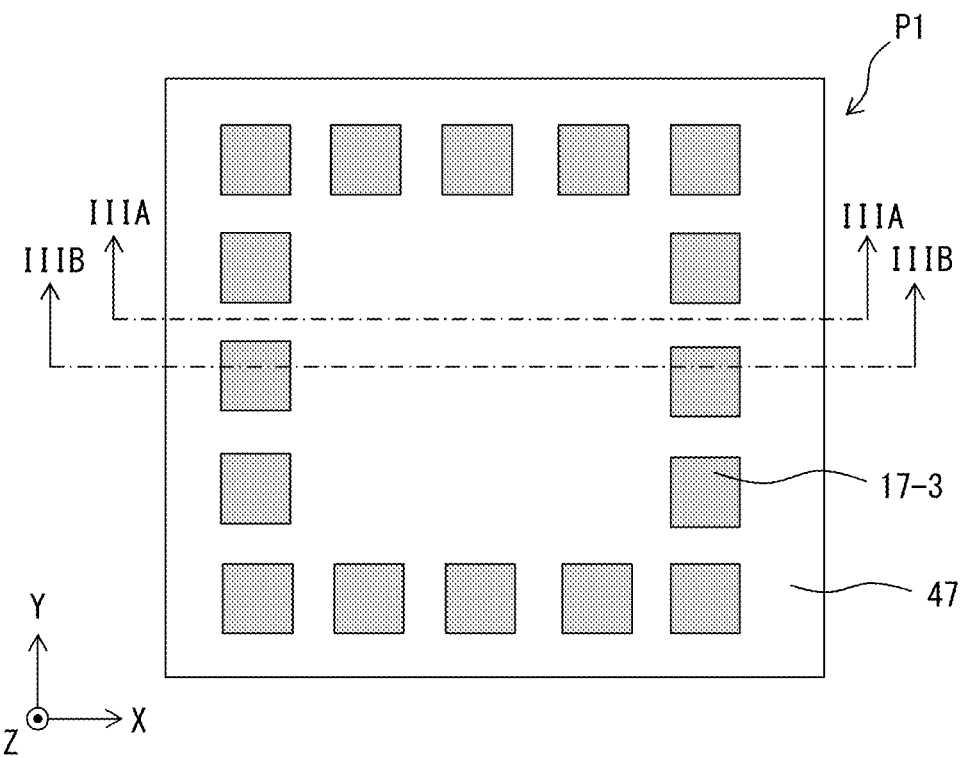

[ FIG. 3A ]
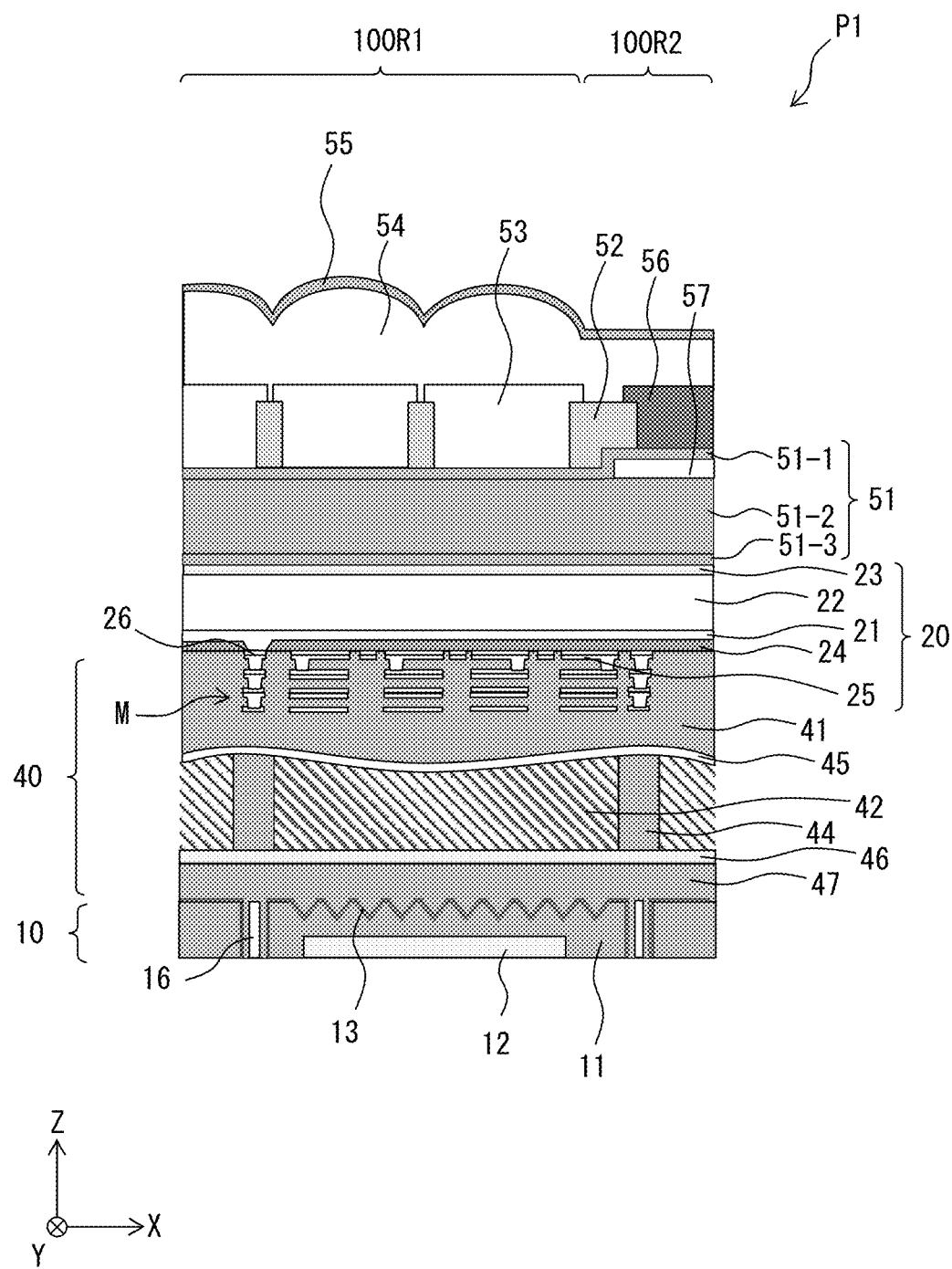

[ FIG. 3B ]
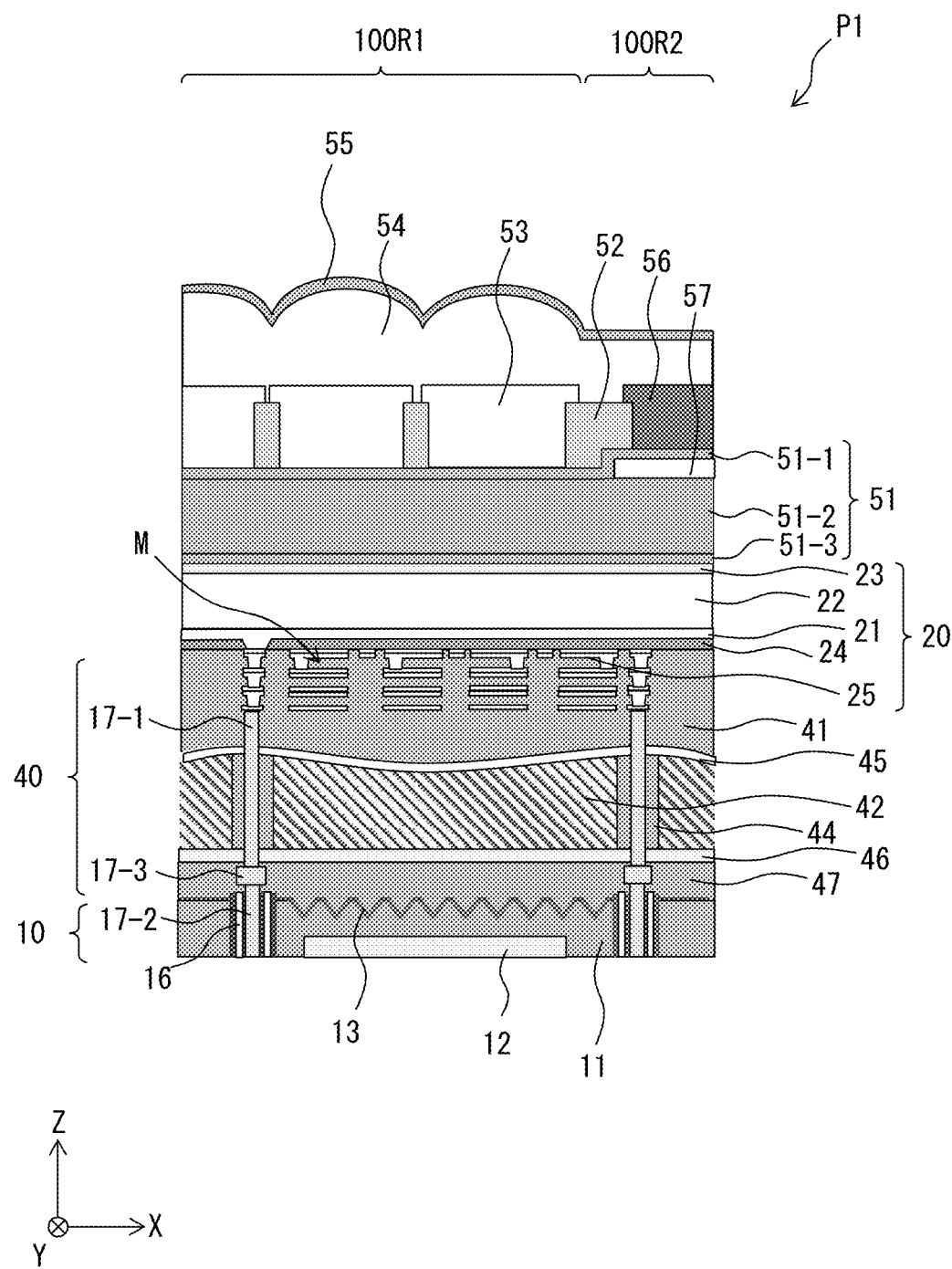

[FIG. 3C]
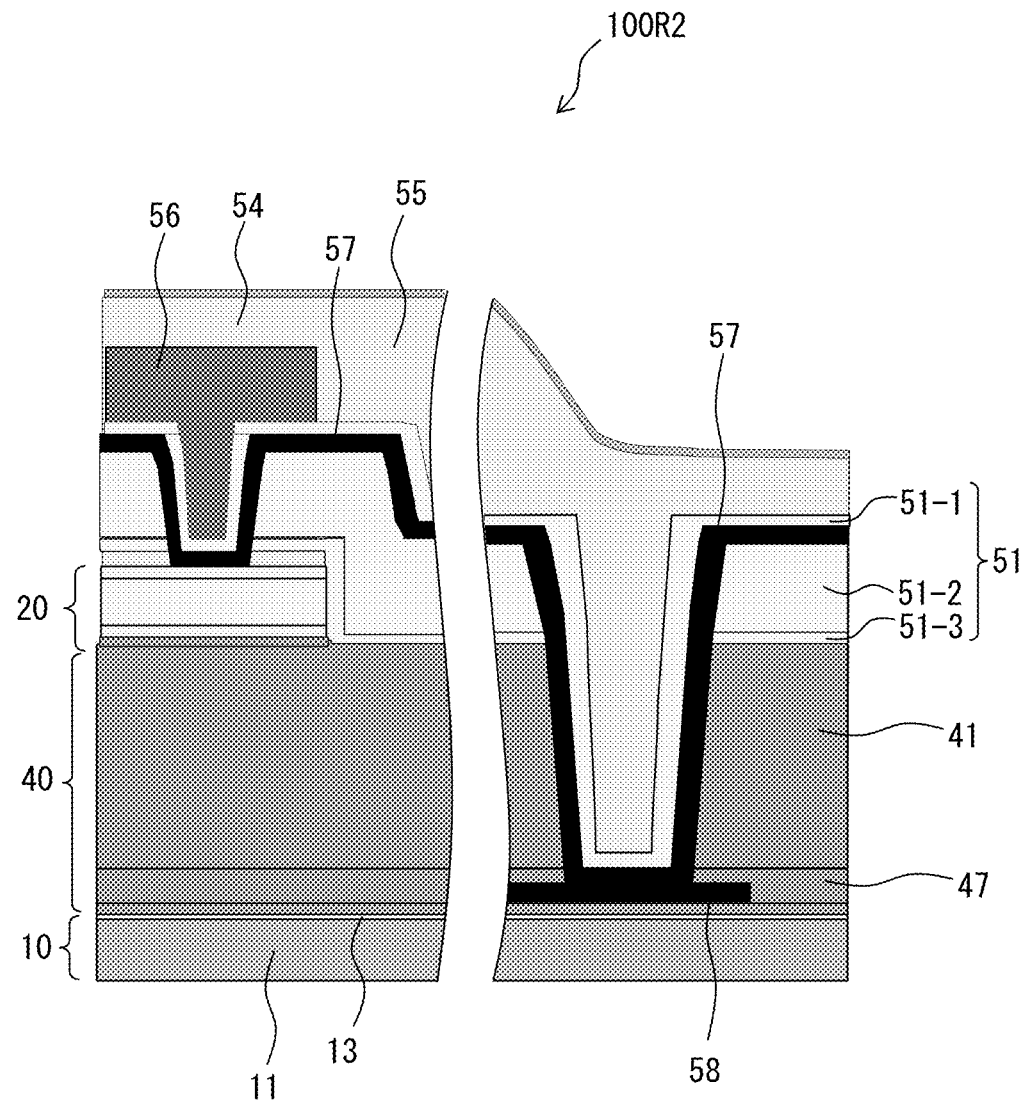

[ FIG. 4A ]
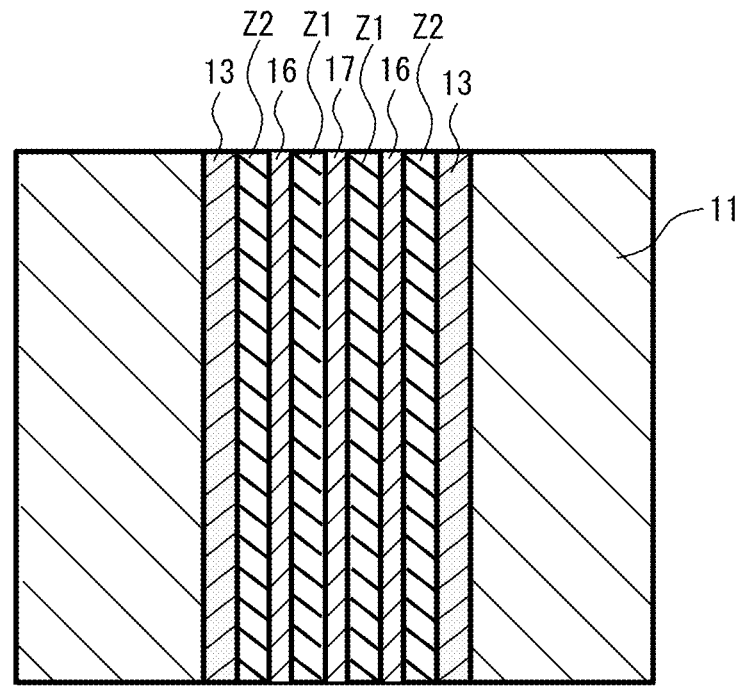
[ FIG. 4B ]
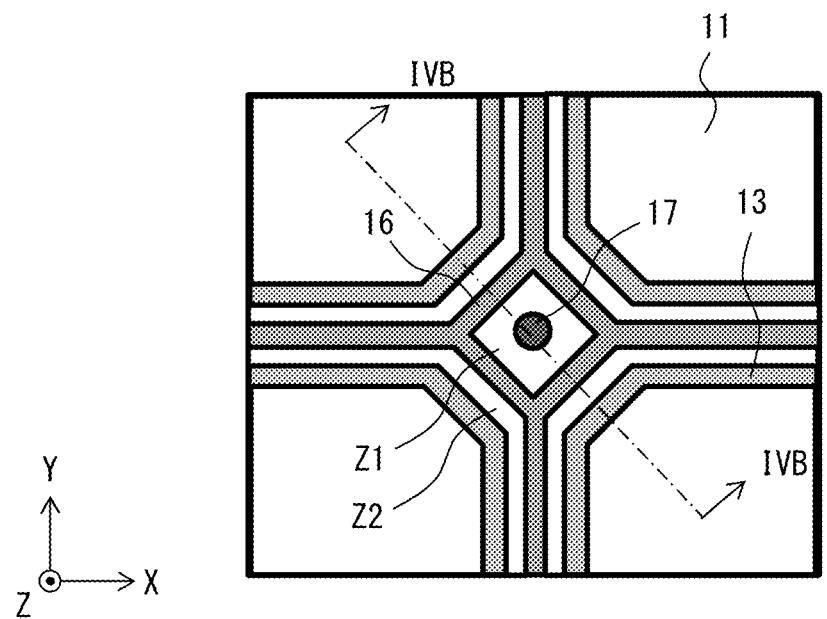

[ FIG. 5 ]
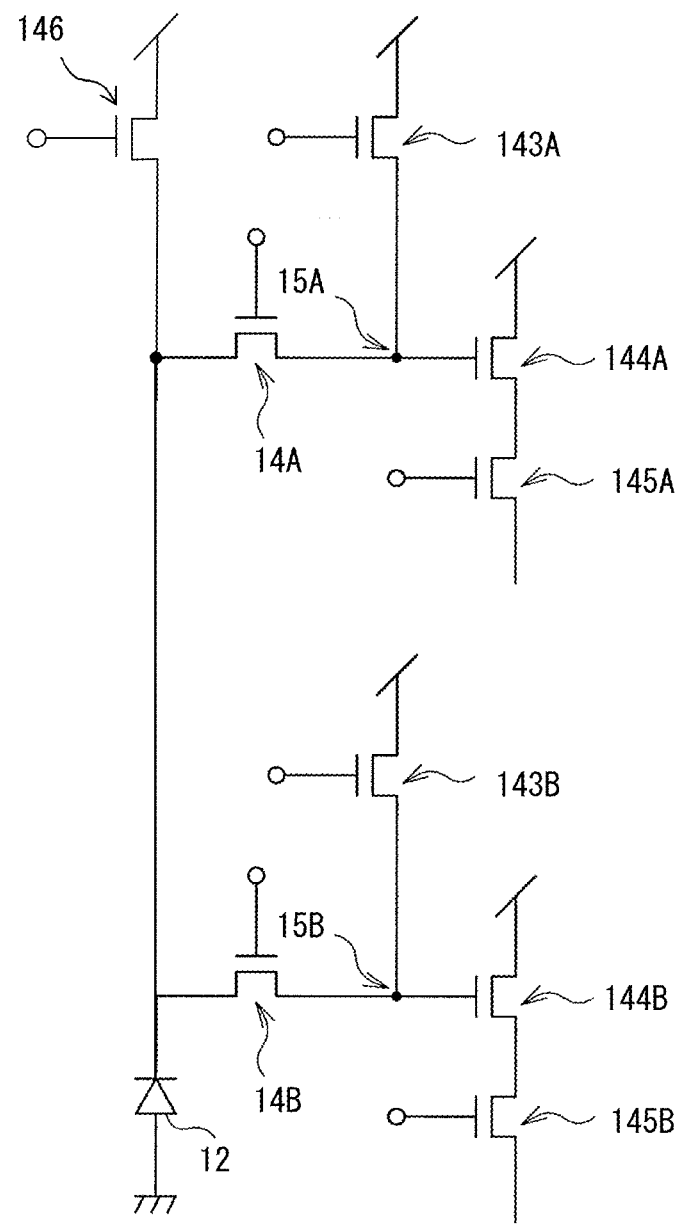

[ FIG. 6 ]
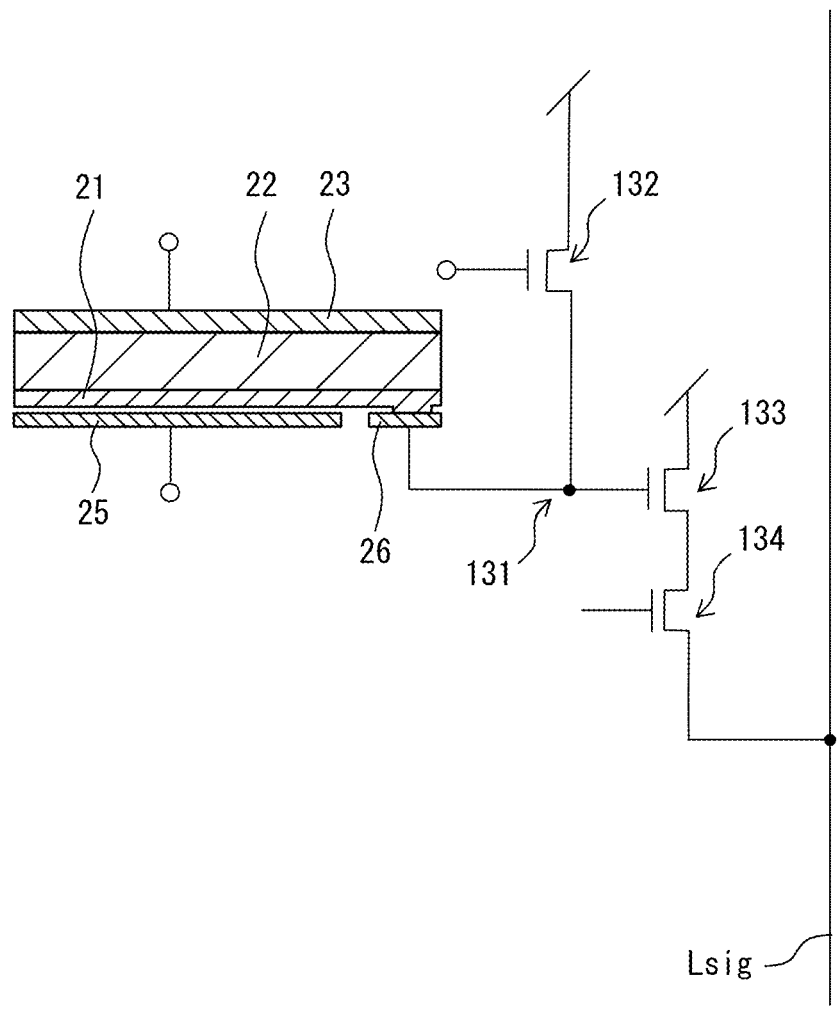

[FIG. 7]
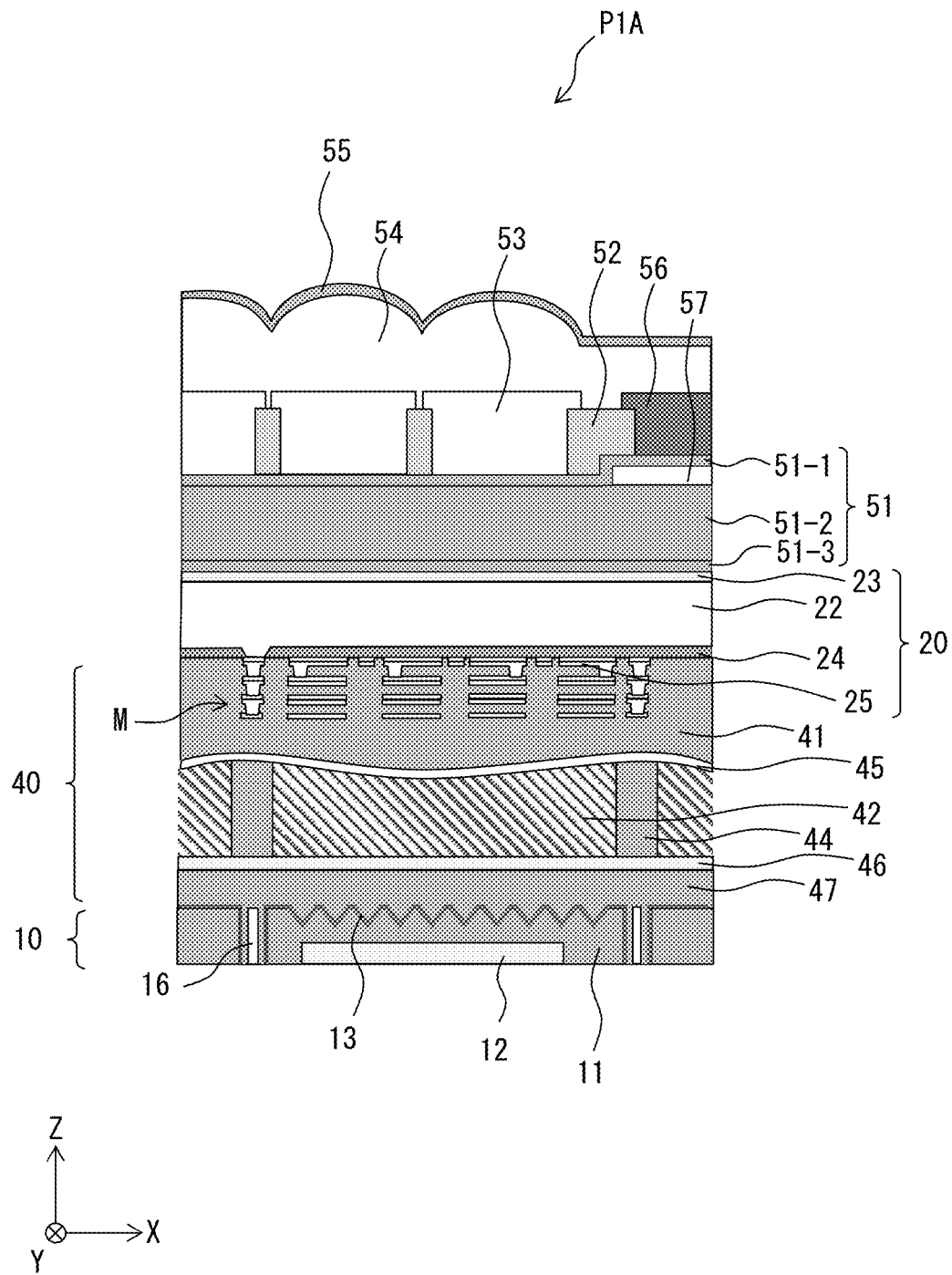

[ FIG. 8 ]
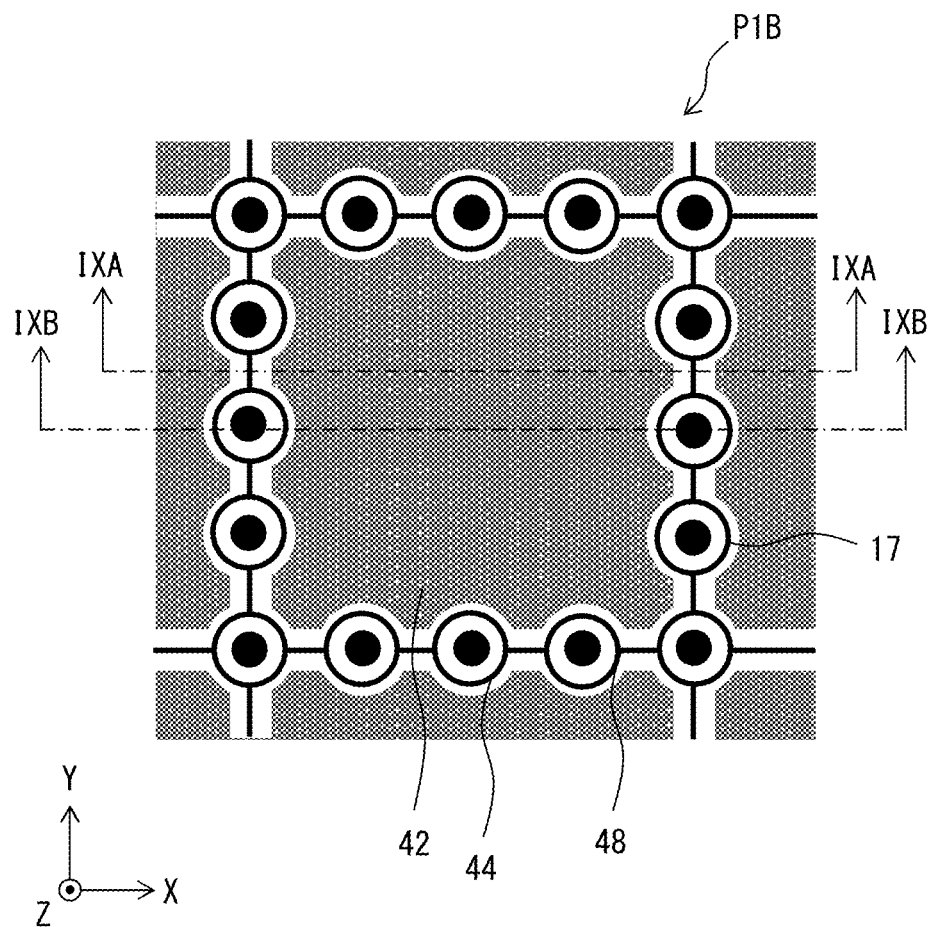

[ FIG. 9A ]
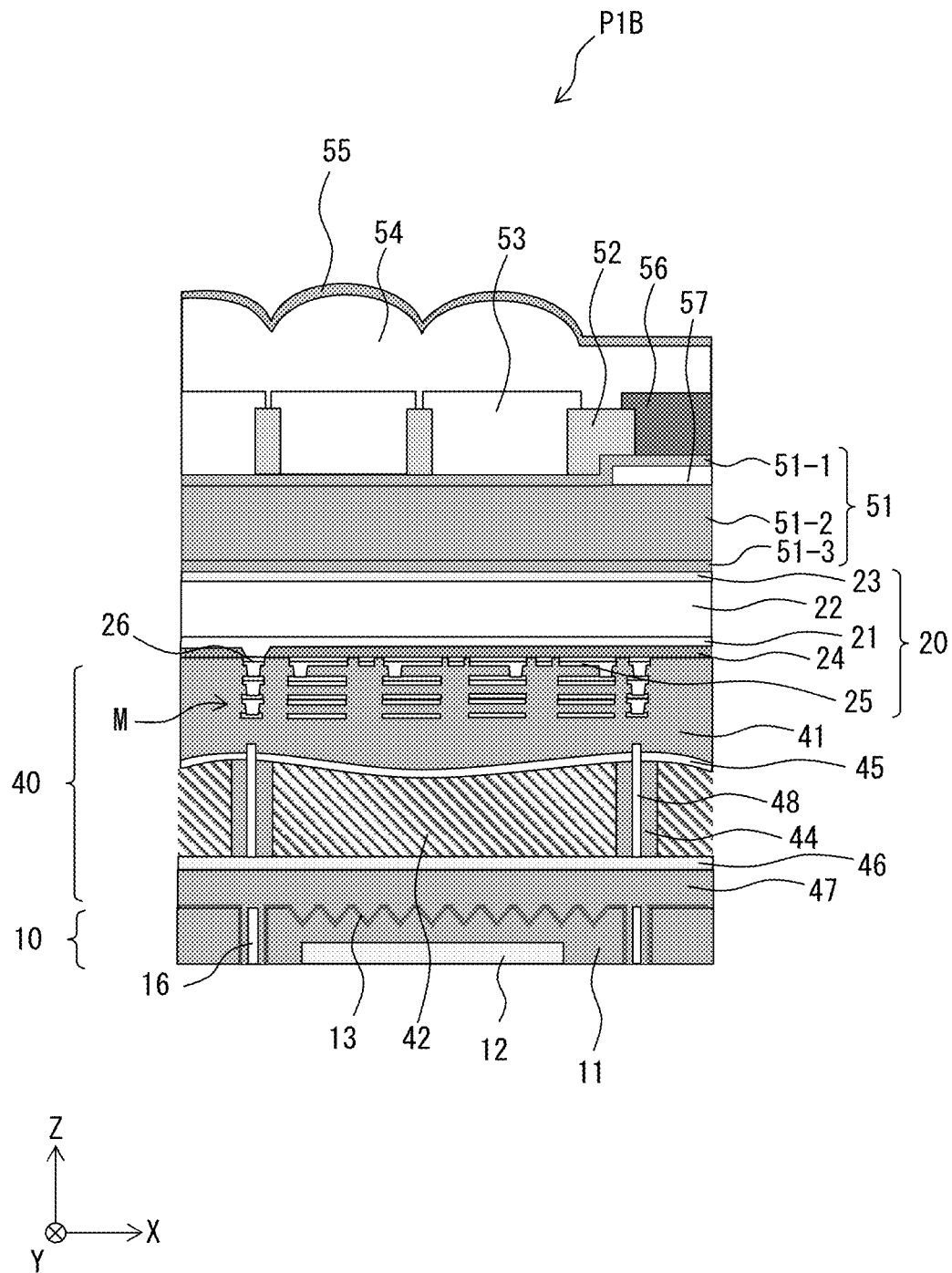

[FIG. 9B]
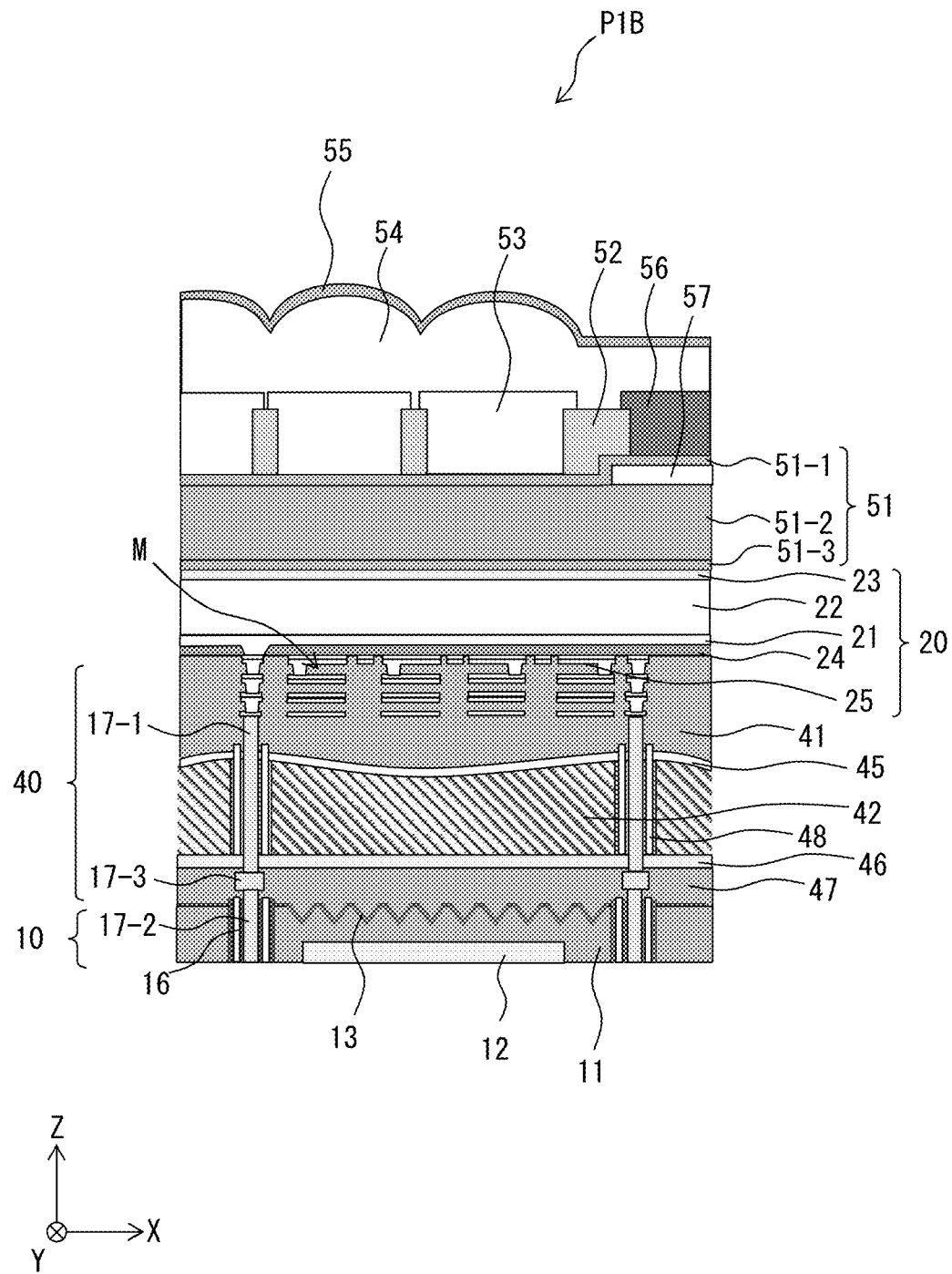

[ FIG. 10A ]
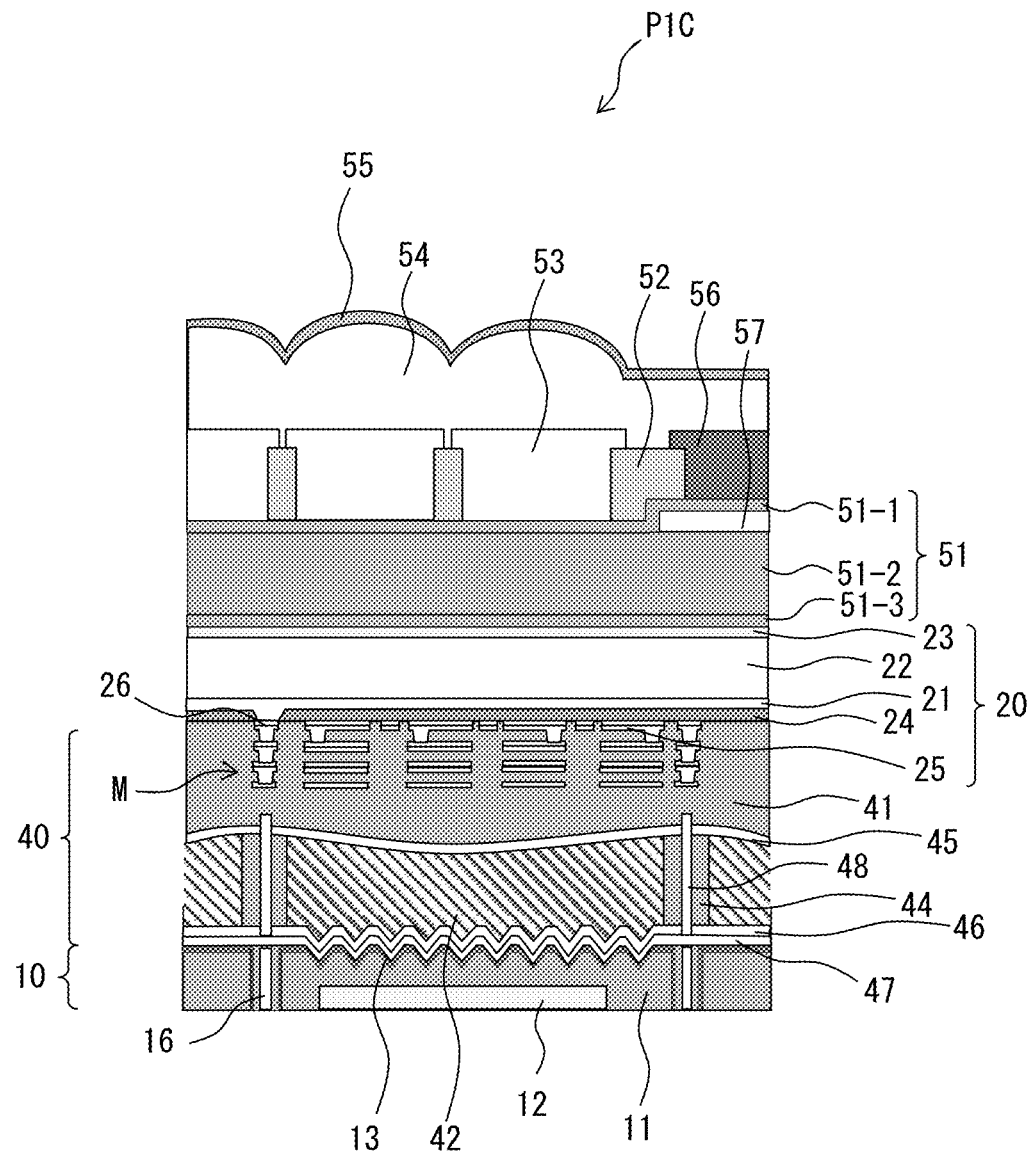

[ FIG. 10B ]
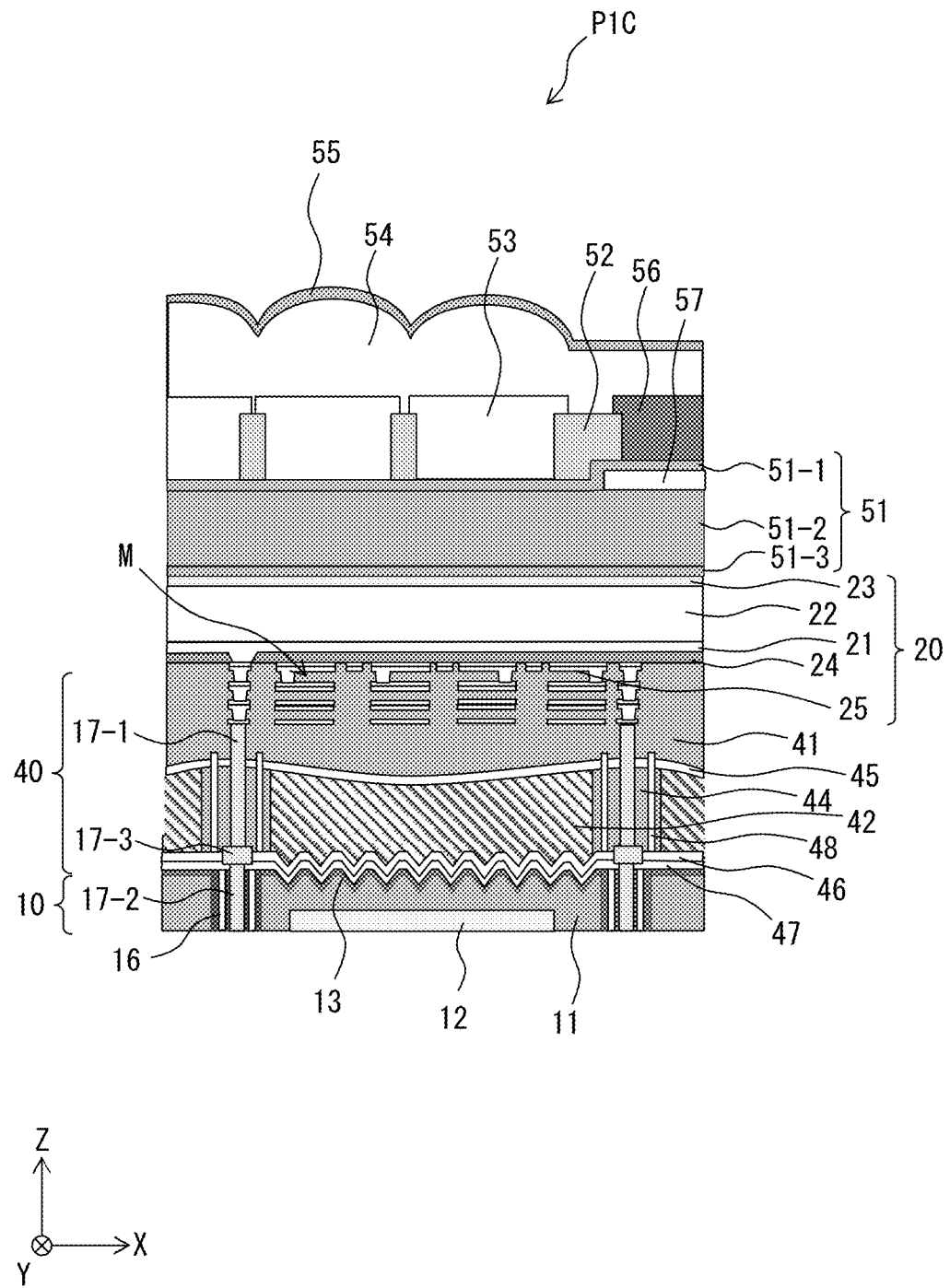

[ FIG. 11A ]
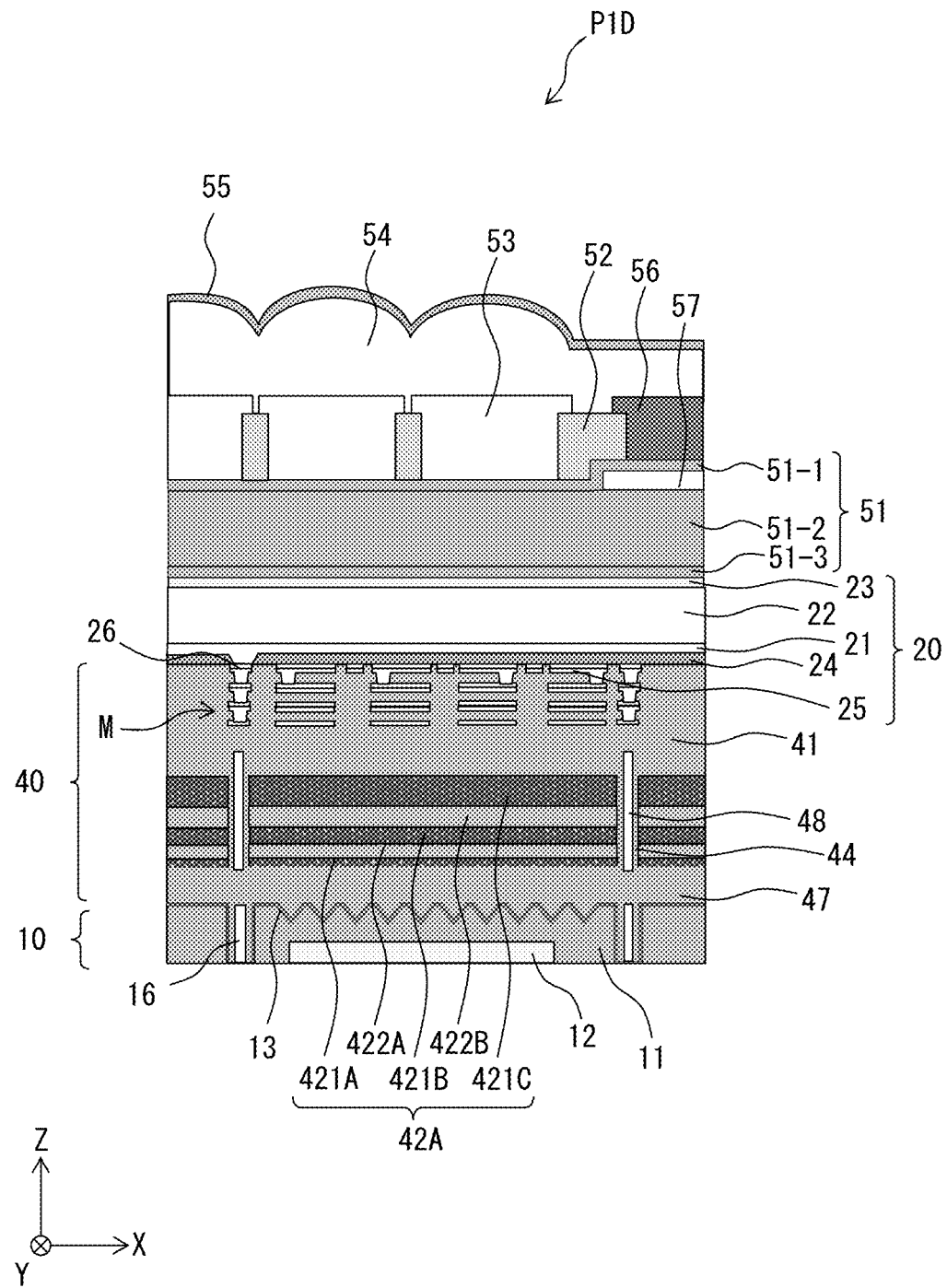

[ FIG. 11B ]
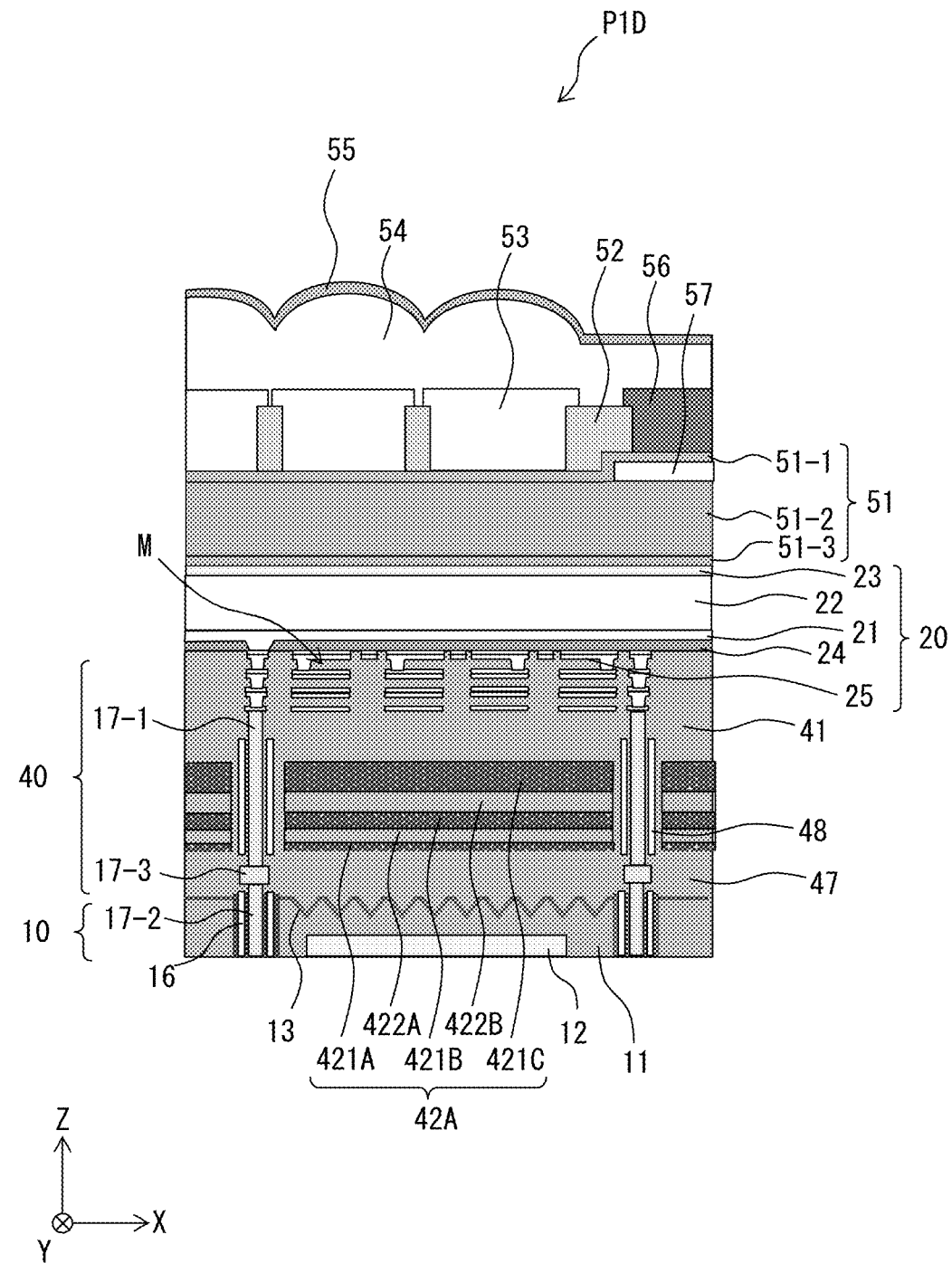

[ FIG. 12A ]
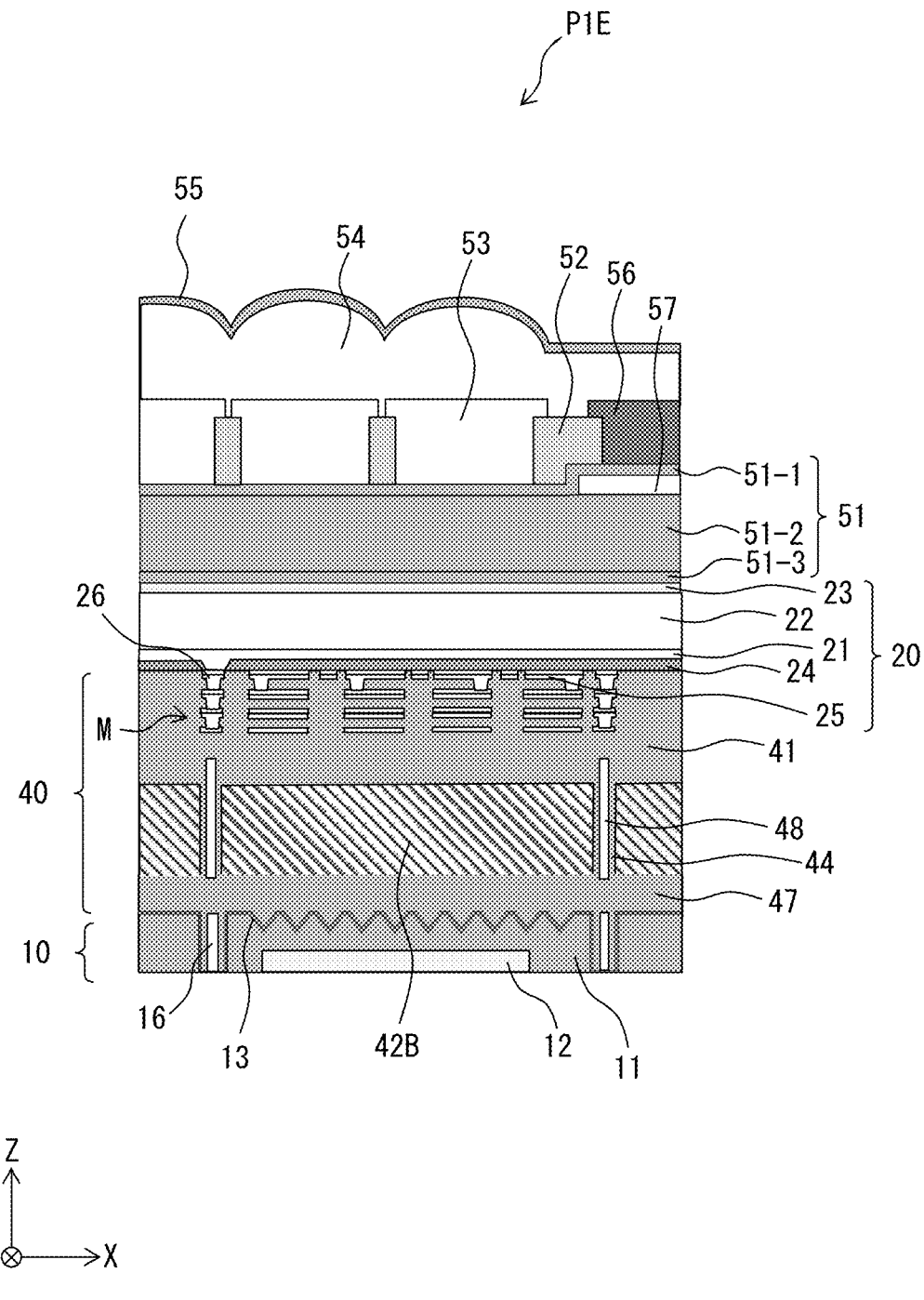

[ FIG. 12B ]
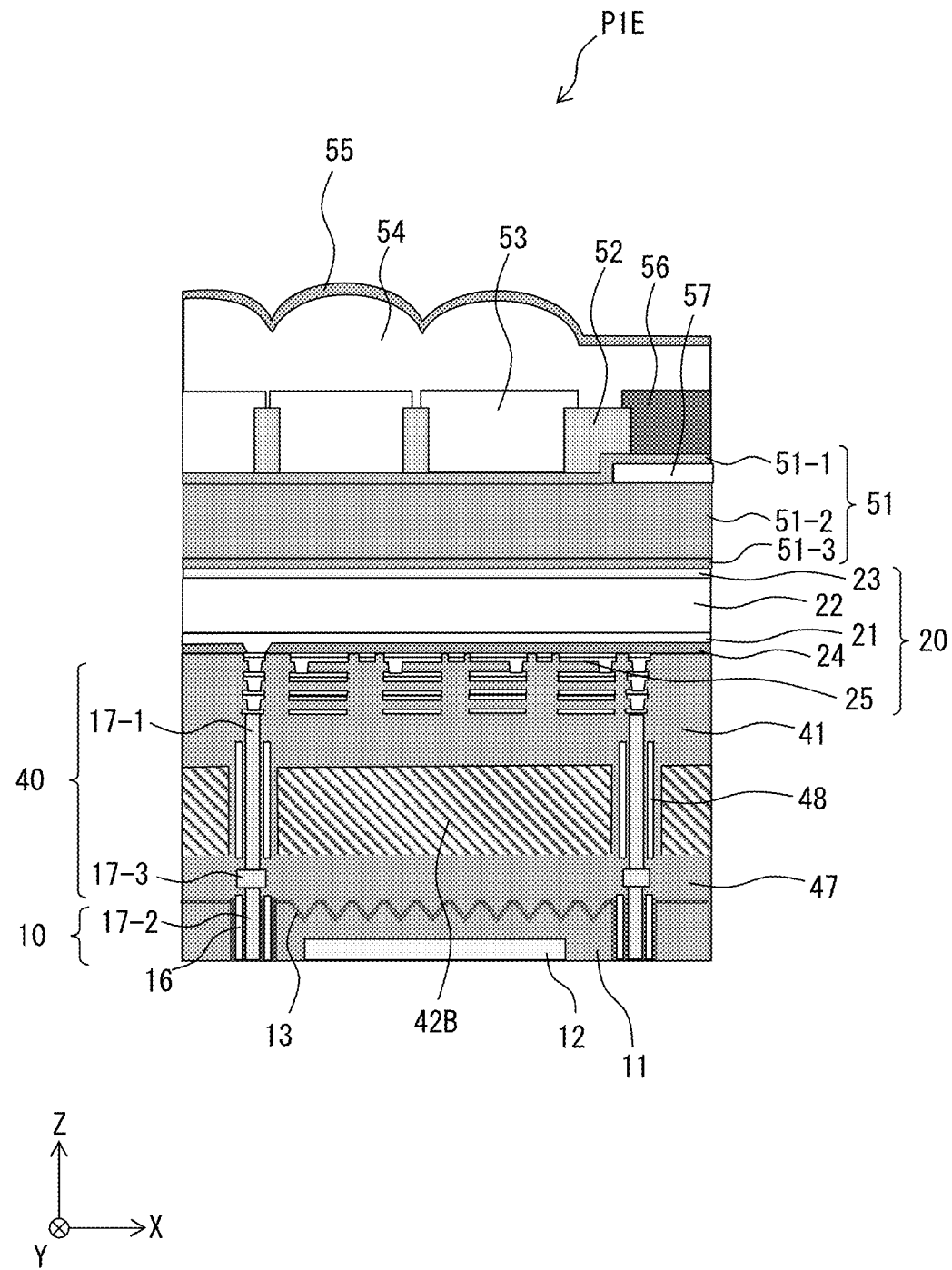

[ FIG. 13 ]
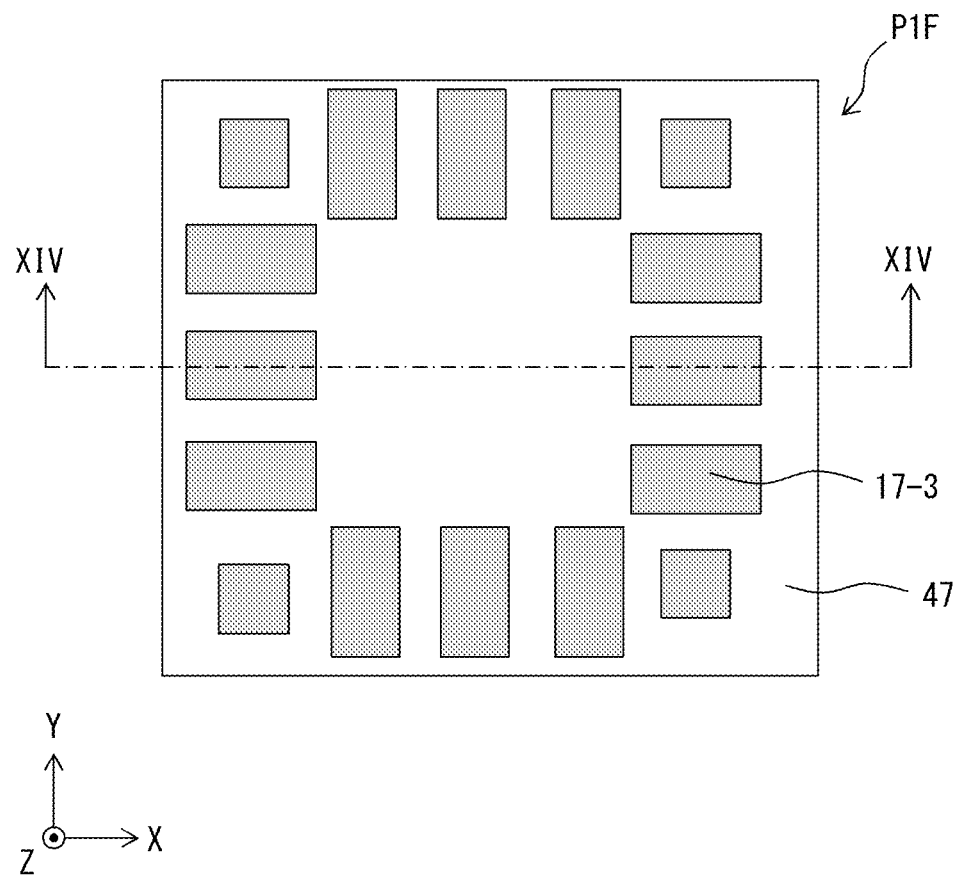

[ FIG. 14 ]
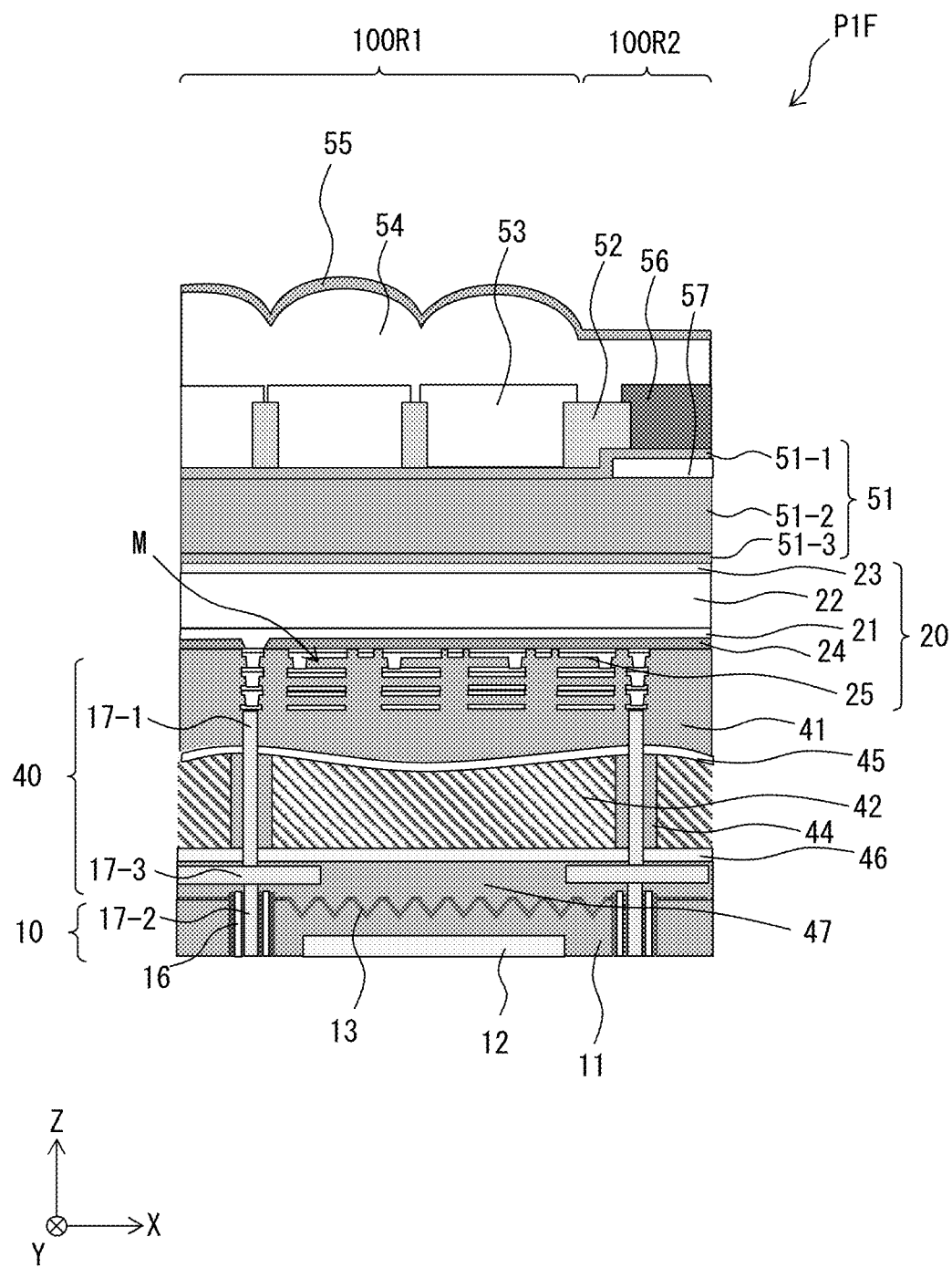

[ FIG. 15A ]
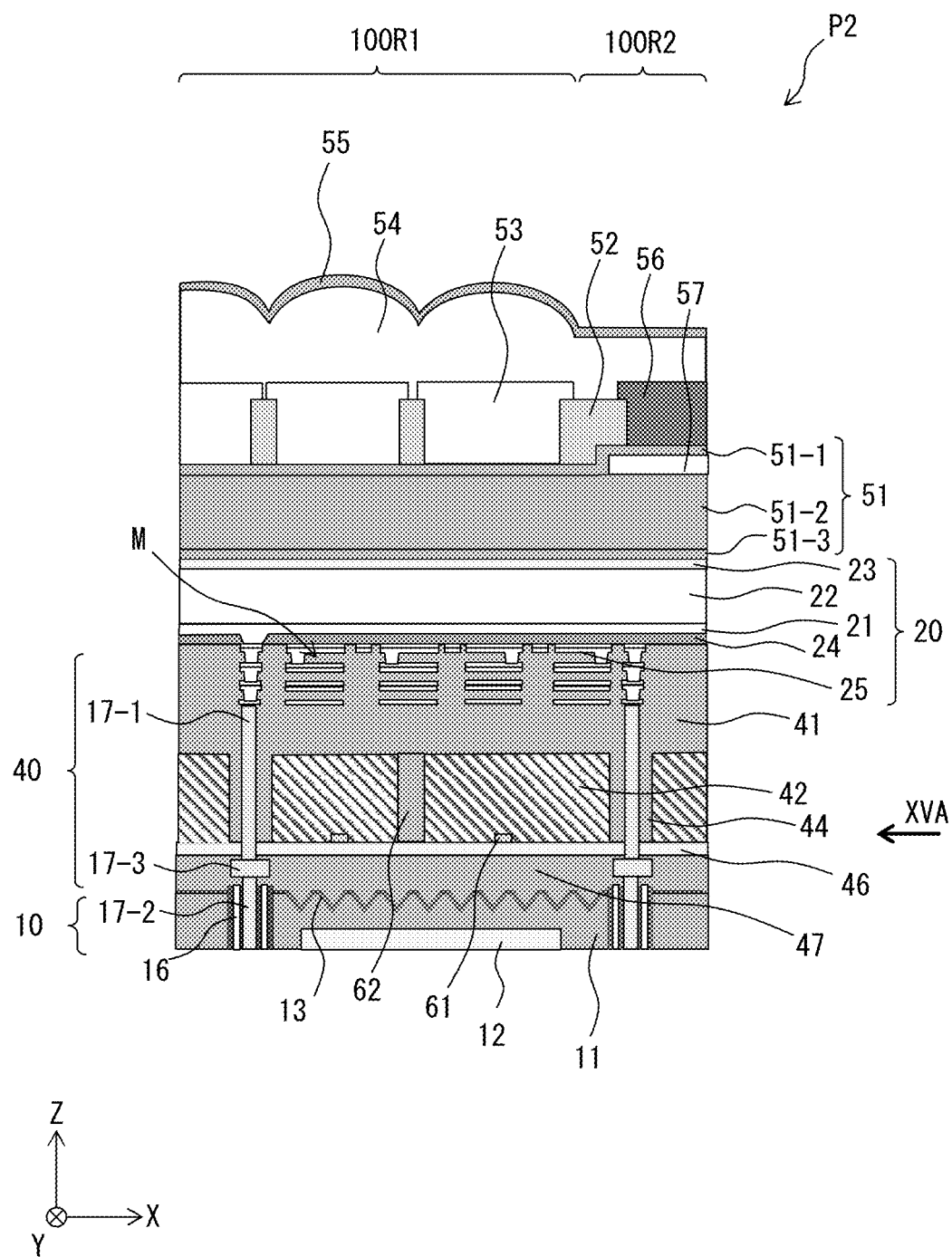

[ FIG. 15B ]
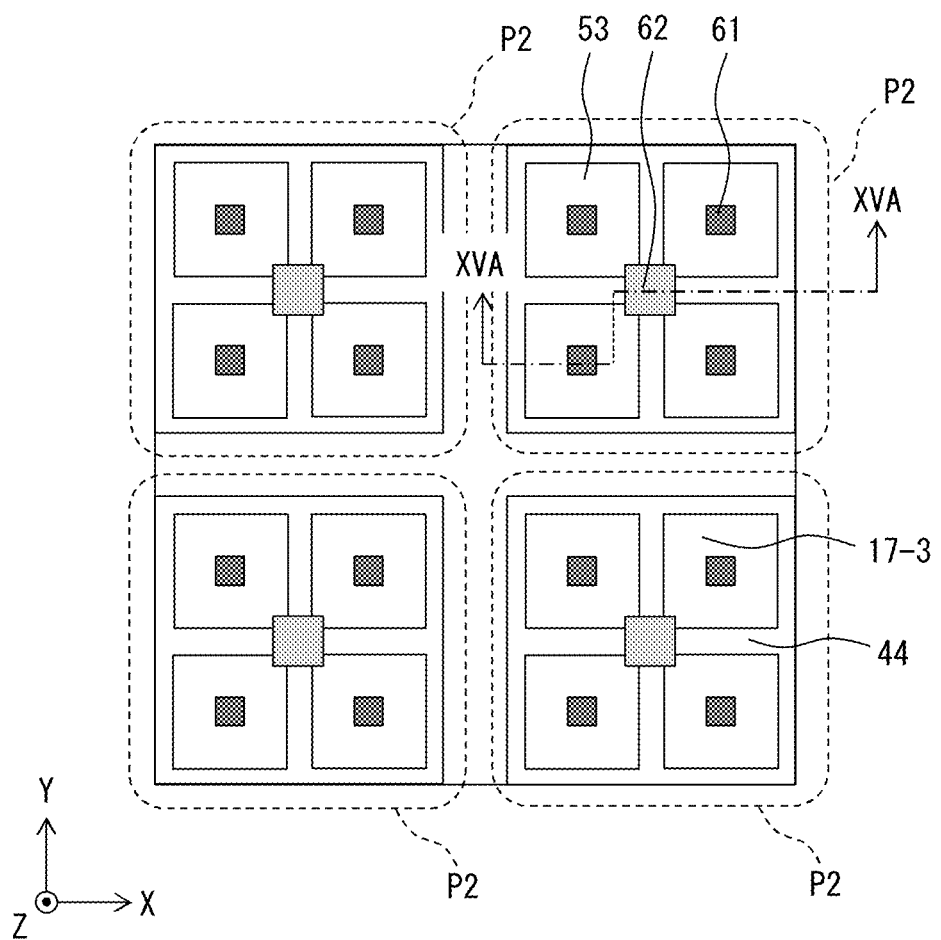

[ FIG. 16A ]
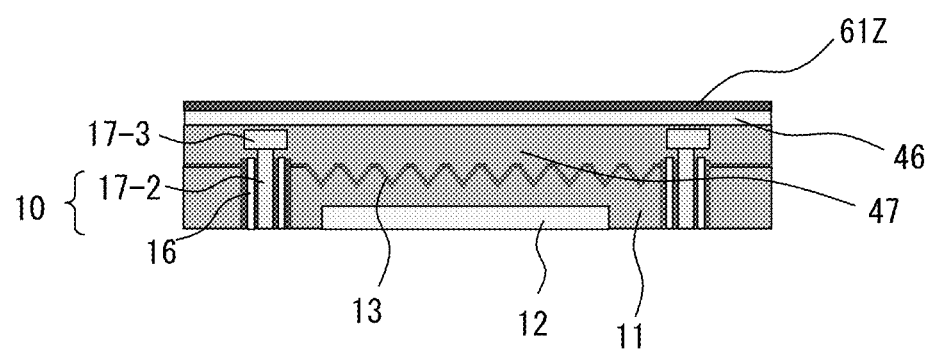
[ FIG. 16B ]
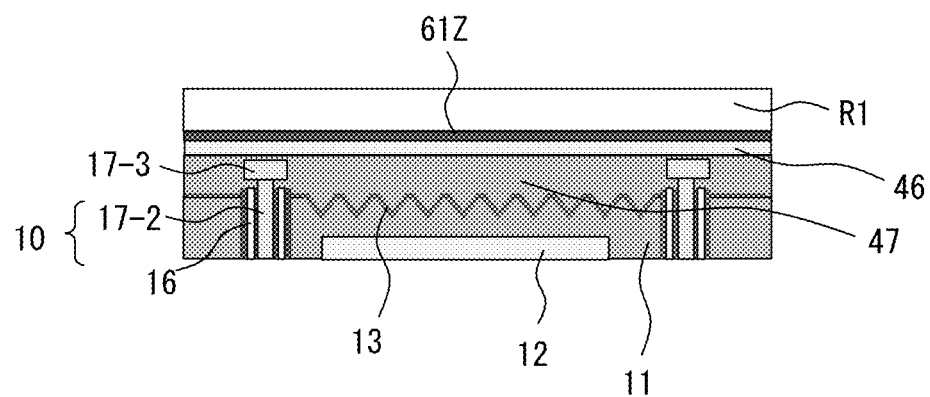
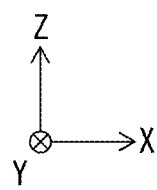

[ FIG. 16C ]
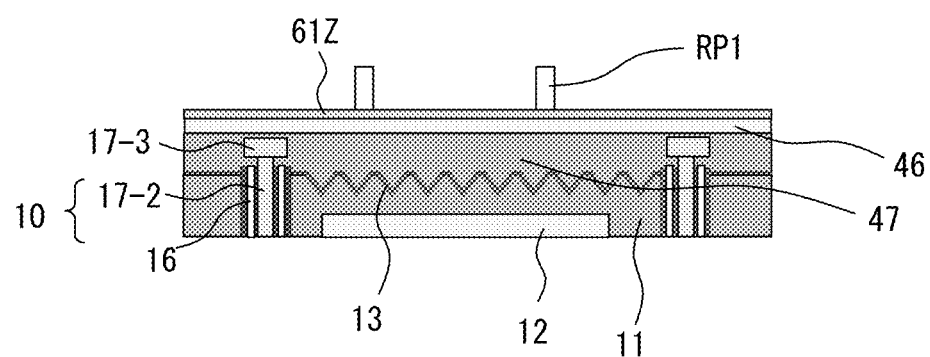
[ FIG. 16D ]
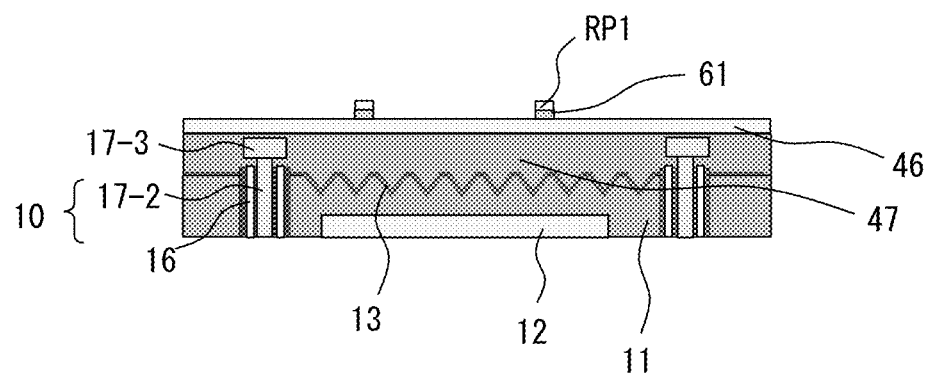
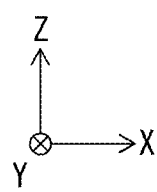

[ FIG. 16E ]
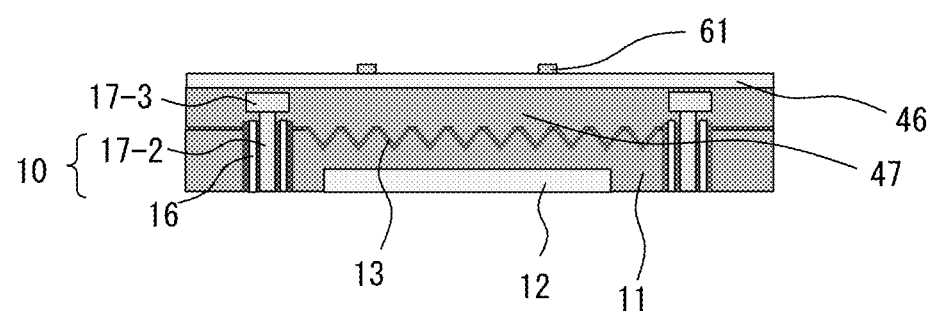
[ FIG. 16F ]
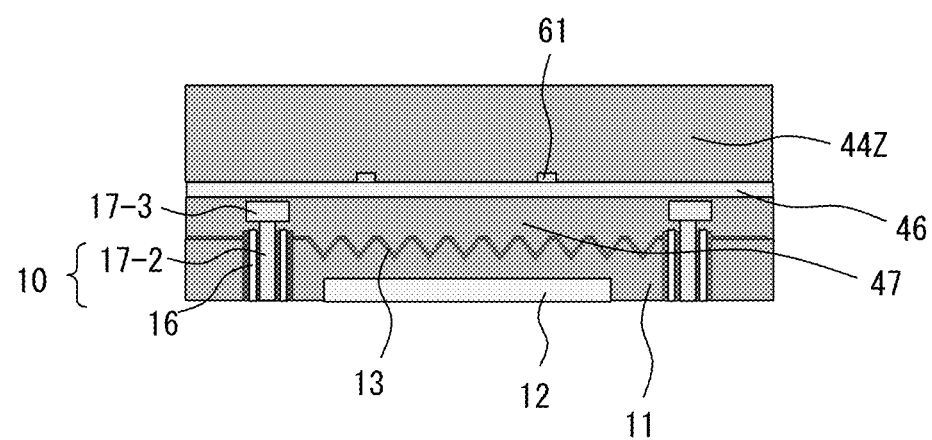
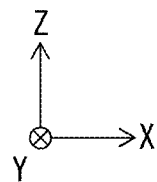

[ FIG. 16G ]
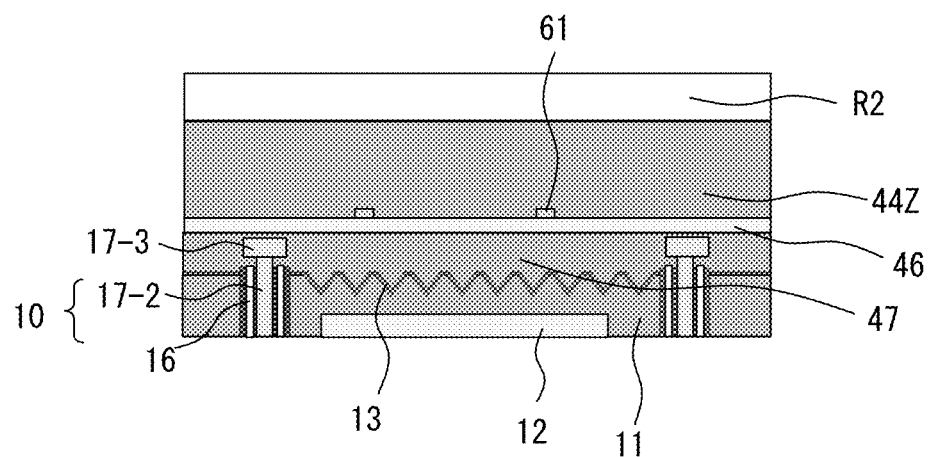
[ FIG. 16H ]
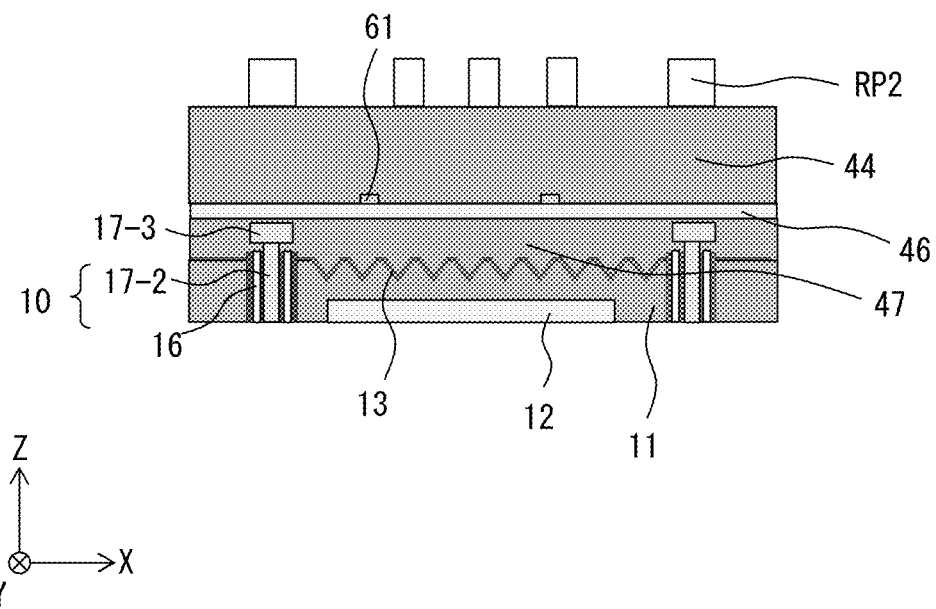

[ FIG. 16I ]
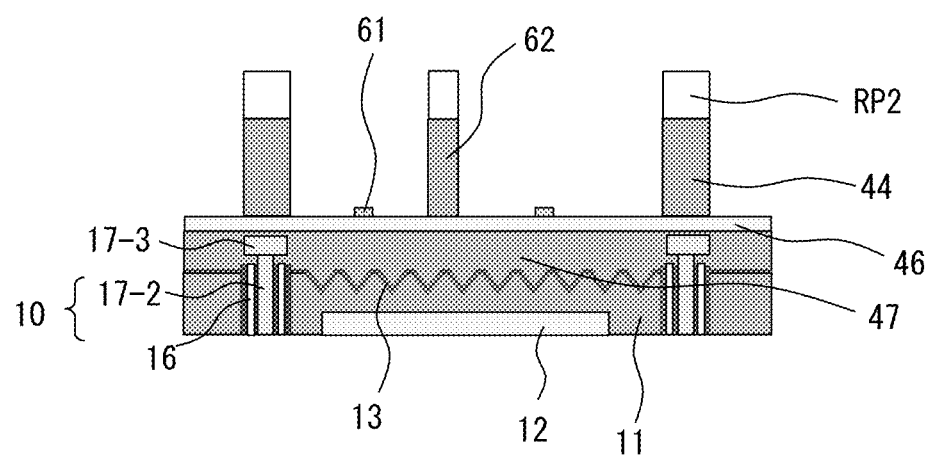
[ FIG. 16J ]
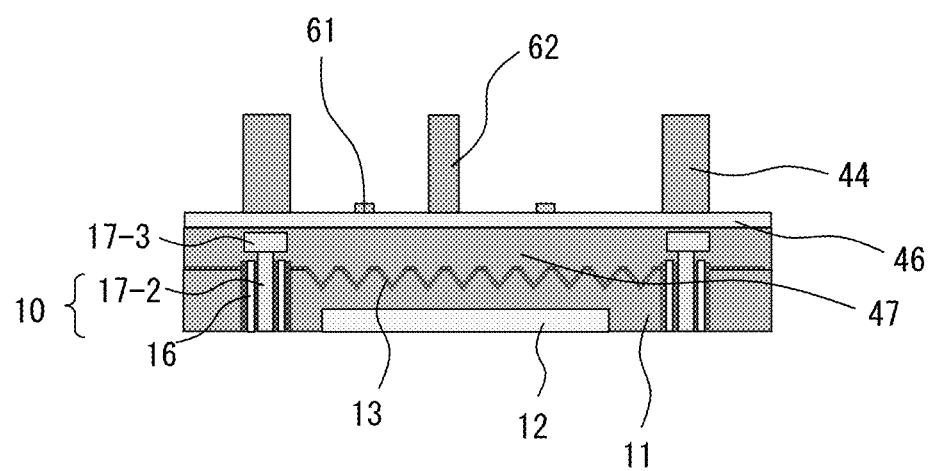

[ FIG. 16K ]
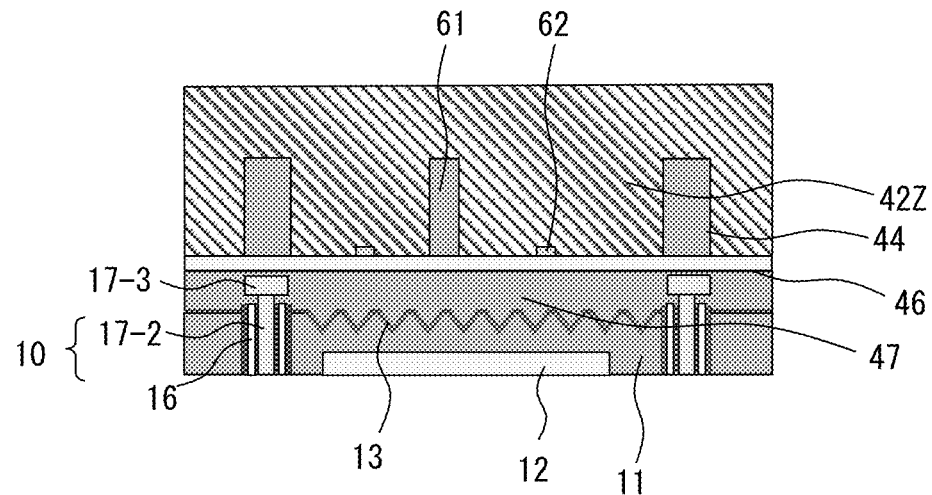
[ FIG. 16L ]
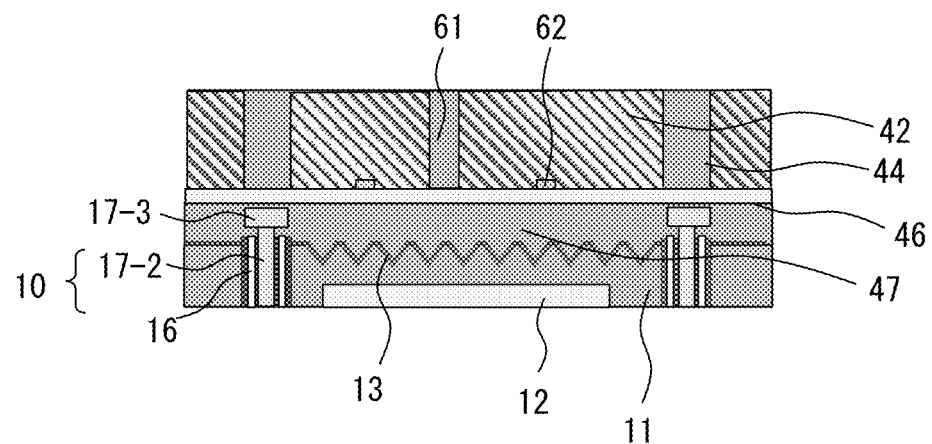
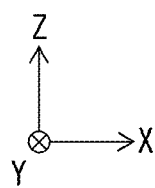

[FIG. 17A]
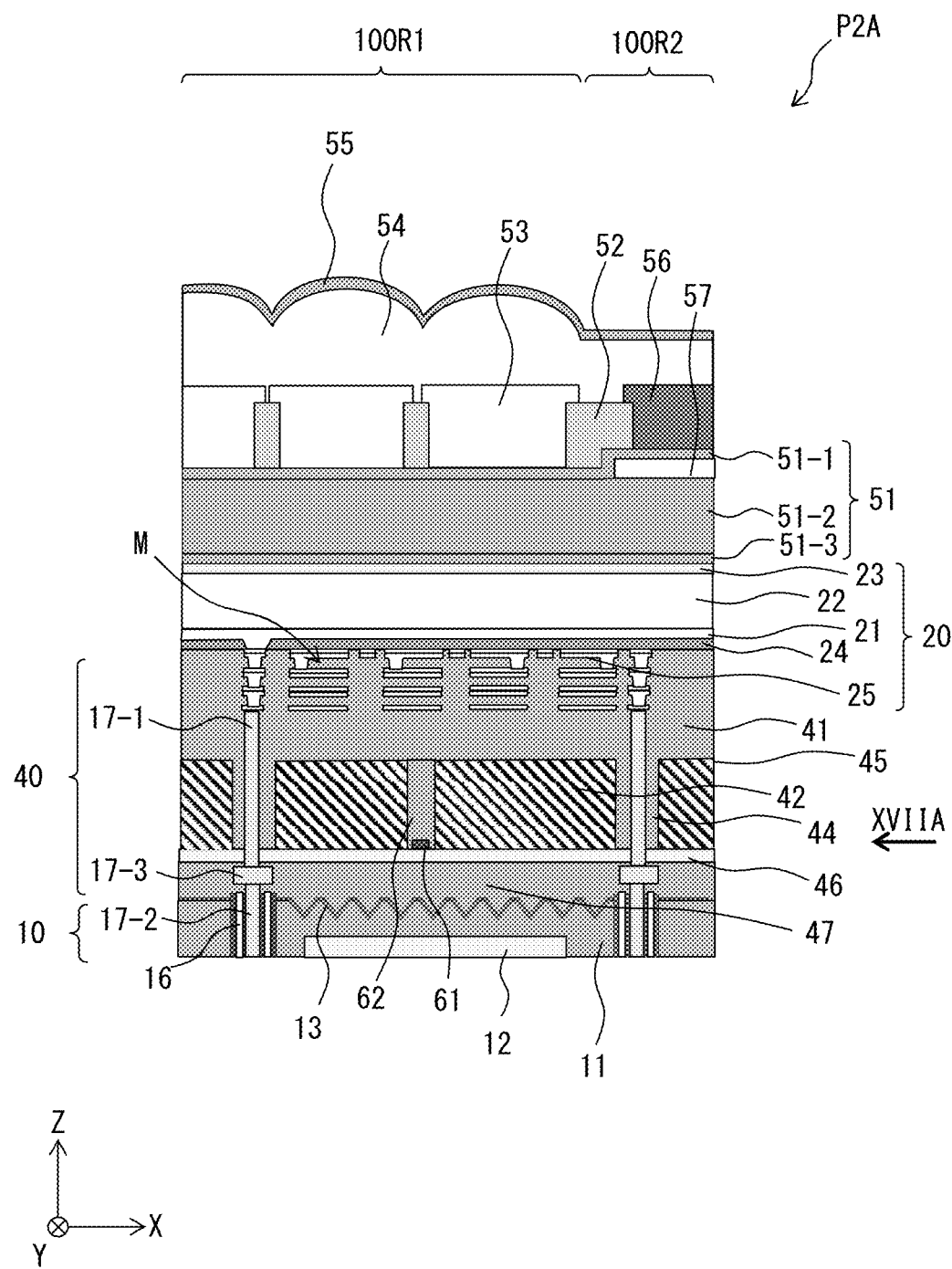

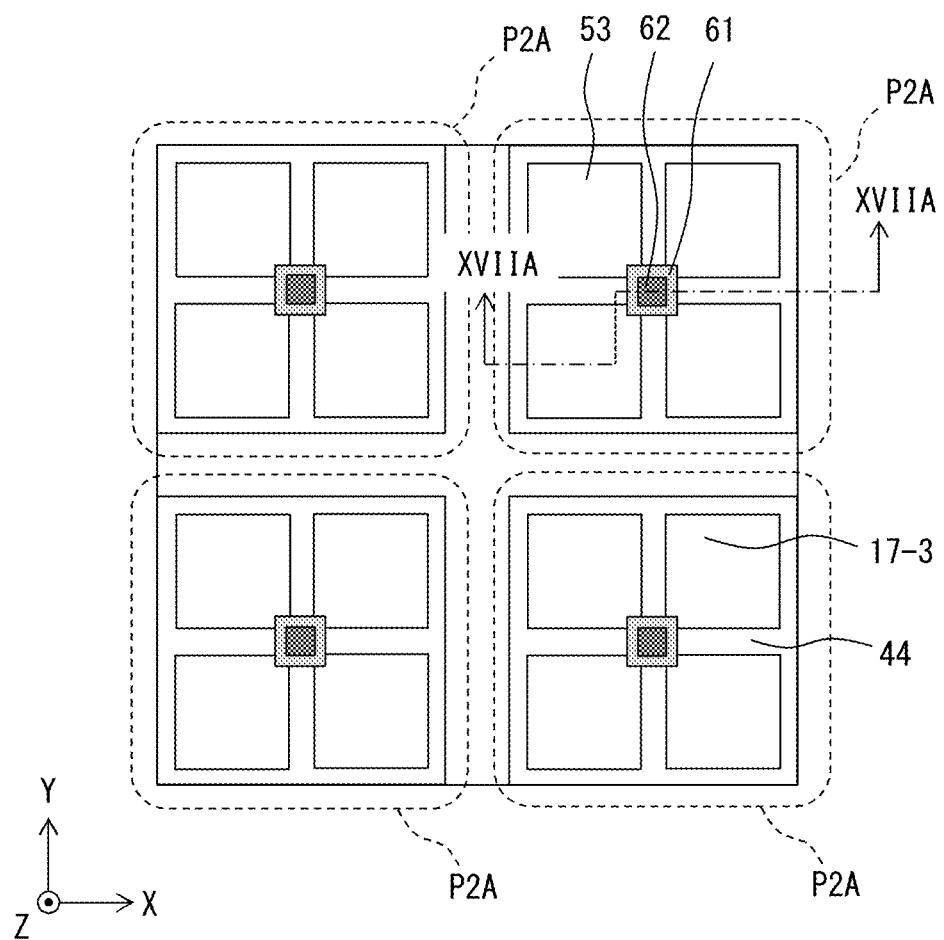
[ FIG. 17B ]

[ FIG. 18 ]
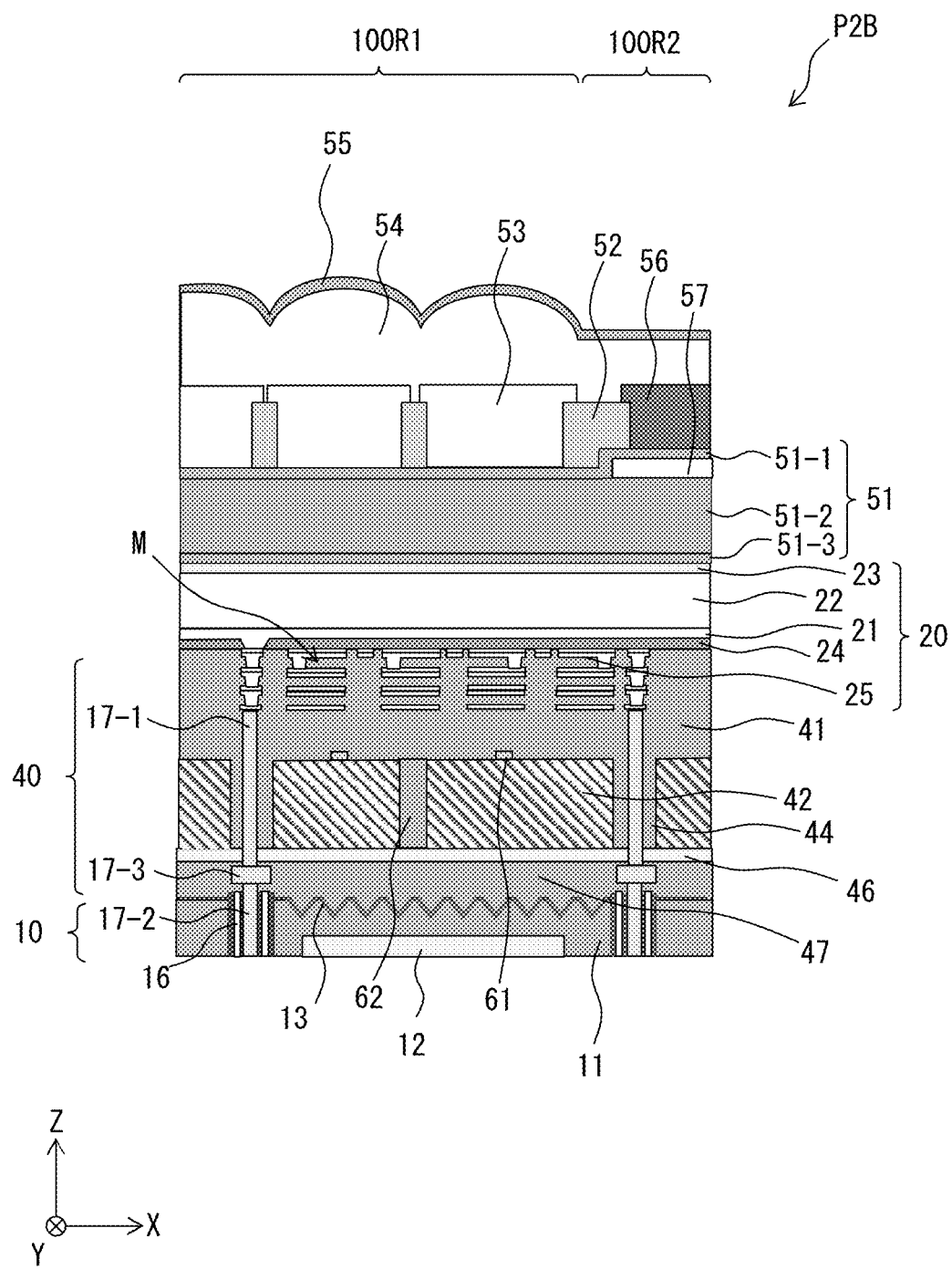

[ FIG. 19 ]
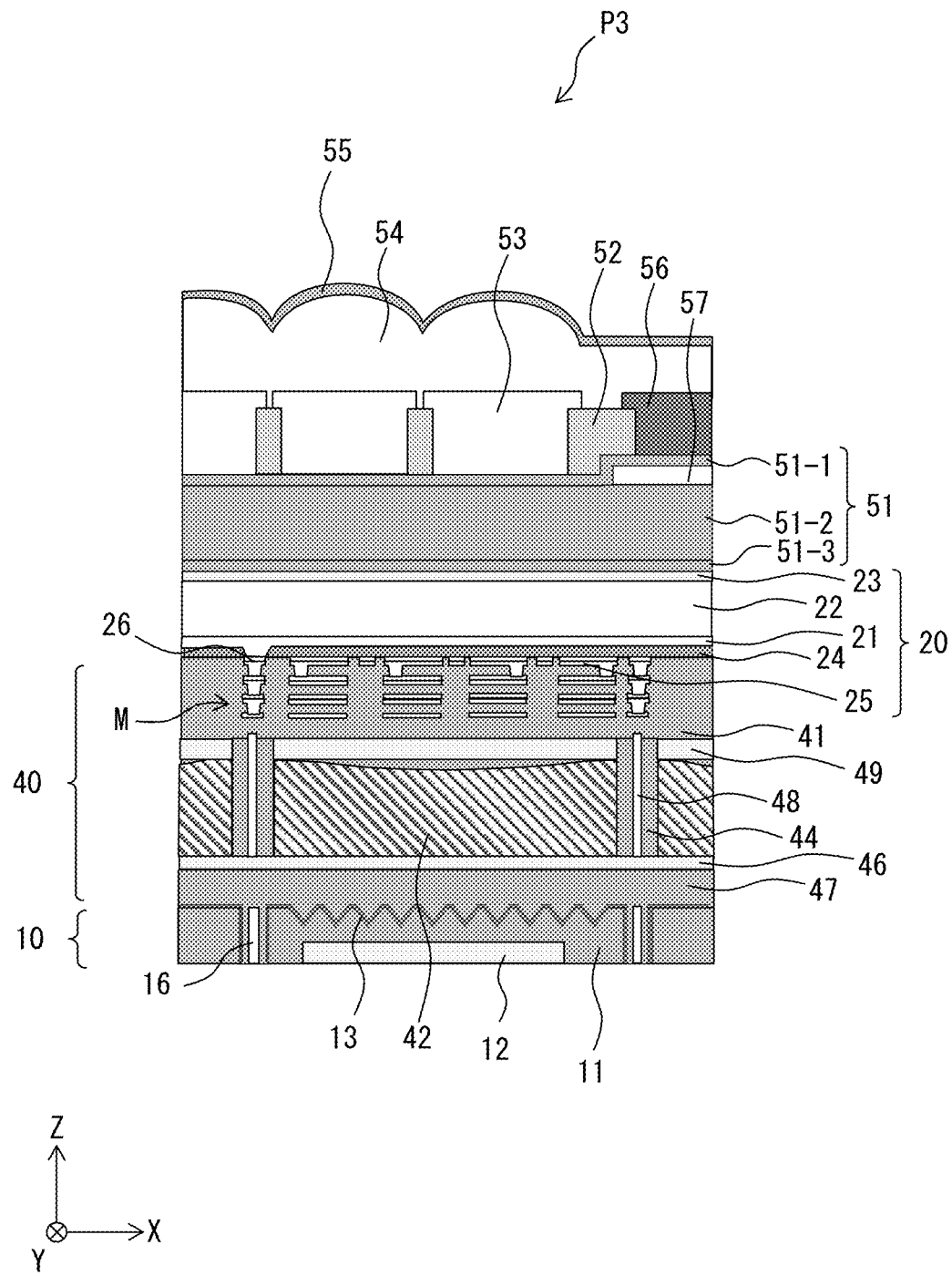

[ FIG. 20 ]
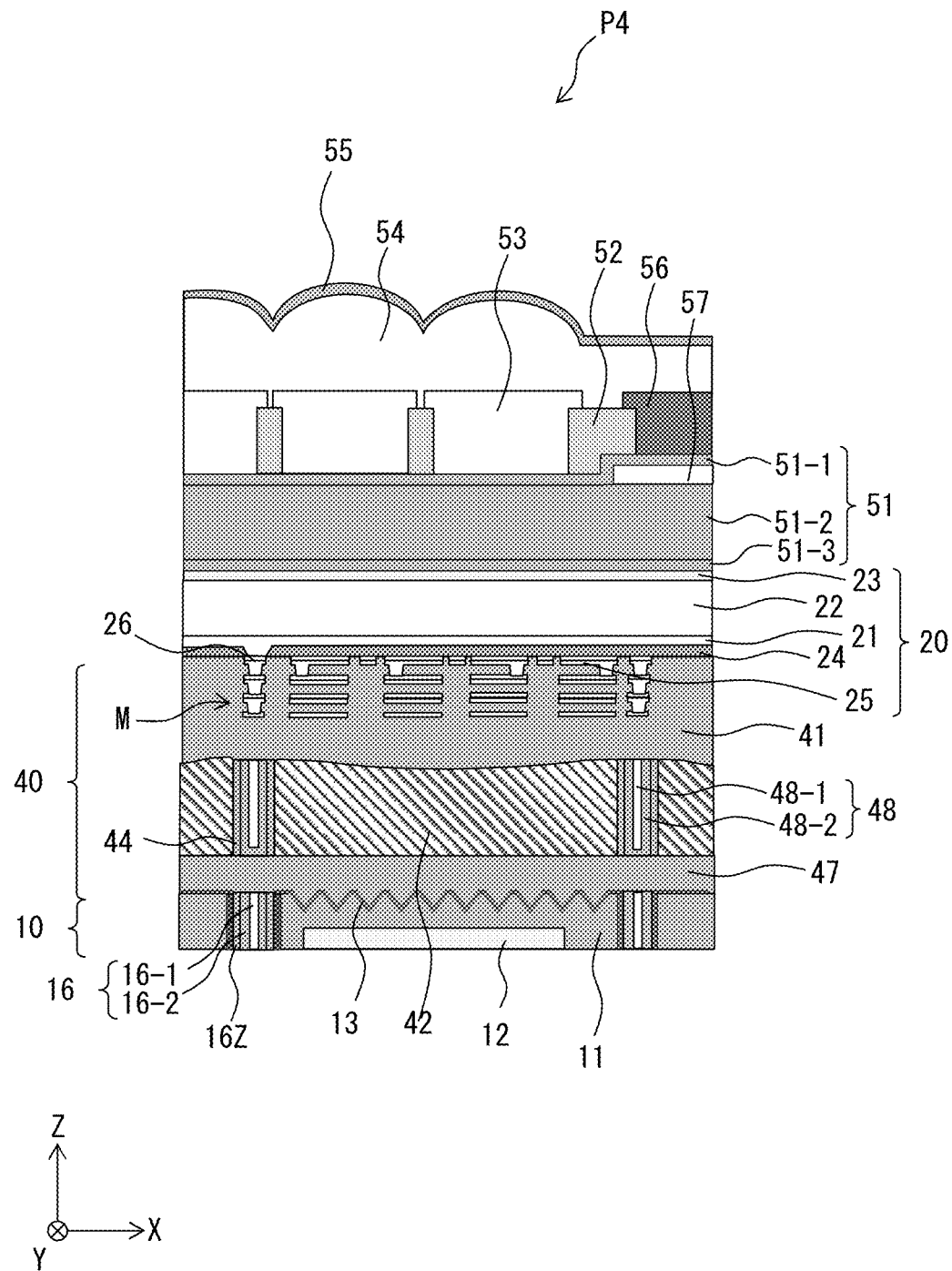

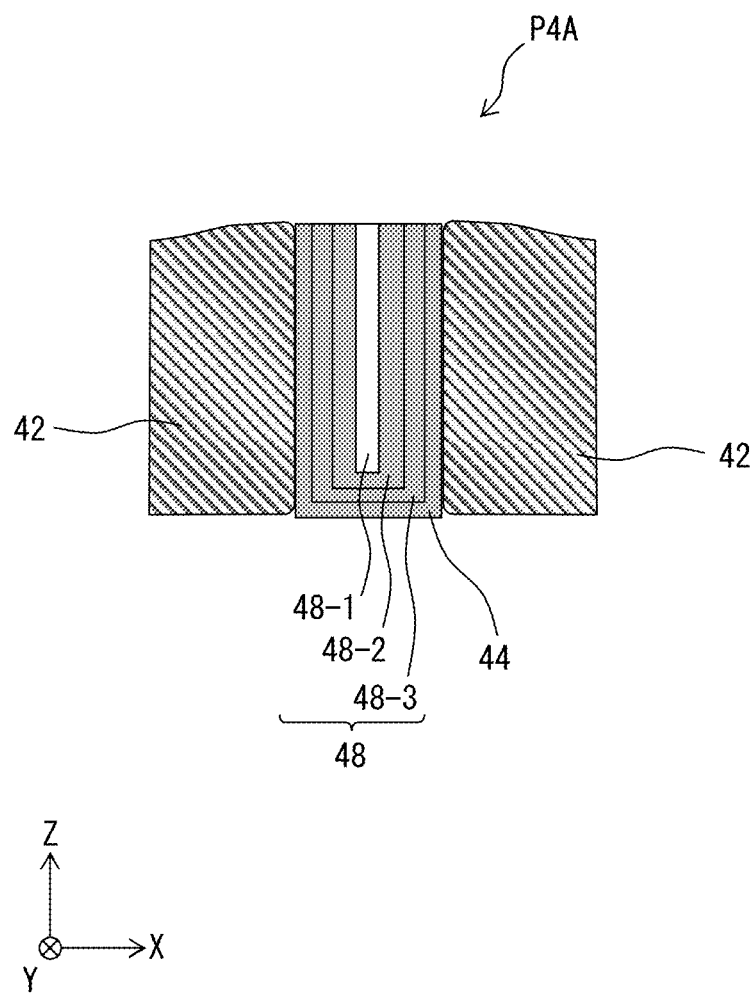
[ FIG. 21 ]

[FIG. 22]
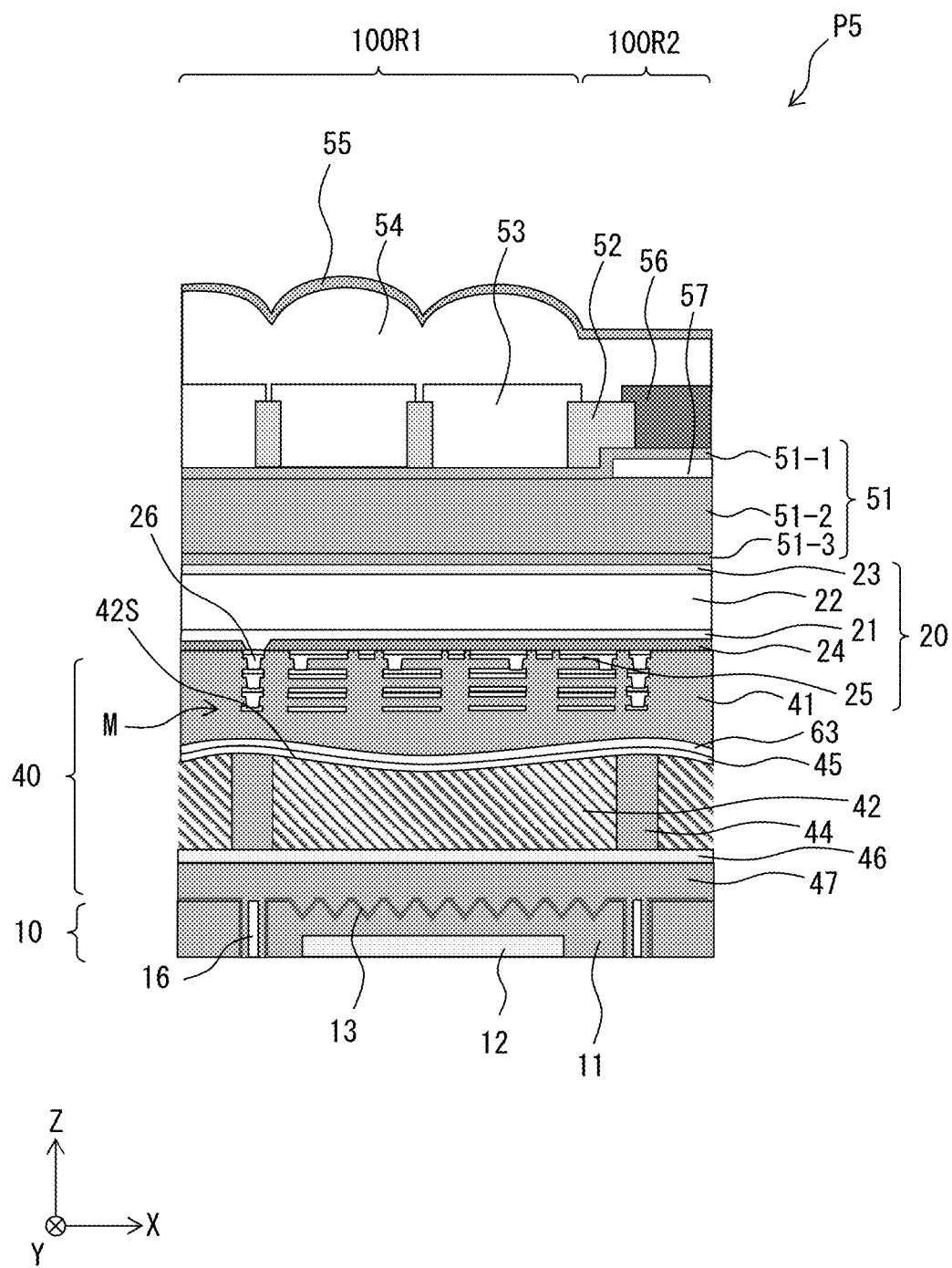

[ FIG. 23 ]
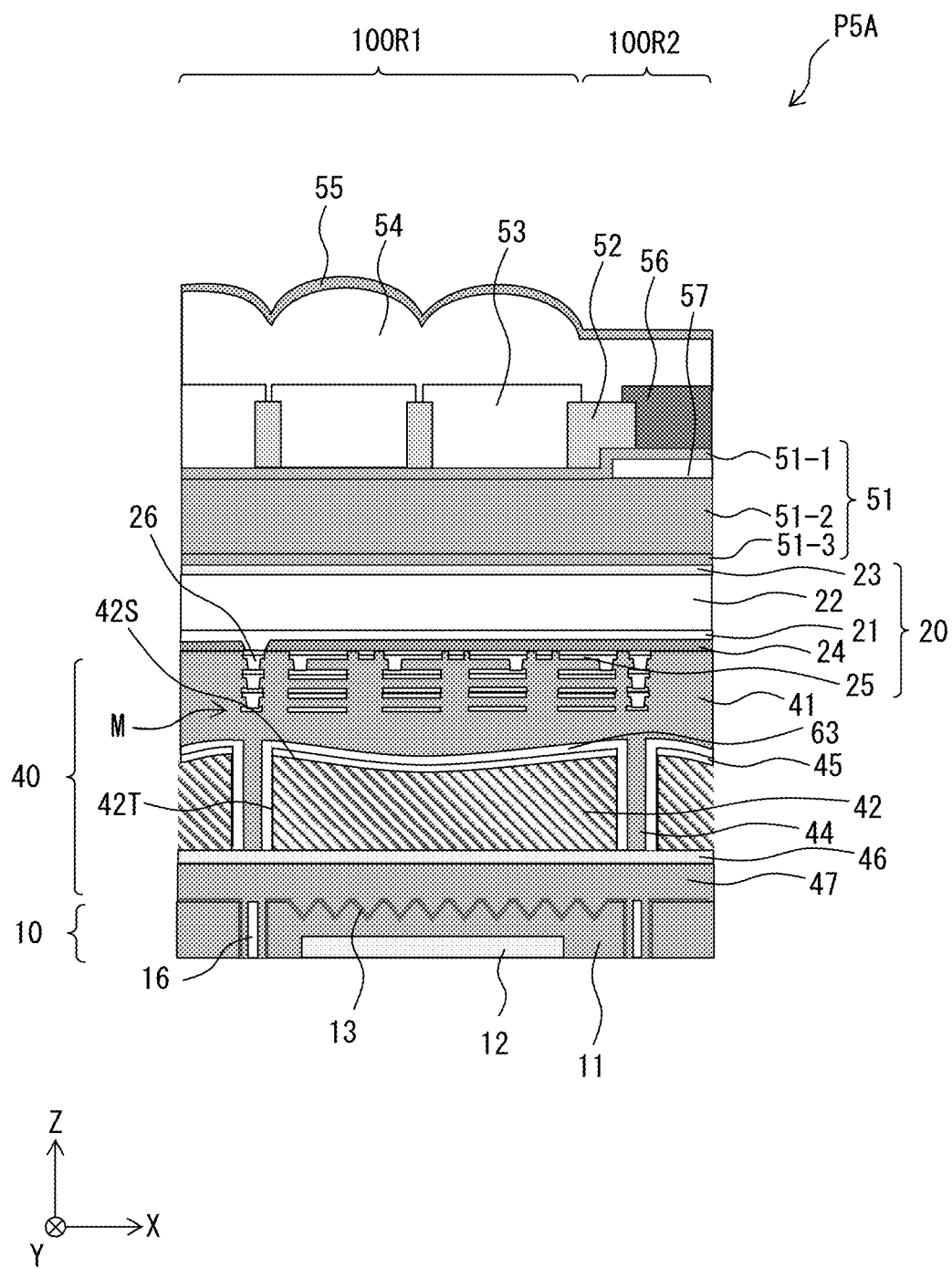

[FIG. 24]
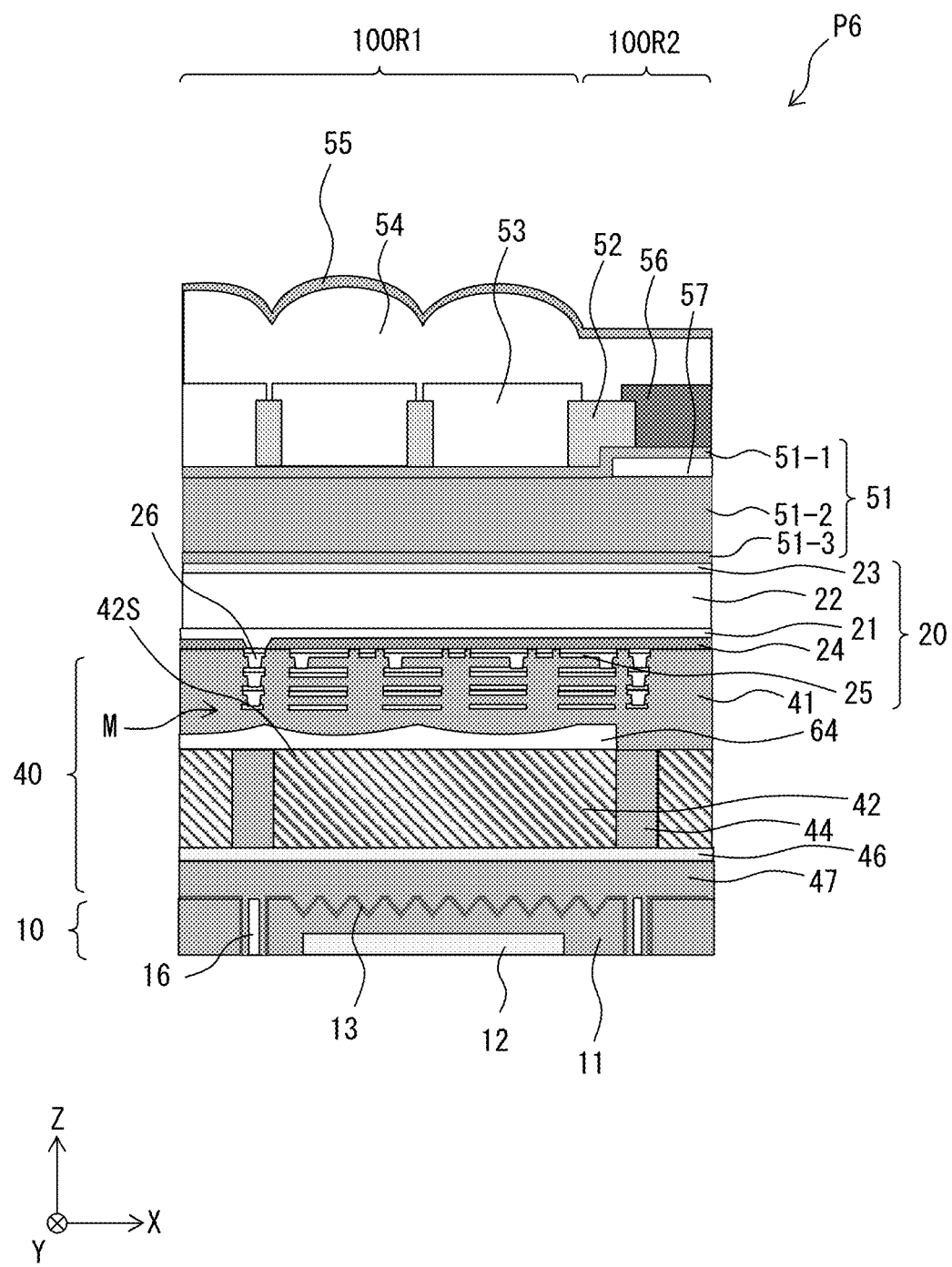

[ FIG. 25 ]
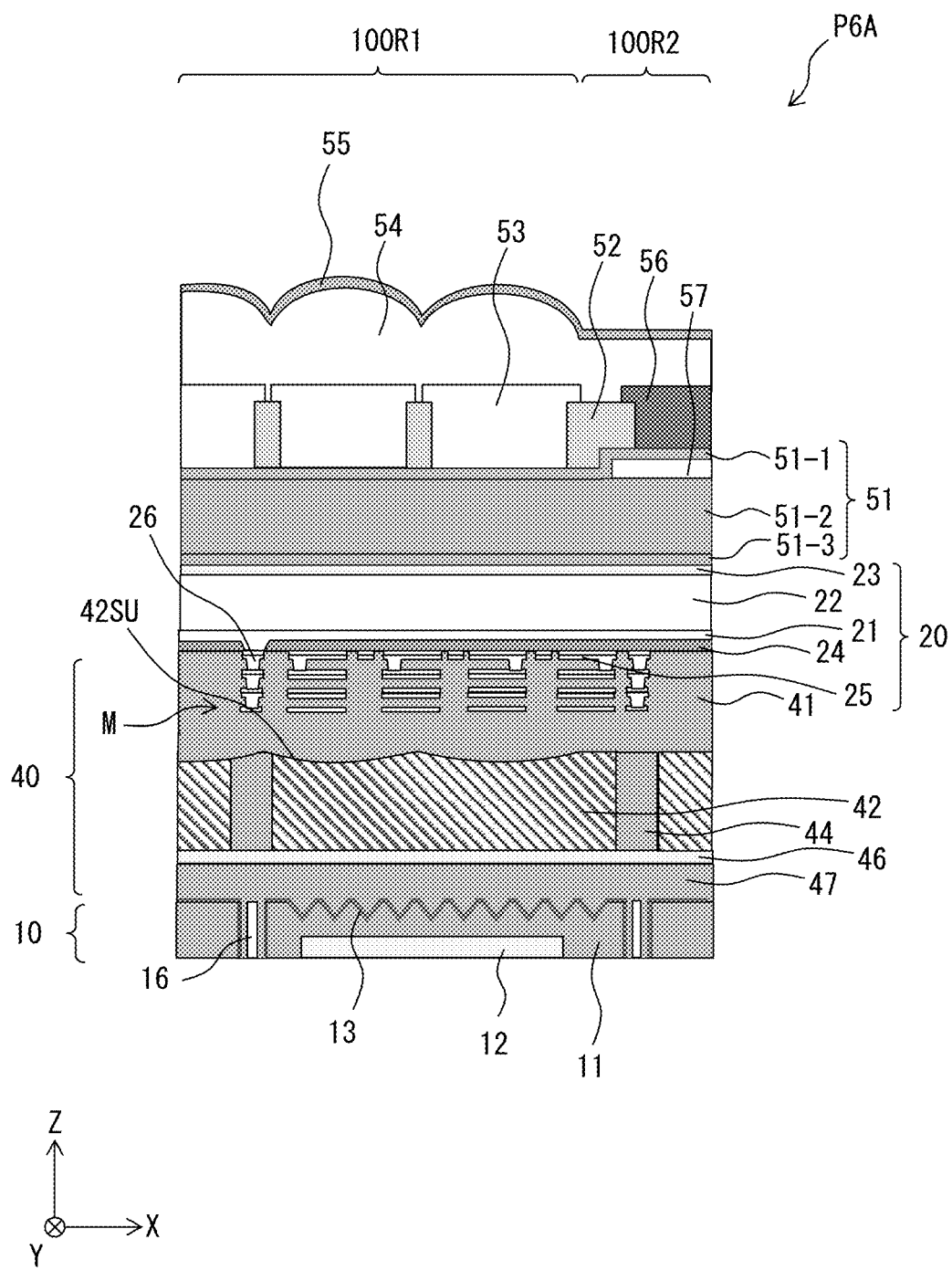

[ FIG. 26 ]
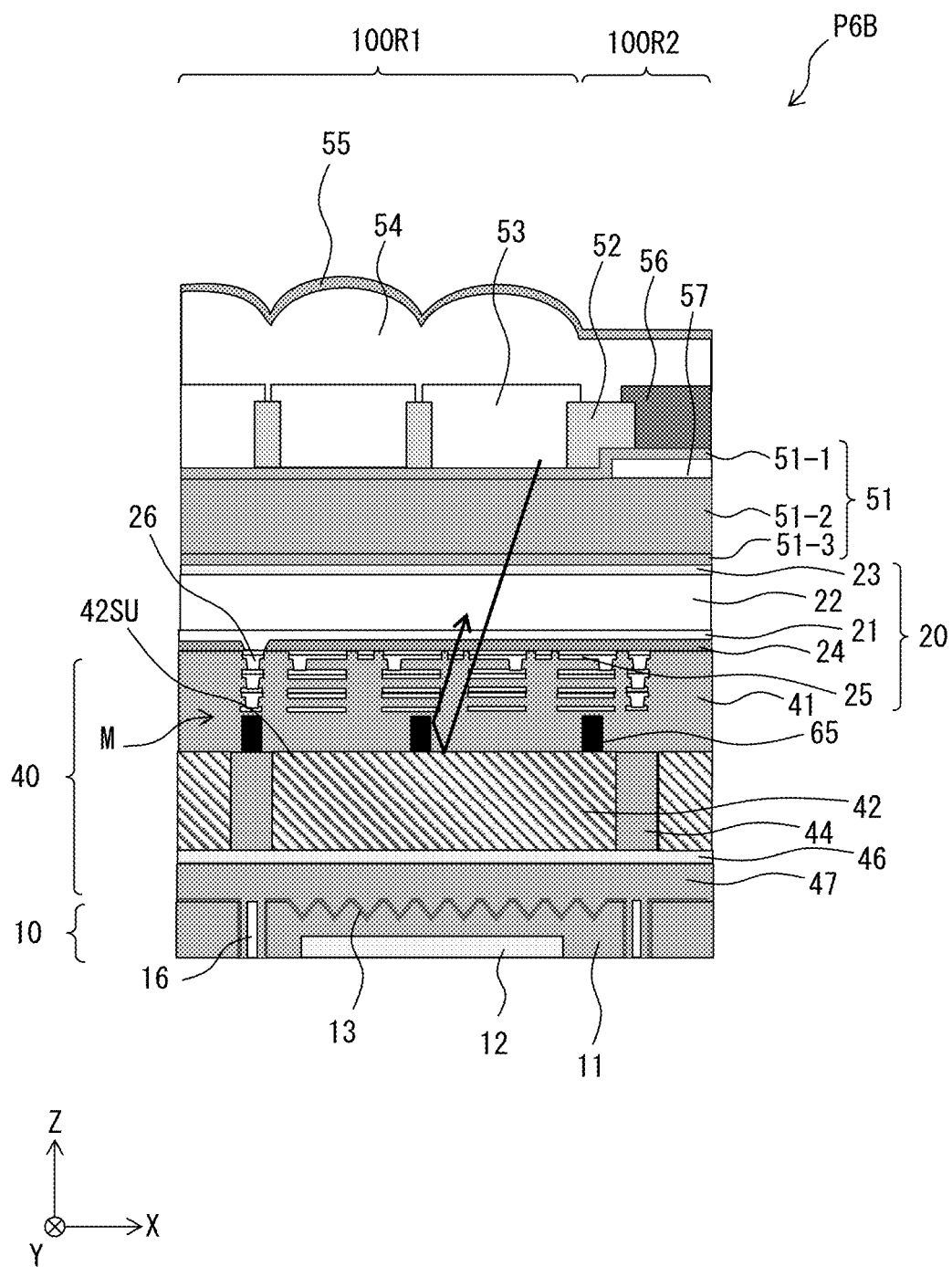

[ FIG. 27 ]
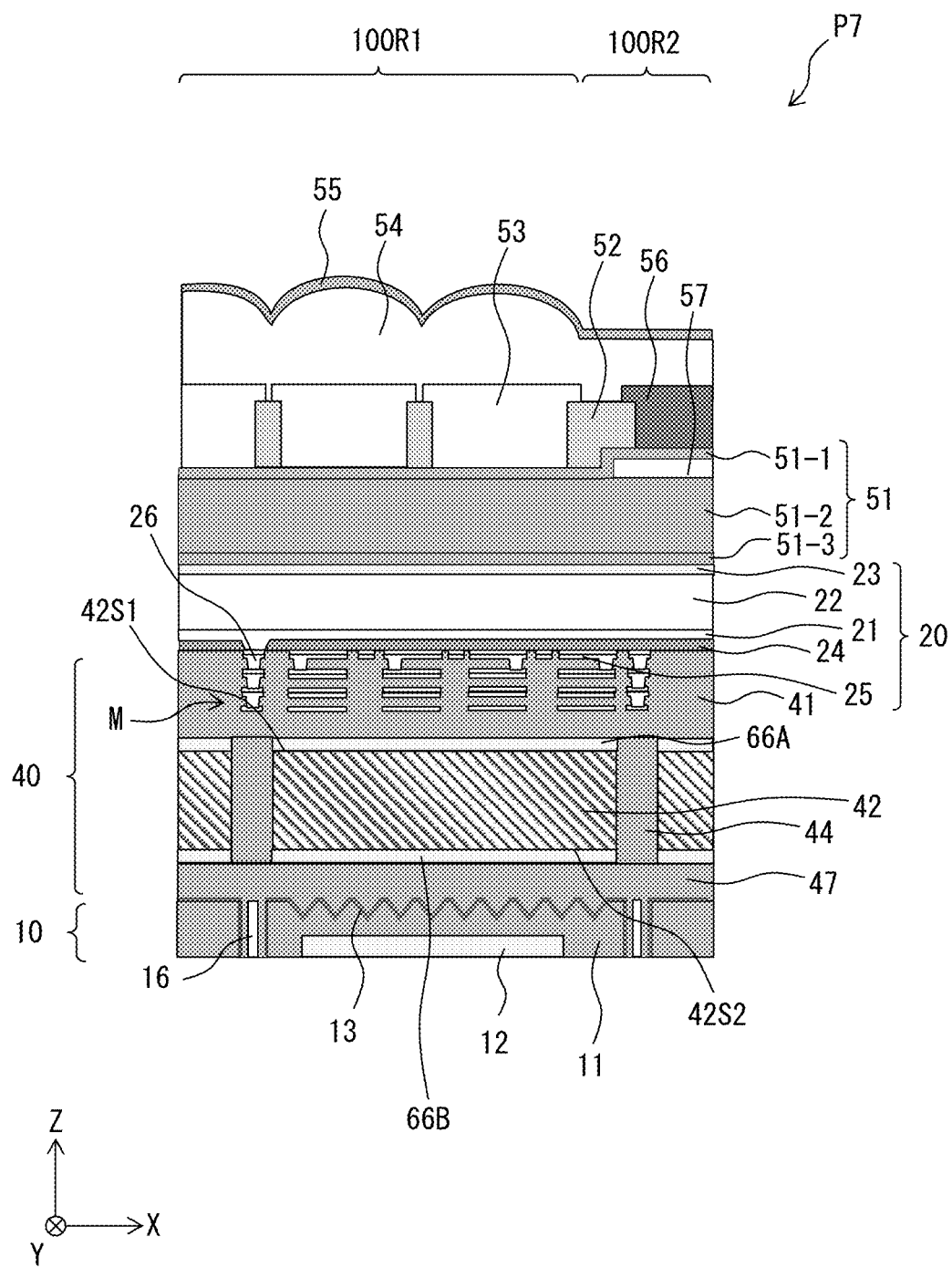

[ FIG. 28 ]
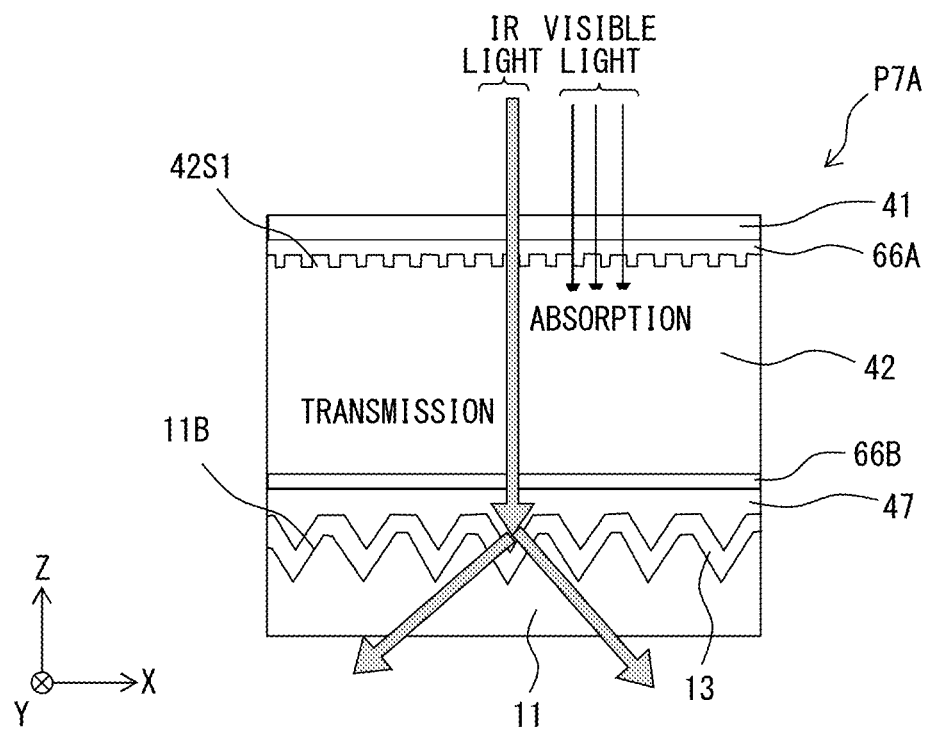
[ FIG. 29 ]
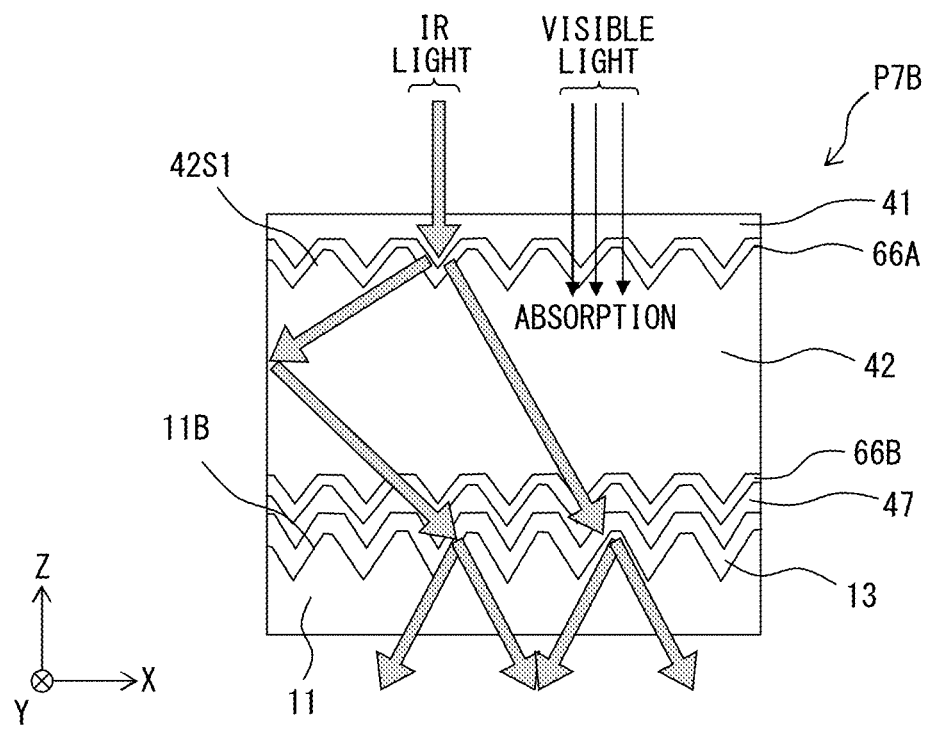

[ FIG. 31 ]
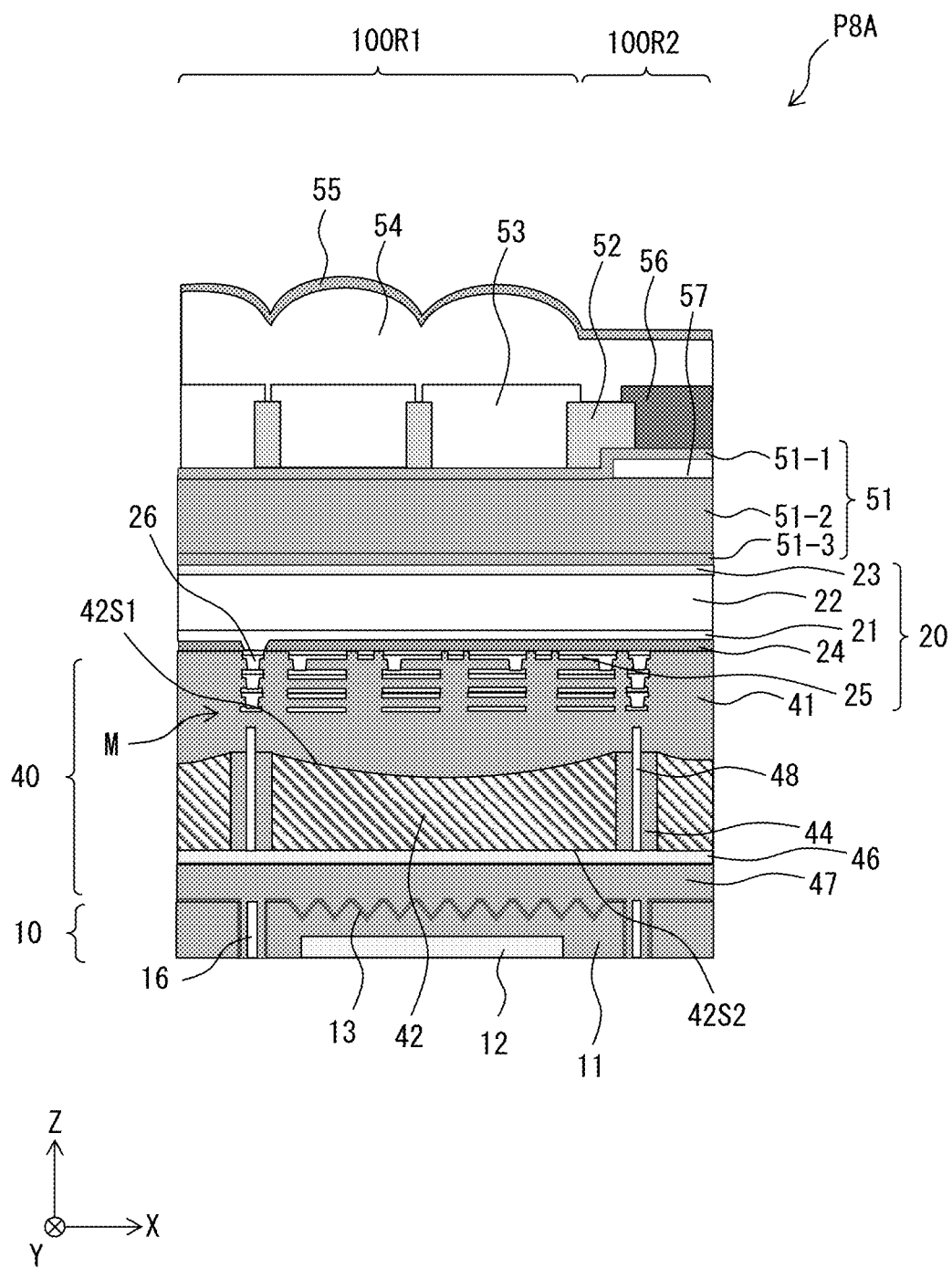

[ FIG. 32 ]
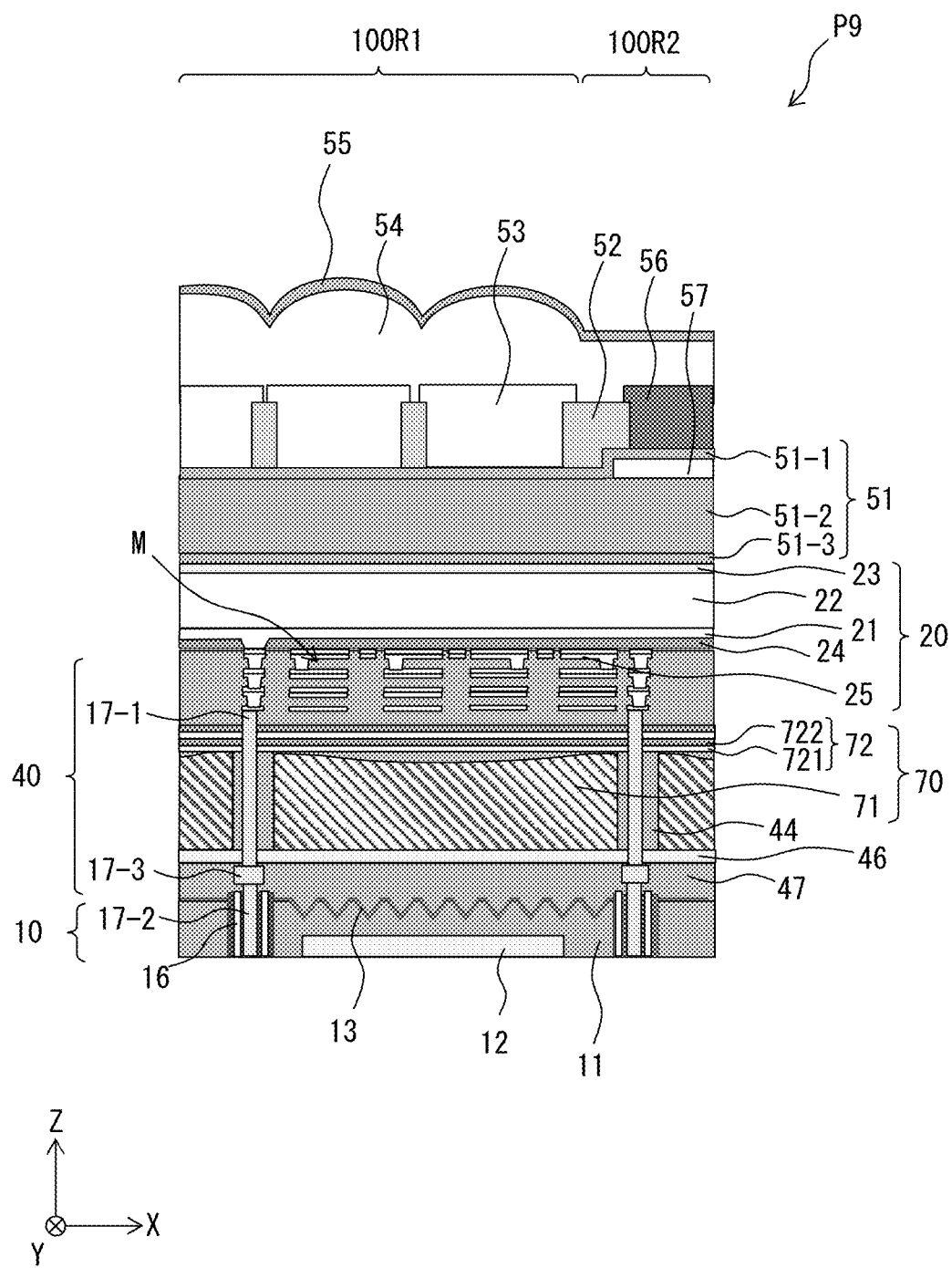

[ FIG. 33A ]
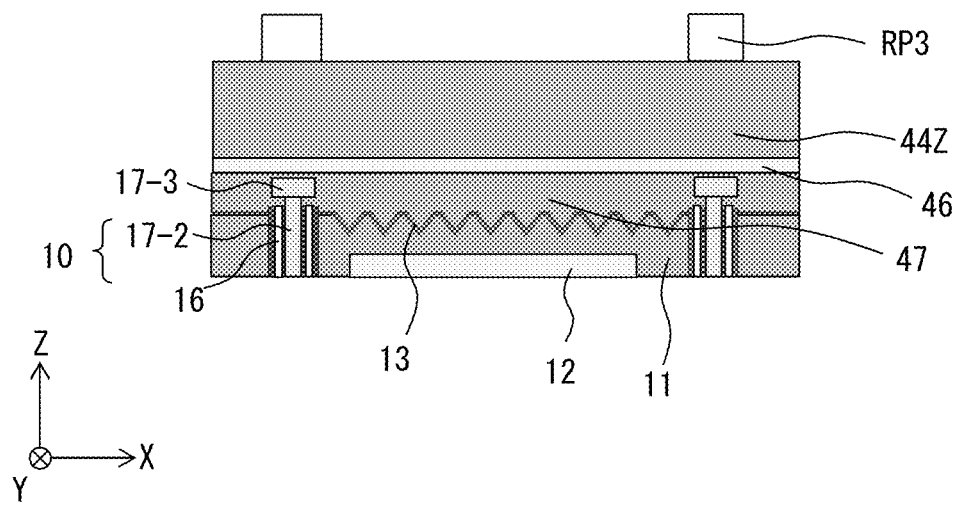
[ FIG. 33B ]
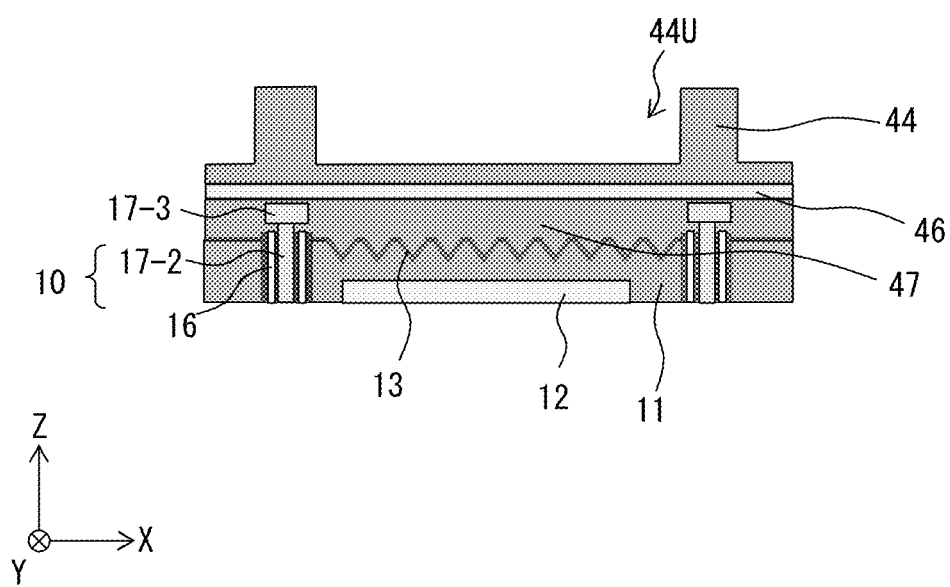

[ FIG. 33C ]
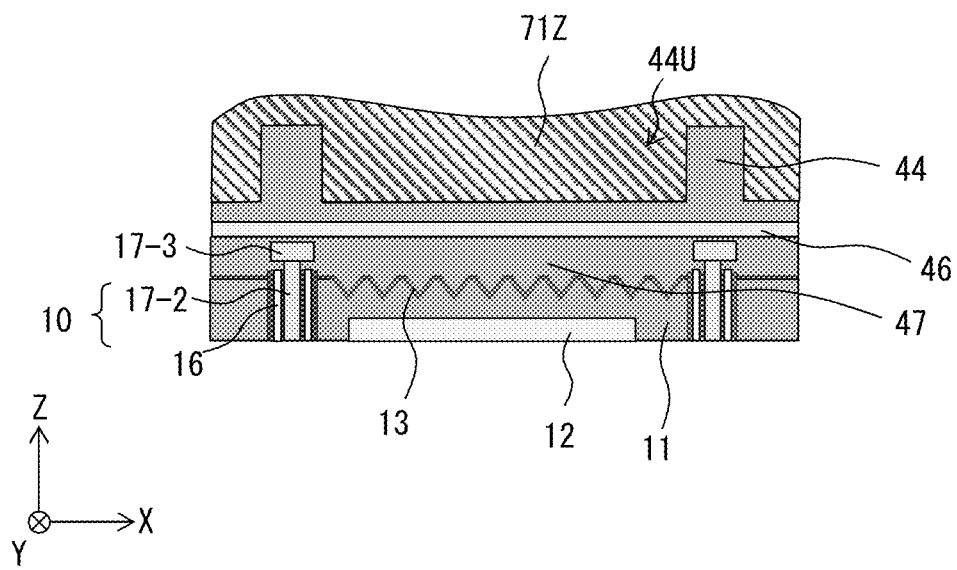
[ FIG. 33D ]
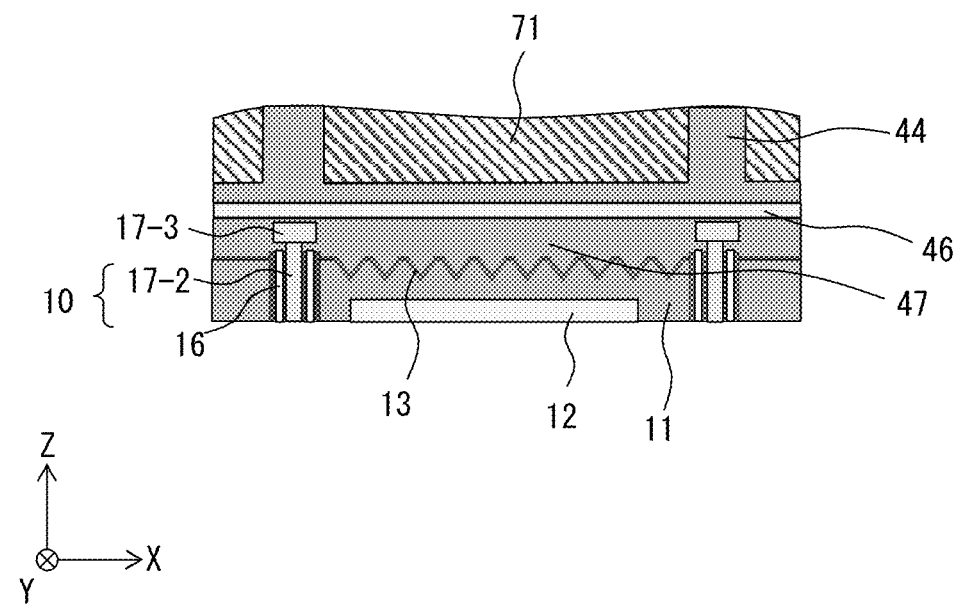

[ FIG. 33E ]
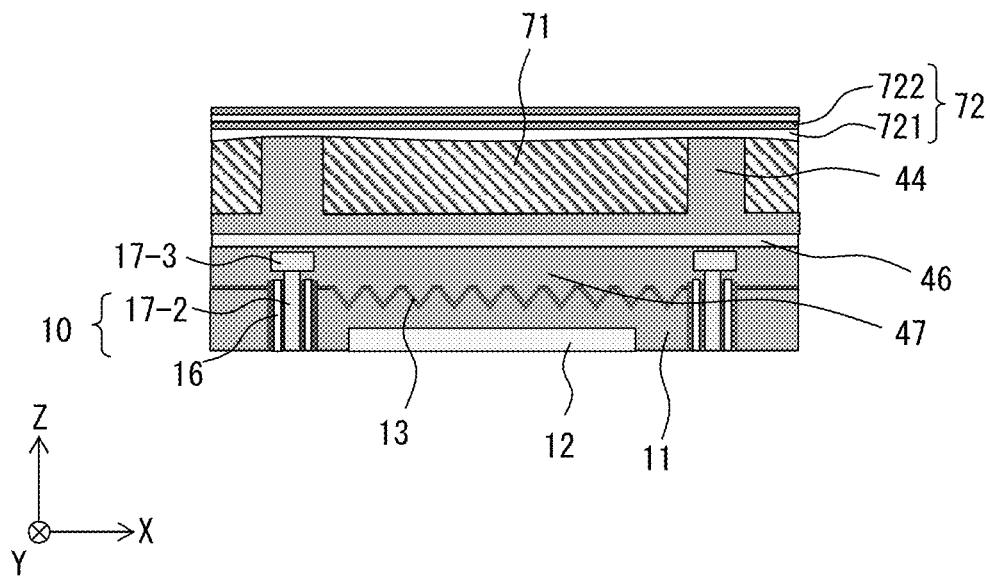
[ FIG. 33F ]
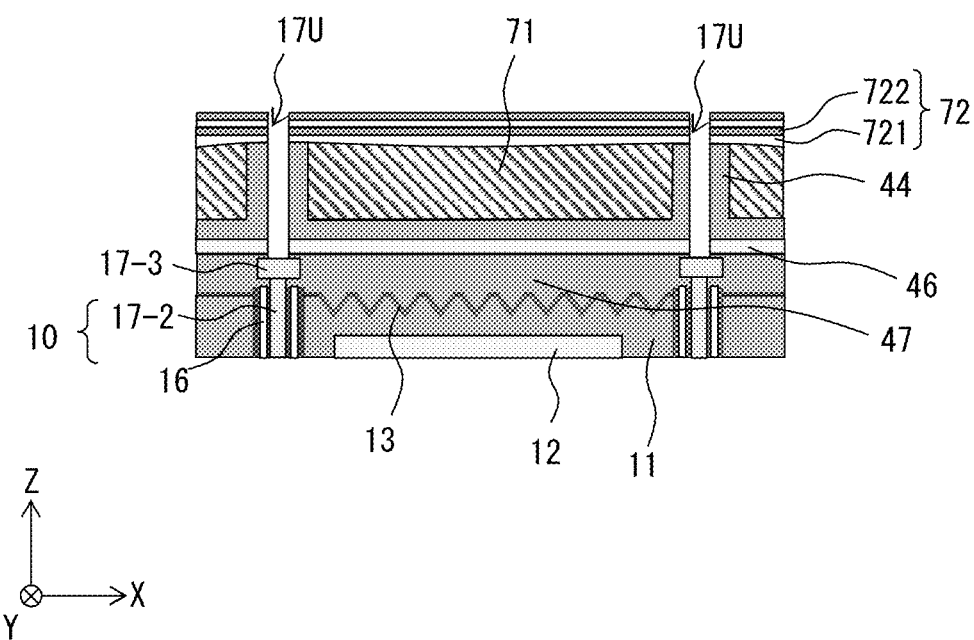

[ FIG. 33G ]
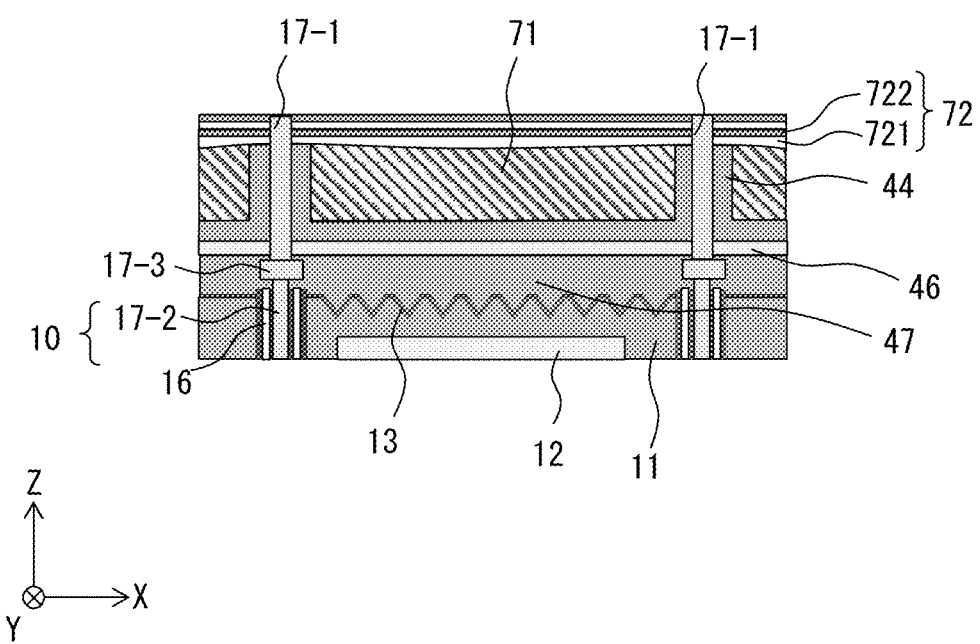

[ FIG. 34 ]
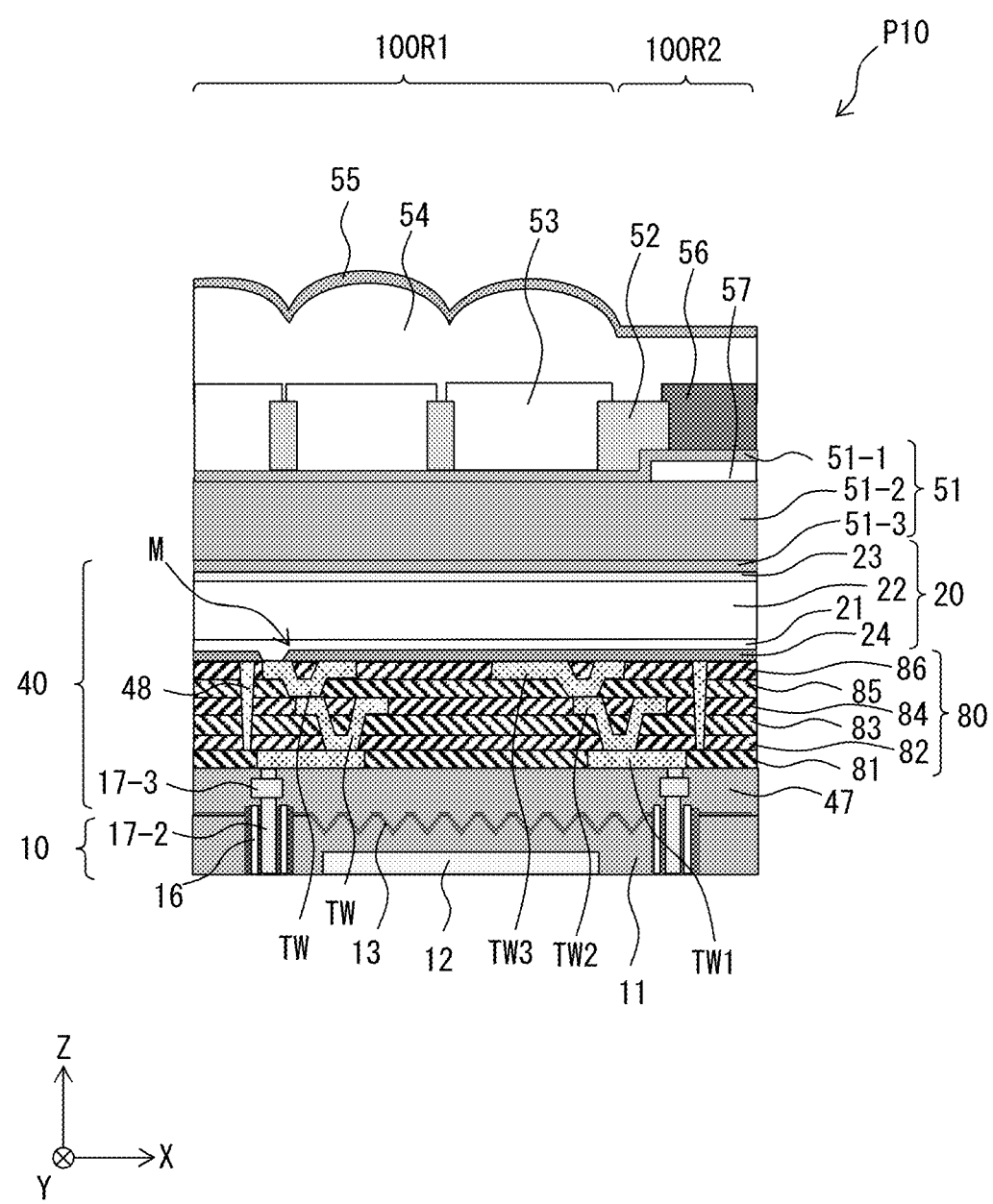

[ FIG. 35A ]
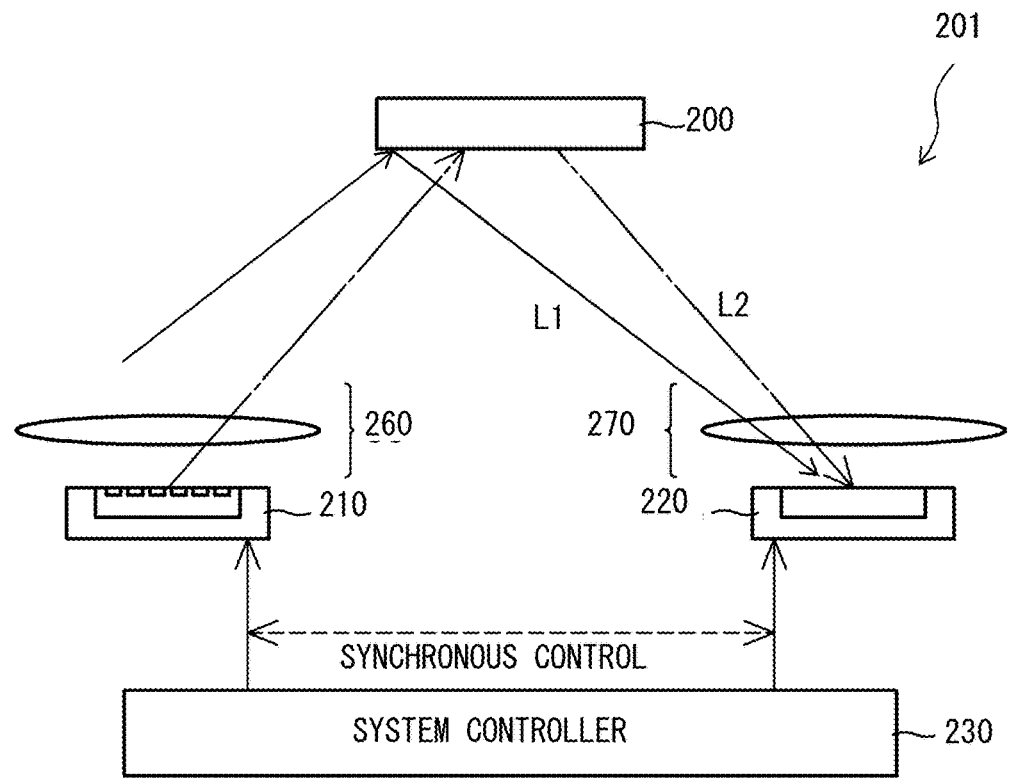
[ FIG. 35B ]
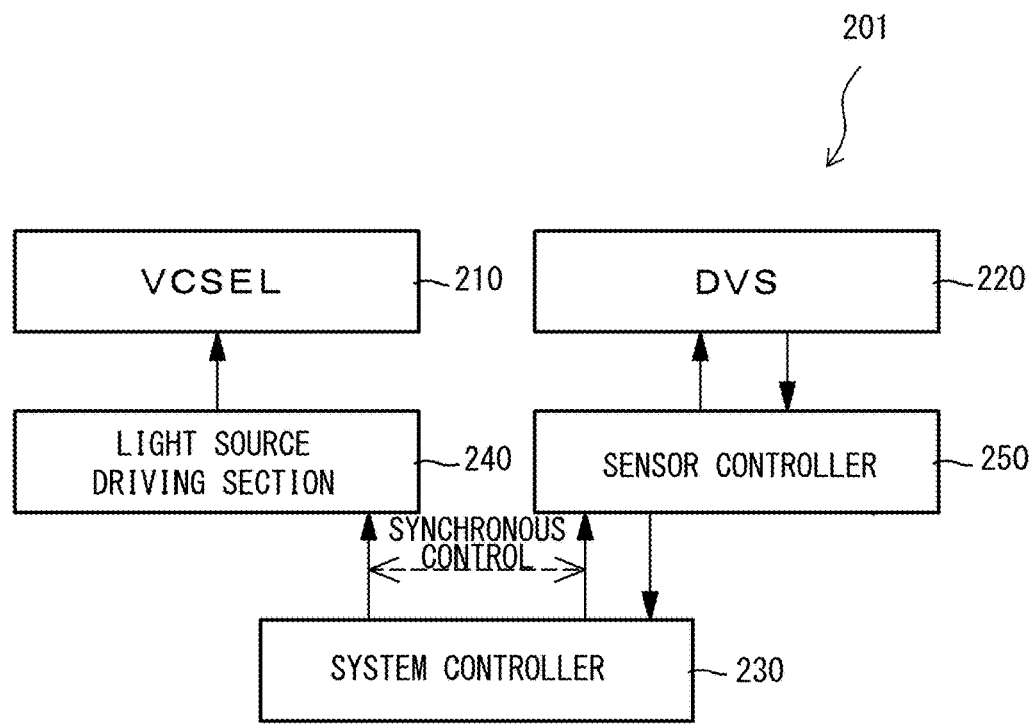

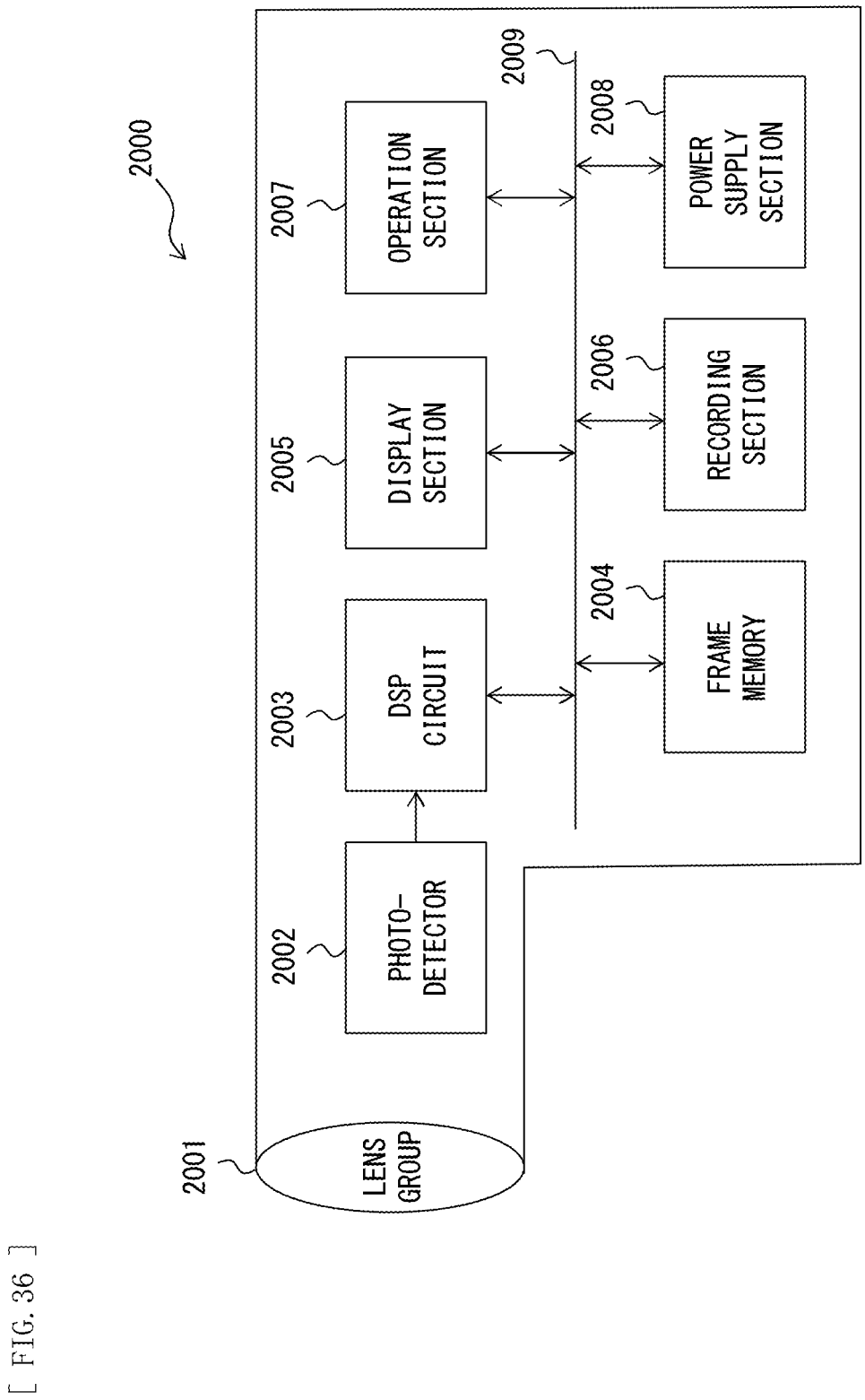
[ FIG. 36 ]

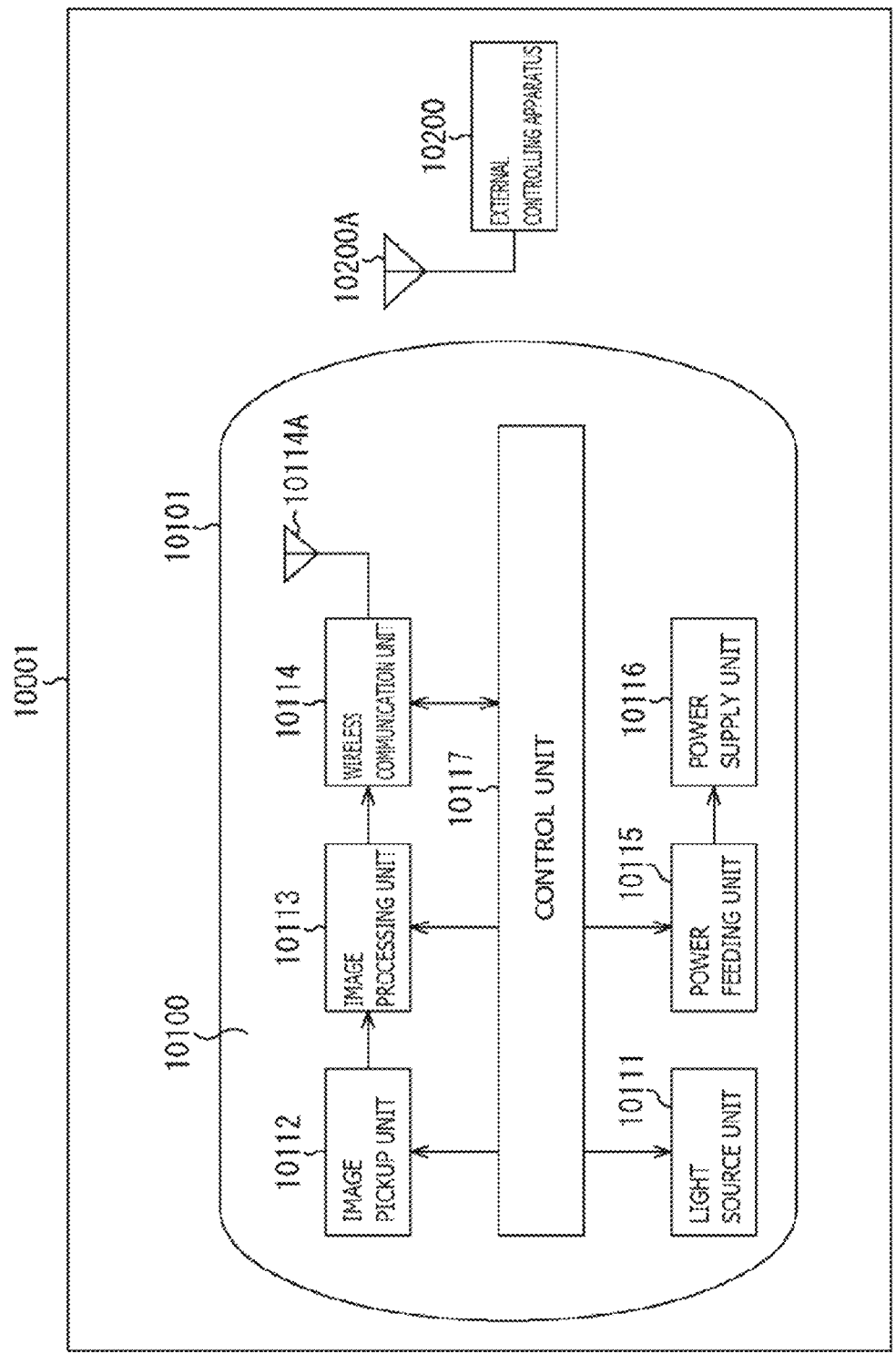
[FIG. 37]

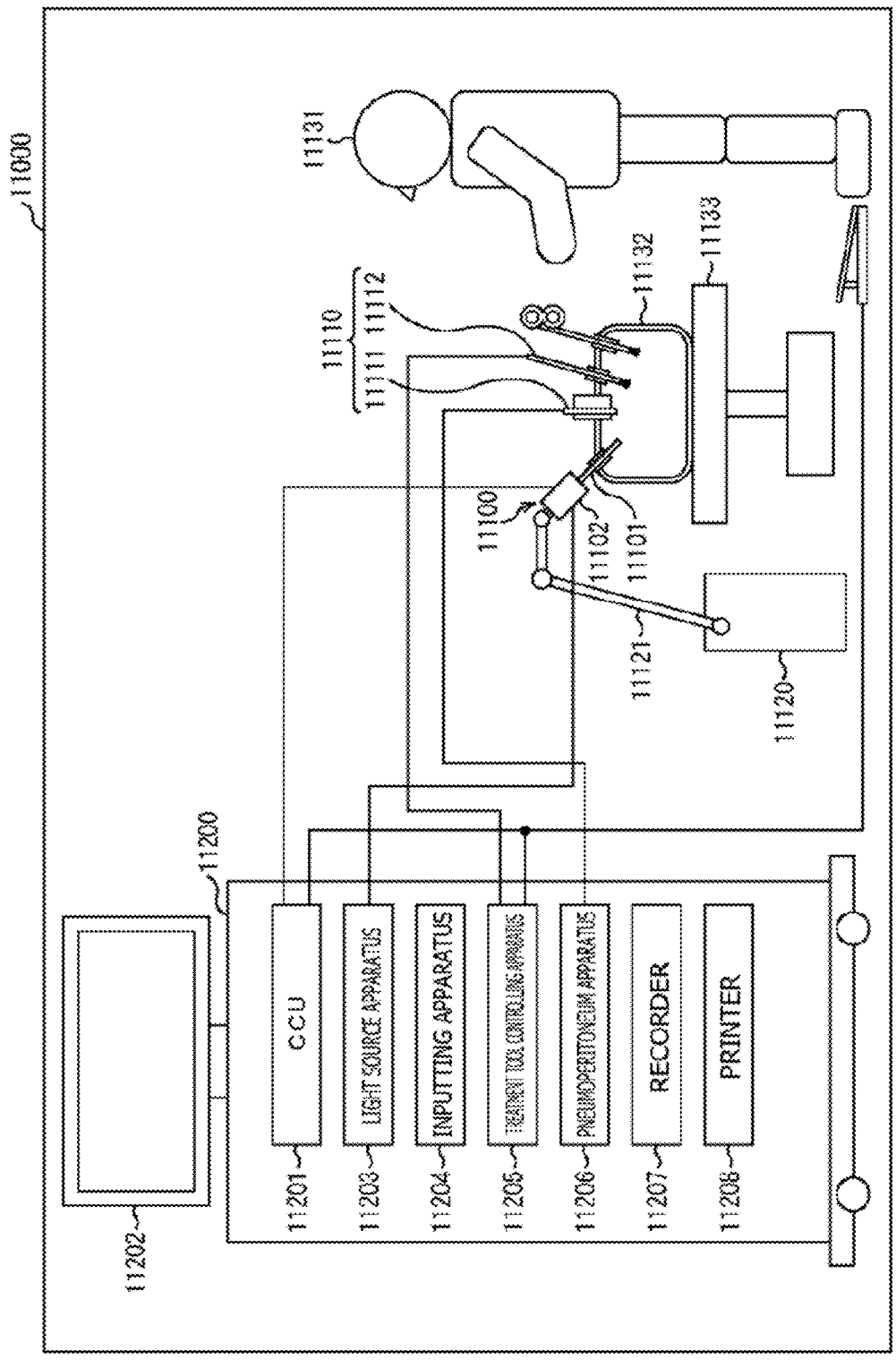
[ FIG. 38 ]

[ FIG. 39 ]
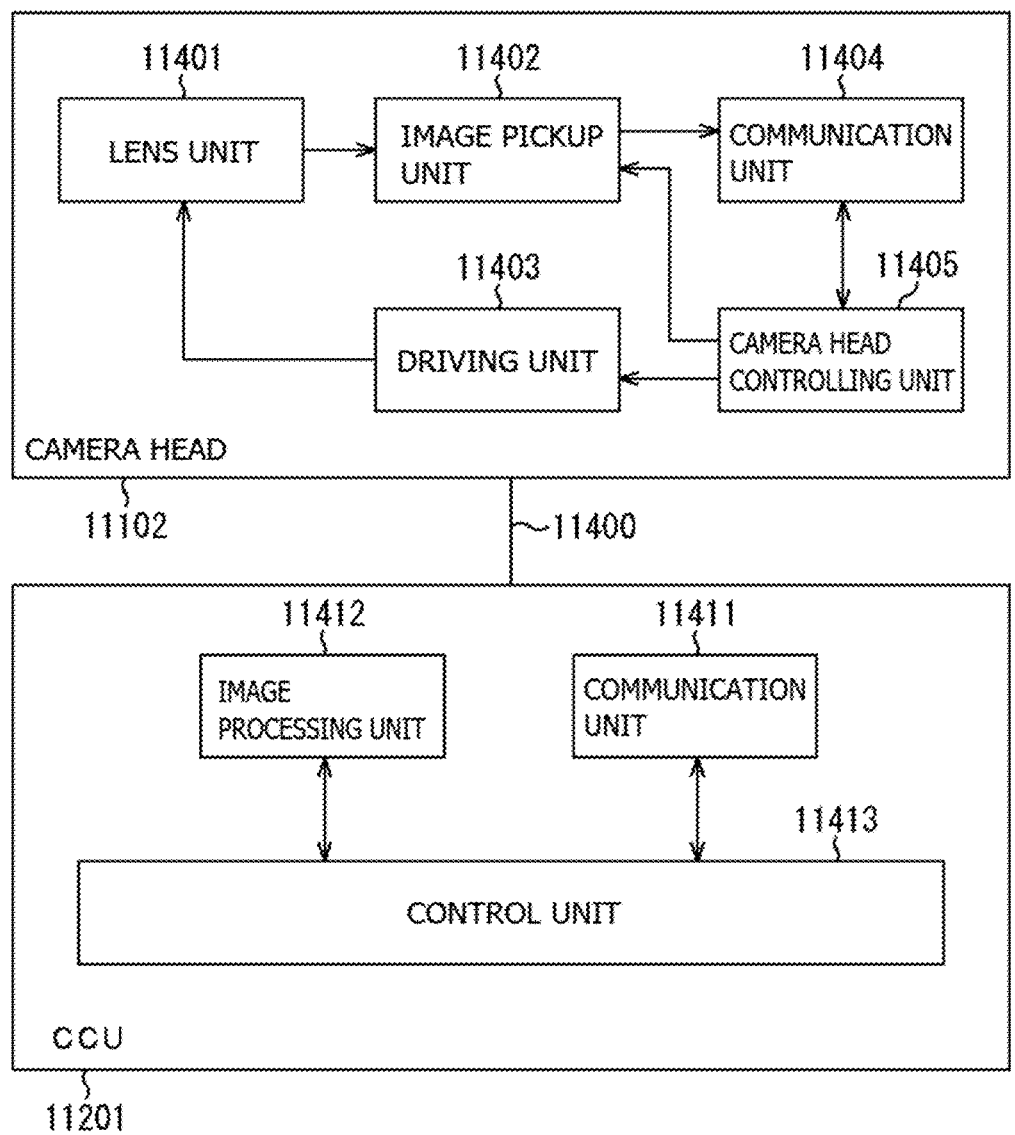

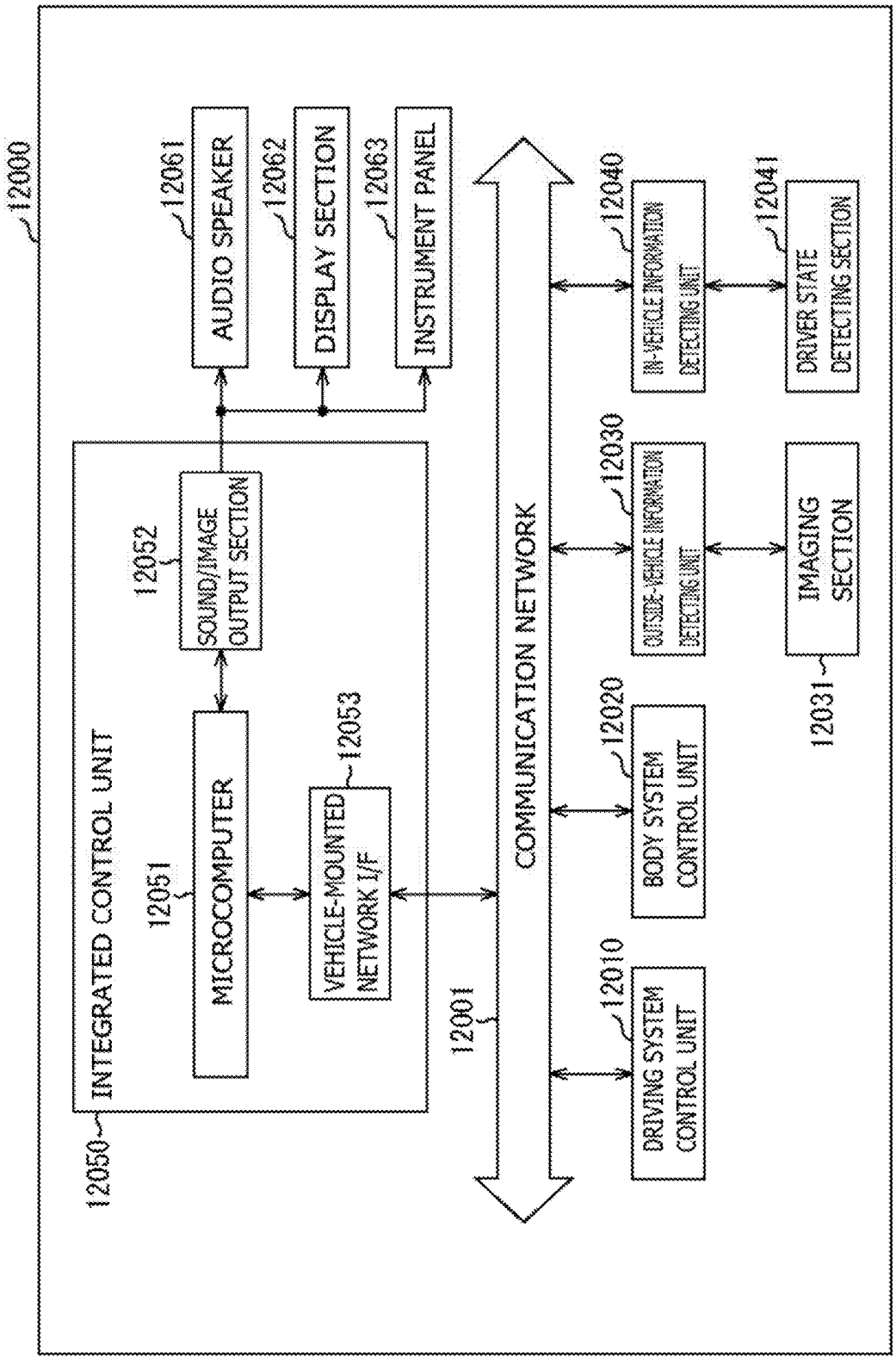
[ FIG. 40 ]

[ FIG. 41 ]
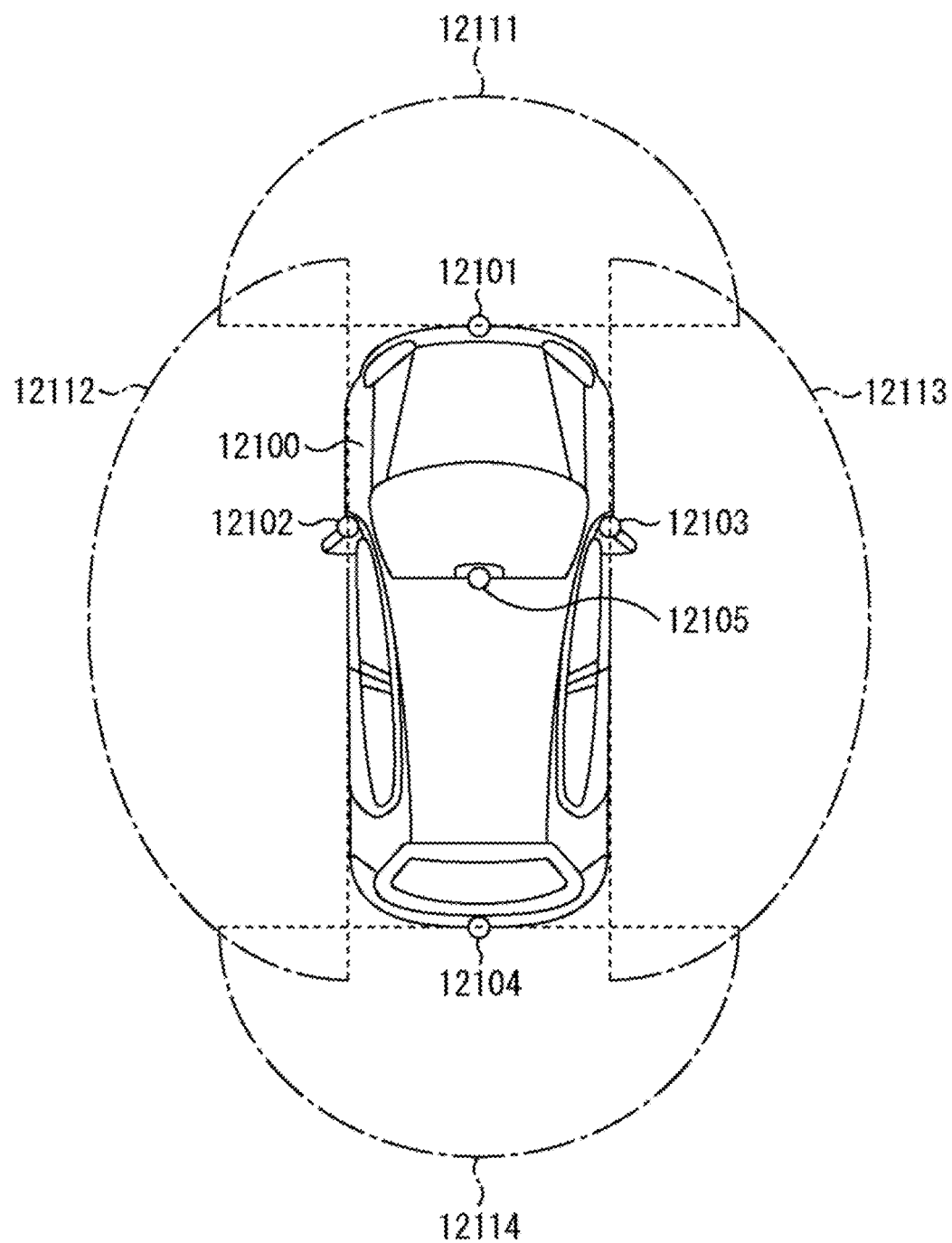

PHOTOELECTRIC CONVERSION ELEMENT, PHOTODETECTOR, PHOTODETECTION SYSTEM, ELECTRONIC APPARATUS, AND MOBILE BODY

TECHNICAL FIELD

The present disclosure relates to a photoelectric conversion element that performs photoelectric conversion, and a photodetector, a photodetection system, an electronic apparatus, and a mobile body that each include the photoelectric conversion element.

BACKGROUND ART

There has been proposed a solid-state imaging device including a stacked structure of a first photoelectric conversion region that receives mainly visible light and photoelectrically converts the visible light and a second photoelectric conversion region that receives mainly infrared light and photoelectrically converts the infrared light (see PTL 1, for example).

CITATION LIST

Patent Literature

PTL 1: Japanese Unexamined Patent Application Publication No. 2017-208496

SUMMARY OF THE INVENTION

Incidentally, in a solid-state imaging device, functional improvement is desired.

It is therefore desirable to provide a highly functional photoelectric conversion element.

A photoelectric conversion element according to an embodiment of the present disclosure includes: a semiconductor substrate; a first photoelectric converter that is provided on the semiconductor substrate, and detects light in a first wavelength range and photoelectrically converts the light; a second photoelectric converter that is provided at a position overlapping the first photoelectric converter in a thickness direction of the semiconductor substrate in the semiconductor substrate, and detects light in a second wavelength range and photoelectrically converts the light; an optical filter that is sandwiched between the first photoelectric converter and the second photoelectric converter in the thickness direction, and through which the light in the second wavelength range passes more easily than the light in the first wavelength range; and a first light-shielding member that surrounds the optical filter along a plane orthogonal to the thickness direction to at least partially overlap the optical filter in a plane direction along the plane, and shields at least the light in the second wavelength range.

In addition, an electronic apparatus according to an embodiment of the present disclosure includes the imaging device described above.

In the photoelectric conversion element, the imaging device, and the electronic apparatus according to the embodiments of the present disclosure, the second light-shielding member that surrounds the second photoelectric converter is provided, which further reduces leaked light from other photoelectric conversion elements or unnecessary light from the surroundings that enters the second photoelectric converter directly or through the optical filter.

BRIEF DESCRIPTION OF DRAWINGS

FIG. 1A is a schematic configuration diagram illustrating an example of a solid-state imaging device according to a first embodiment of the present disclosure.

FIG. 1B is an explanatory diagram schematically illustrating a configuration example of a pixel section illustrated in FIG. 1A.

FIG. 2A is a vertical cross-sectional view of an example of a schematic configuration of an imaging element applied to a pixel illustrated in FIG. 1A.

FIG. 2B is a horizontal cross-sectional view of an example of a schematic configuration of the imaging element applied to the pixel illustrated in FIG. 1A.

FIG. 2C is another horizontal cross-sectional view of an example of a schematic configuration of the imaging element applied to the pixel illustrated in FIG. 1A.

FIG. 3A is an enlarged vertical cross-sectional view of a main part of the imaging element illustrated in FIG. 2A.

FIG. 3B is another enlarged vertical cross-sectional view of the main part of the imaging element illustrated in FIG. 2A.

FIG. 3C is a vertical cross-sectional view of an example of a schematic configuration in a peripheral region of the pixel section illustrated in FIG. 1B.

FIG. 4A is a schematic enlarged cross-sectional view of a through electrode and its surroundings illustrated in FIG. 2A.

FIG. 4B is a schematic enlarged plan view of the through electrode and its surroundings illustrated in FIG. 2A.

FIG. 5 is a circuit diagram illustrating an example of a readout circuit of an iTOF sensor section illustrated in FIG. 2A.

FIG. 6 is a circuit diagram illustrating an example of a readout circuit of an organic photoelectric converter illustrated in FIG. 2A-8.

FIG. 7 is a schematic cross-sectional view of an example of a schematic configuration of an imaging element according to a first modification example applied to the pixel illustrated in FIG. 1A.

FIG. 8 is a horizontal cross-sectional view of an example of a schematic configuration of an imaging element according to a second modification example applied to the pixel illustrated in FIG. 1A.

FIG. 9A is an enlarged vertical cross-sectional view of a main part of the imaging element illustrated in FIG. 8.

FIG. 9B is another enlarged vertical cross-sectional view of the main part of the imaging element illustrated in FIG. 8.

FIG. 10A is an enlarged vertical cross-sectional view of a main part of an imaging element according to a third modification example applied to the pixel illustrated in FIG. 1A.

FIG. 10B is another enlarged vertical cross-sectional view of the main part of the imaging element according to the third modification example applied to the pixel illustrated in FIG. 1A.

FIG. 11A is an enlarged vertical cross-sectional view of a main part of an imaging element according to a fourth modification example applied to the pixel illustrated in FIG. 1A.

FIG. 11B is another enlarged vertical cross-sectional view of the main part of the imaging element according to the fourth modification example applied to the pixel illustrated in FIG. 1A.

FIG. 12A is an enlarged vertical cross-sectional view of a main part of an imaging element according to a fifth modification example applied to the pixel illustrated in FIG. 1A.

FIG. 12B is another enlarged vertical cross-sectional view of the main part of the imaging element according to the fifth modification example applied to the pixel illustrated in FIG. 1A.

FIG. 13 is a horizontal cross-sectional view of an example of a schematic configuration of an imaging element according to a sixth modification example applied to the pixel illustrated in FIG. 1A.

FIG. 14 is an enlarged vertical cross-sectional view of a main part of the imaging element according to the sixth modification example illustrated in FIG. 13.

FIG. 15A is an enlarged vertical cross-sectional view of a main part of an imaging element according to a second embodiment of the present disclosure.

FIG. 15B is an enlarged horizontal cross-sectional view of a main part of the imaging element illustrated in FIG. 15A.

FIG. 16 is a vertical cross-sectional view of a process in a method of manufacturing the imaging element illustrated in FIG. 15A.

FIG. 16B is a vertical cross-sectional view of a process subsequent to FIG. 16A.

FIG. 16C is a vertical cross-sectional view of a process subsequent to FIG. 16B.

FIG. 16D is a vertical cross-sectional view of a process subsequent to FIG. 16C.

FIG. 16E is a vertical cross-sectional view of a process subsequent to FIG. 16D.

FIG. 16F is a vertical cross-sectional view of a process subsequent to FIG. 16E.

FIG. 16G is a vertical cross-sectional view of a process subsequent to FIG. 16F.

FIG. 16H is a vertical cross-sectional view of a process subsequent to FIG. 16G.

FIG. 16I is a vertical cross-sectional view of a process subsequent to FIG. 16H.

FIG. 16J is a vertical cross-sectional view of a process subsequent to FIG. 16I.

FIG. 16K is a vertical cross-sectional view of a process subsequent to FIG. 16J.

FIG. 16L is a vertical cross-sectional view of a process subsequent to FIG. 16K.

FIG. 17A is an enlarged vertical cross-sectional view of a main part of an imaging element according to a first modification example of the second embodiment.

FIG. 17B is an enlarged horizontal cross-sectional view of a main part of the imaging element illustrated in FIG. 17A.

FIG. 18 is an enlarged vertical cross-sectional view of a main part of an imaging element according to a second modification example of the second embodiment.

FIG. 19 is an enlarged vertical cross-sectional view of a main part of an imaging element according to a third embodiment of the present disclosure.

FIG. 20 is an enlarged vertical cross-sectional view of a main part of an imaging element according to a fourth embodiment of the present disclosure.

FIG. 21 is an enlarged vertical cross-sectional view of a main part of an imaging element according to a first modification example of the fourth embodiment.

FIG. 22 is an enlarged vertical cross-sectional view of a main part of an imaging element according to a fifth embodiment of the present disclosure.

FIG. 23 is an enlarged vertical cross-sectional view of a main part of an imaging element according to a first modification example of the fifth embodiment.

FIG. 24 is an enlarged vertical cross-sectional view of a main part of an imaging element according to a sixth embodiment of the present disclosure.

FIG. 25 is an enlarged vertical cross-sectional view of a main part of an imaging element according to a first modification example of the sixth third embodiment.

FIG. 26 is an enlarged vertical cross-sectional view of a main part of an imaging element according to a second modification example of the sixth embodiment.

FIG. 27 is an enlarged vertical cross-sectional view of a main part of an imaging element according to a seventh embodiment of the present disclosure.

FIG. 28 is an enlarged vertical cross-sectional view of a main part of an imaging element according to a first modification example of the seventh embodiment.

FIG. 29 is an enlarged vertical cross-sectional view of a main part of an imaging element according to a second modification example of the seventh embodiment.

FIG. 31 is an enlarged vertical cross-sectional view of a main part of an imaging element according to a first modification example of the eighth embodiment.

FIG. 32 is an enlarged vertical cross-sectional view of a main part of an imaging element according to a ninth embodiment of the present disclosure.

FIG. 33A is a vertical cross-sectional view of a process in a method of manufacturing the imaging element illustrated in FIG. 32.

FIG. 33B is a vertical cross-sectional view of a process subsequent to FIG. 33A.

FIG. 33C is a vertical cross-sectional view of a process subsequent to FIG. 33B.

FIG. 33D is a vertical cross-sectional view of a process subsequent to FIG. 33C.

FIG. 33E is a vertical cross-sectional view of a process subsequent to FIG. 33D.

FIG. 33F is a vertical cross-sectional view of a process subsequent to FIG. 33E.

FIG. 33G is a vertical cross-sectional view of a process subsequent to FIG. 33F.

FIG. 34 is an enlarged cross-sectional view of a main part of an imaging element according to a tenth embodiment of the present disclosure.

FIG. 35A is a schematic view of an example of an entire configuration of a photodetection system according to an eleventh embodiment of the present disclosure.

FIG. 35B is a schematic view of an example of a circuit configuration of the photodetection system illustrated in FIG. 35A.

FIG. 36 is a schematic view of an entire configuration example of an electronic apparatus.

FIG. 37 is a block diagram depicting an example of a schematic configuration of an in-vivo information acquisition system.

FIG. 38 is a view depicting an example of a schematic configuration of an endoscopic surgery system.

FIG. 39 is a block diagram depicting an example of a functional configuration of a camera head and a camera control unit (CCU).

FIG. 40 is a block diagram depicting an example of schematic configuration of a vehicle control system.

FIG. 41 is a diagram of assistance in explaining an example of installation positions of an outside-vehicle information detecting section and an imaging section.

MODES FOR CARRYING OUT THE INVENTION

Figure 30:
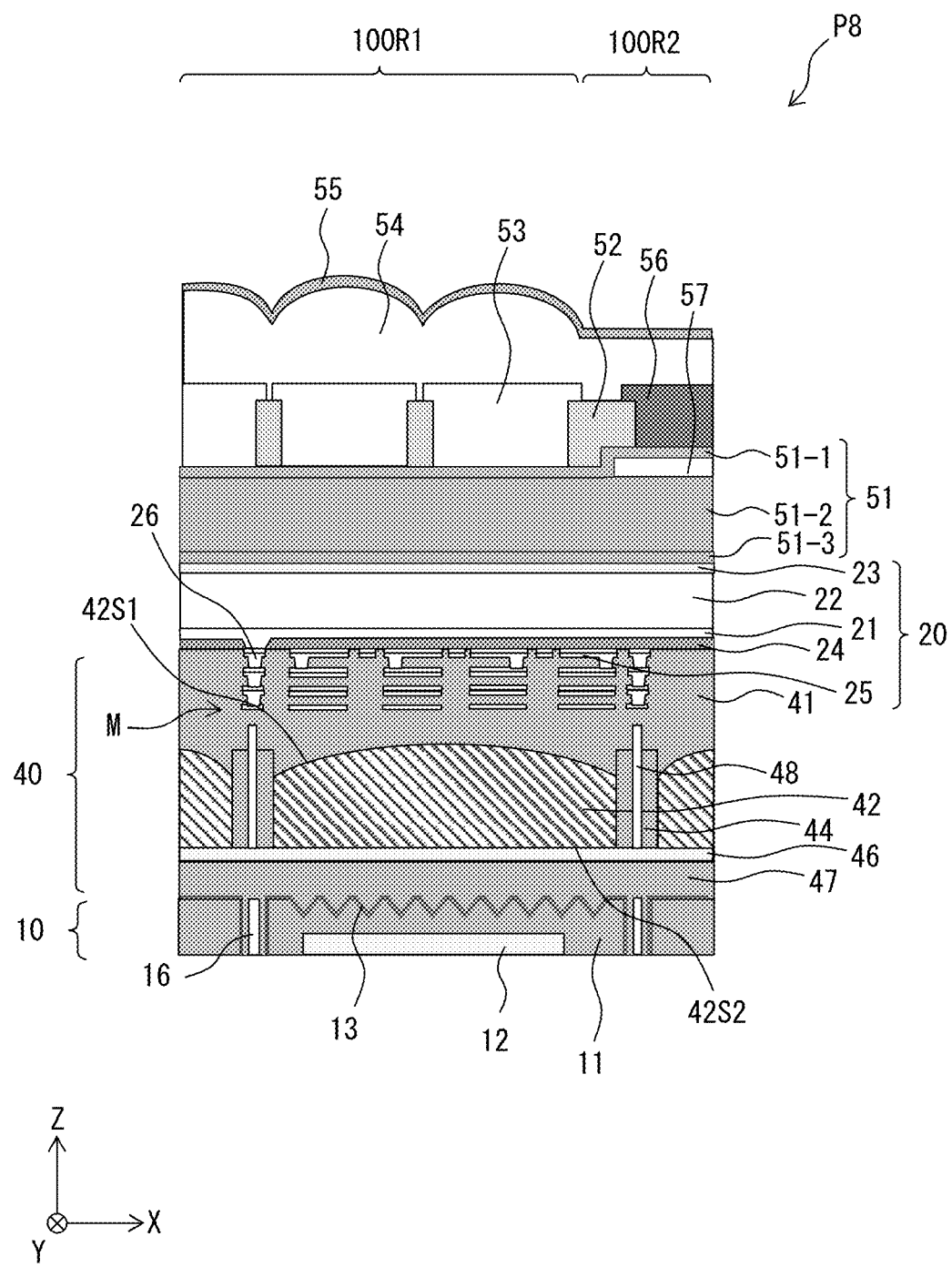
FIG. 30 is an enlarged vertical cross-sectional view of a main part of an imaging element according to an eighth embodiment of the present disclosure.

Some embodiments of the present disclosure are described below in detail with reference to the drawings. It is to be noted that the description is given in the following order.

1. First Embodiment
   An example of a solid-state imaging device including an organic photoelectric converter that obtains visible light image information and an iTOF sensor section that receives infrared light to obtain distance information
2. Second Embodiment
   An example of an imaging element provided with a pillar that penetrates through an optical filter
3. Third Embodiment
   An example of an imaging element including an optical filter that includes a chalcogenide compound
4. Fourth Embodiment
   An example of an imaging element including a metal partition wall in which a metal embedding layer is provided on a liner layer
5. Fifth Embodiment
   An example of an imaging element including a hydrogen sealing film
6. Sixth Embodiment
   An example of an imaging element including an optical member that has a concave surface opposed to an organic photoelectric converter to reflect visible light
7. Seventh Embodiment
   An example of an imaging element in which antireflection films are provided on both surfaces of an optical filter
8. Eighth Embodiment
   An example of an imaging element in which an optical filter has positive refractive power or negative refractive power
9. Ninth Embodiment
   An example of an imaging element including an optical filter having a stacked structure of an organic material portion and an inorganic material portion
10. Tenth Embodiment
    An example of an imaging element including an optical filter in which a transparent wiring line is embedded
11. Eleventh Embodiment
    An example of a photodetection system including a light-emitting device and a photodetector
12. Application Example to Electronic Apparatus
13. Practical Application Example to In-vivo Information Acquisition System
14. Practical Application Example to Endoscopic Surgery System
15. Practical Application Example to Mobile Body
16. Other Modification Examples 1. First Embodiment

[Configuration of Solid-State Imaging Device 1]
(Overall Configuration Example)
FIG. 1A is an overall configuration example of a solid-state imaging device 1 according to an embodiment of the present disclosure. The solid-state imaging device 1 is, for example, a CMOS (Complementary Metal Oxide Semiconductor) image sensor. For example, the solid-state imaging device 1 captures incident light (image light) from a subject through an optical lens system, converts the incident light of which an image is formed on an imaging plane into an electric signal on a pixel-by-pixel basis, and outputs the electric signal as a pixel signal. The solid-state imaging device 1 includes a pixel section 100 as an imaging region, a vertical drive circuit 111, a column signal processing circuit 112, a horizontal drive circuit 113, an output circuit 114, a control circuit 115, and an input/output terminal 116 on a semiconductor substrate 11, for example. The vertical drive circuit 111, the column signal processing circuit 112, the horizontal drive circuit 113, the output circuit 114, the control circuit 115, and the input/output terminal 116 are disposed in a peripheral region of the pixel section 100, The solid-state imaging device 1 is a specific example corresponding to a "photodetector" of the present disclosure.

FIG. 1B schematically illustrates a configuration example of the pixel section. As illustrated in FIG. 1B, the pixel section 100 has an effective region 100R1 including a plurality of pixels P two-dimensionally arranged in a matrix, and a peripheral region 100R2 positioned around the effective region 100R1. The effective region 100R1 of the pixel section 100 has, for example, a plurality of pixel rows each including a plurality of pixels P disposed side by side in a horizontal direction (a lateral direction on the sheet) and a plurality of pixel columns each including a plurality of pixels P disposed side by side in a vertical direction (a longitudinal direction on the sheet). In the pixel section 100, for example, one pixel drive line Lread (a row selection line and a reset control line) is wired with each pixel row, and one vertical signal line Lsig is wired with each pixel column. The pixel drive line Lread transmits a drive signal for signal reading from each pixel P. A plurality of pixel drive lines Lread each has one end coupled to a corresponding one of a plurality of output terminals, corresponding to respective pixel rows, of the vertical drive circuit 111.

The vertical drive circuit 111 includes a shift register, an address decoder, and the like, and is a pixel driving section that drives the respective pixels P in the pixel section 100 in pixel row units, for example. A signal outputted from each of the pixels P in a pixel row selected and scanned by the vertical drive circuit 111 is supplied to the column signal processing circuit 112 through a corresponding one of the vertical signal lines Lsig.

The column signal processing circuit 112 includes an amplifier, a horizontal selection switch, and the like provided for each of the vertical signal lines Lsig.

The horizontal drive circuit 113 includes a shift register, an address decoder, and the like, and drives respective horizontal selection switches of the column signal processing circuits 112 in sequence while scanning the horizontal selection switches. Such selective scanning by the horizontal drive circuit 113 causes the signals of the respective pixels P transmitted through a plurality of respective vertical signal lines Lsig to be outputted in sequence to a horizontal signal line 121 and be transmitted to outside of the semiconductor substrate 11 through the horizontal signal line 121.

The output circuit 114 performs signal processing on the signals supplied in sequence from the respective column signal processing circuits 112 through the horizontal signal line 121, and outputs the processed signals. The output circuit 114 may perform, for example, only buffering, or may perform black level adjustment, column variation correction, various kinds of digital signal processing, and the like.

Circuit components including the vertical drive circuit 111, the column signal processing circuit 112, the horizontal drive circuit 113, the horizontal signal line 121, and the output circuit 114 may be formed directly on the semiconductor substrate 11, or may be provided in an external control IC. Alternatively, these circuit components may be formed on another substrate coupled by a cable, or the like.

The control circuit 115 receives a clock given from the outside of the semiconductor substrate 11, or data or the like on instructions of operation modes, and also outputs data such as internal information of the pixel P that is an imaging element. The control circuit 115 further includes a timing generator that generates various timing signals, and controls driving of peripheral circuits such as the vertical drive circuit 111, the column signal processing circuit 112, and the horizontal drive circuit 113, on the basis of the various timing signals generated by the timing generator.

The input/output terminal 116 exchanges signals with the outside.

(Cross-Sectional Configuration Example of Pixel P)

FIG. 2A schematically illustrates an example of a vertical cross-sectional configuration along a thickness direction of one pixel P1 of the plurality of pixels P arranged in a matrix in the pixel section 100. FIG. 2B schematically illustrates an example of a horizontal cross-sectional configuration along a stacking surface direction orthogonal to the thickness direction at a height position in a Z-axis direction indicated by an arrow IIB in FIG. 2A. Furthermore, FIG. 2C schematically illustrates an example of a horizontal cross-sectional configuration along the stacking surface direction orthogonal to the thickness direction at a height position in the Z-axis direction indicated by an arrow IIC in FIG. 2A. In FIGS. 2A to 2C, a thickness direction (stacking direction) of the pixel P1 is referred to as the Z-axis direction, and plane directions parallel to a stacking surface orthogonal to the Z-axis direction are referred to as an X-axis direction and a Y-axis direction. It is to be noted that the X-axis direction, the Y-axis direction, and the Z-axis direction are orthogonal to each other.

As illustrated in FIG. 2A, the pixel P1 is, for example, a so-called longitudinal spectral type imaging element including a structure in which one photoelectric converter 10 and one organic photoelectric converter 20 are stacked in the Z-axis direction that is the thickness direction. The pixel P1 that is an imaging element is a specific example corresponding to a "photoelectric conversion element" of the present disclosure. The pixel P1 further includes an intermediate layer 40 and a multilayer wiring layer 30. The intermediate layer 40 is provided between the photoelectric converter 10 and the organic photoelectric converter 20, and the multilayer wiring layer 30 is provided on side opposite to the organic photoelectric converter 20 as viewed from the photoelectric converter 10. Furthermore, for example, a sealing film 51, a low refractive index layer 52, a plurality of color filters 53, and on-chip lenses (OCLs) 54 provided corresponding one by one to the plurality of color filters 53 are stacked in the Z-axis direction in order from a position close to the organic photoelectric converter 20 on light incident side that is opposite to the photoelectric converter 10 as viewed from the organic photoelectric converter 20. It is to be noted that the sealing film 51 and the low refractive index layer 52 may each be provided common to a plurality of pixels P. The sealing film 51 has, for example, a configuration in which transparent insulating films 51-1 to 51-3 including AlOx or the like are stacked. In addition, an antireflection film 55 may be provided to cover the on-chip lenses 54. A black filter 56 may be provided in the peripheral region 100R2. The plurality of color filters 53 each include, for example, a color filter that allows mainly a red color to pass therethrough, a color filter that allows mainly a green color to pass therethrough, and a color filter that allows mainly a blue color to pass therethrough. It is to be noted that the pixel P1 according to the present embodiment includes the color filters 53 of red, green, and blue, and obtains a color visible light image by receiving each of red light, green light, and blue light on the organic photoelectric converter 20.

(Photoelectric Converter 10)

The photoelectric converter 10 is, for example, an indirect TOF (hereinafter referred to as iTOF) sensor that obtains a distance image (distance information) by time of flight (Time-of-Flight; TOF). The photoelectric converter 10 includes, for example, the semiconductor substrate 11, a photoelectric conversion region 12, a fixed electric charge layer 13, a pair of transfer transistors (TGs) 14A and 14B, electric charge-voltage converters (FDs) 15A and 15B that are floating diffusion regions, an inter-pixel region light-shielding wall 16, and a through electrode 17.

The semiconductor substrate 11 is, for example, an n-type silicon (Si) substrate having a front surface 11A and a back surface 11B, and includes a p-well in a predetermined region. The front surface 11A is opposed to the multilayer wiring layer 30. The back surface 11B is a surface opposed to the intermediate layer 40. It is preferable that a fine recessed and projected structure be formed on the back surface 11B, which is effective in confining, inside the semiconductor substrate 11, infrared light incident on the semiconductor substrate 11. It is to be noted that a similar fine recessed and projected structure may be also formed on the front surface 11A.

The photoelectric conversion region 12 is, for example, a photoelectric conversion element including a PIN (Positive Intrinsic Negative) type photodiode (PD), and includes a pn junction formed in a predetermined region of the semiconductor substrate 11. The photoelectric conversion region 12 specifically detects and receives light having a wavelength in the infrared light range of light from a subject, generates electric charges corresponding to the amount of received light by photoelectric conversion, and accumulates the electric charges.

The fixed electric charge layer 13 is provided to cover the back surface 11B and the like of the semiconductor substrate 11. The fixed electric charge layer 13 has, for example, negative fixed electric charges to suppress generation of a dark current caused by an interface state of the back surface 11B that is a light-receiving surface of the semiconductor substrate 11. A hole accumulation layer is formed in proximity to the back surface 11B of the semiconductor substrate 11 by an electric field induced by the fixed electric charge layer 13. The hole accumulation layer suppresses generation of electrons from the back surface 11B. It is to be noted that the fixed electric charge layer 13 also includes a portion extending in the Z-axis direction between the inter-pixel region light-shielding wall 16 and the photoelectric conversion region 12. The fixed electric charge layer 13 is preferably formed with use of an insulating material. Specific examples of a constituent material of the fixed electric charge layer 13 include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide (NdO$_x$), promethium oxide (PmO$_x$), samarium oxide (SmO$_x$), europium oxide (EuO$_x$), gadolinium oxide (GdO$_x$), terbium oxide (TbO$_x$), dysprosium oxide (DyO$_x$), holmium oxide (HoO$_x$), thulium oxide (TmO$_x$), ytterbium oxide (YbO$_x$), lutetium oxide (LuO$_x$), yttrium oxide (YO$_x$), hafnium nitride (HfN$_x$), aluminum nitride (AlN$_x$), hafnium oxynitride (HfO$_x$N$_y$), aluminum oxynitride (AlO$_x$N$_y$), and the like.

The pair of TGs 14A and 14B extend in the Z-axis direction from the front surface 11A to the photoelectric conversion region 12, for example. The TG 14A and the TG 14B respectively transfer electric charges accumulated in the photoelectric conversion region 12 to the pair of FDs 15A and 15D in accordance with a drive signal applied to each of the gate electrodes 14A and 14B.

The pair of FDs 15A and 15B are respectively floating diffusion regions that convert electric charges transferred from the photoelectric conversion region 12 through the TGs 14A and 14B into electric signals (e.g., voltage signals), and output the electric signals. The FDs 15A and 15B are respectively coupled to reset transistors (RSTs) 143A and 143B, and are respectively coupled to the vertical signal line Lsig (FIG. 1) through amplification transistors (AMPs) 144A and 144B and selection transistors (SELs) 145A and 145B, as illustrated in FIG. 5 to be described later.

Each of FIG. 3A and FIG. 3B is an enlarged cross-sectional view of a main part of the pixel P1 illustrated in FIG. 2A. Note that FIG. 3A illustrates a cross-section taken along a section line IIIA-IIIA illustrated in FIGS. 2B and 2C as viewed from the direction of an arrow, and FIG. 3B illustrates a cross-section taken along a section line IBB-IBB illustrated in FIGS. 2B and 2C as viewed from the direction of an arrow. In addition, FIG. 3C is a vertical cross-sectional view of an example of a schematic configuration in the peripheral region 100R2 of the pixel section 100 illustrated in FIG. 1B. Furthermore, FIG. 4A is an enlarged cross-sectional view taken along an Z axis of the inter-pixel region light-shielding wall 16 that surrounds the through electrode 17, and FIG. 4B is an enlarged cross-sectional view taken along an XY plane of the inter-pixel region light-shielding wall 16 that surrounds the through electrode 17. FIG. 4A illustrates a cross-section taken along a line IVB-IVB illustrated in FIG. 4B as viewed from the direction of an arrow. The inter-pixel region light-shielding wall 16 is provided in boundary portions with other adjacent pixels P in the XY plane. The inter-pixel region light-shielding wall 16 includes, for example, a portion extending along an XZ plane and a portion extending along a YZ plane, and is provided to surround the photoelectric conversion region 12 of each pixel P. In addition, the inter-pixel region light-shielding wall 16 may be provided to surround the through electrode 17. This makes it possible to suppress oblique incidence of unnecessary light onto the photoelectric conversion regions 12 of adjacent pixels P and prevent color mixture. It is to be noted that the inter-pixel region light-shielding wall 16 is a specific example corresponding to a "second light-shielding member" of the present disclosure.

The inter-pixel region light-shielding wall 16 includes, for example, a material that includes at least one kind of elemental metals, metal alloys, metal nitrides, and metal silicides that have a light-shielding property. More specific constituent materials of the inter-pixel region light-shielding wall 16 include Al (aluminum), Cu (copper), Co (cobalt), W (tungsten), Ti (titanium), Ta (tantalum), Ni (nickel), Mo (molybdenum), Cr (chromium), Ir (iridium), platiniridium, TiN (titanium nitride), a tungsten-silicon compound, and the like. It is to be noted that the constituent material of the inter-pixel region light-shielding wall 16 is not limited to metal materials, and the inter-pixel region light-shielding wall 16 may be formed with use of graphite. In addition, the inter-pixel region light-shielding wall 16 is not limited to an electrically conductive material, and may include an electrically non-conductive material having a light-shielding property such as an organic material. In addition, for example, an insulating layer Z1 including an insulating material such as SiOx (silicon oxide) and aluminum oxide may be provided between the inter-pixel region light-shielding wall 16 and the through electrode 17. Alternatively, a gap may be provided between the inter-pixel region light-shielding wall 16 and the through electrode 17 to insulate the inter-pixel region light-shielding wall 16 and the through electrode 17 from each other. It is to be noted that the insulating layer Z1 may not be provided in a case where the inter-pixel region light-shielding wall 16 includes an electrically non-conductive material. Furthermore, an insulating layer Z2 may be provided outside the inter-pixel region light-shielding wall 16, that is, between the inter-pixel region light-shielding wall 16 and the fixed electric charge layer 13. The insulating layer Z2 includes, for example, an insulating material such as SiOx (silicon oxide) and aluminum oxide. Alternatively, a gap may be provided between the inter-pixel region light-shielding wall 16 and the fixed electric charge layer 13 to insulate the inter-pixel region light-shielding wall 16 and the fixed electric charge layer 13 from each other. In a case where the inter-pixel region light-shielding wall 16 includes an electrically conductive material, electrical insulation between the inter-pixel region light-shielding wall 16 and the semiconductor substrate 11 is secured by the insulating layer Z2. In addition, in a case where the inter-pixel region light-shielding wall 16 is provided to surround the through electrode 17 and the inter-pixel region light-shielding wall 16 includes an electrically conductive material, electrical insulation between the inter-pixel region light-shielding wall 16 and the through electrode 17 is secured by the insulating layer Z1.

The through electrode 17 is, for example, a coupling member that electrically couples a readout electrode 26 of the organic photoelectric converter 20 to an FD 131 and an AMP 133 (see FIG. 6 to be described later). The readout electrode 26 is provided on side of the back surface 11B of the semiconductor substrate 11, and the FD 131 and the AMP 133 are provided on the front surface 11A of the semiconductor substrate 11. The through electrode 17 is, for example, a transmission path where signal electric charges generated in the organic photoelectric converter 20 are transmitted and a voltage that drives an electric charge accumulation electrode 25 is transmitted. For example, it is possible to provide the through electrode 17 to extend in the Z-axis direction from the readout electrode 26 of the organic photoelectric converter 20 to the multilayer wiring layer 30 through the semiconductor substrate 11. The through electrode 17 is able to favorably transfer signal electric charges generated in the organic photoelectric converter 20, which is provided on the side of the back surface 11B of the semiconductor substrate 11, to side of the front surface 11A of the semiconductor substrate 11. As illustrated in FIGS. 2B and 3B, the through electrode 17 penetrates inside an inter-pixel region light-shielding wall 44 in the Z-axis direction. That is, the fixed electric charge layer 13 and the inter-pixel region light-shielding wall 44 (to be described later) having electrical insulation are provided around the through electrode 17, which electrically insulates the through electrode 17 and a p-well region of the semiconductor substrate 11 from each other. Furthermore, the through electrode 17 includes a first through electrode portion 17-1 that penetrates inside the inter-pixel region light-shielding wall 44 in the Z-axis direction, and a second through electrode portion 17-2 that penetrates inside the inter-pixel region light-shielding wall 16 in the Z-axis direction. The first through electrode portion 17-1 and the second through electrode portion 17-2 are coupled to each other through a coupling electrode portion 17-3, for example. A maximum dimension in an in-plane direction of an XY plane of the coupling electrode portion 17-3 is, for example, larger than both a maximum dimension in the in-plane direction of the XY plane of the first through electrode portion 17-1 and a maximum dimension in the in-plane direction of the XY plane of the second through electrode portion 17-2.

It is possible to form the through electrode 17 with use of one or more kinds of metal materials such as aluminum (Al), tungsten (W), titanium (Ti), cobalt (Co), platinum (Pt), palladium (Pd), copper (Cu), hafnium (Hf), and tantalum (Ta), in addition to a silicon material doped with an impurity such as PDAS (Phosphorus Doped Amorphous Silicon).

(Multilayer Wiring Layer 30)

The multilayer wiring layer 30 includes, for example, the RSTs 143A and 143B, the AMPs 144A and 144B, the SELs 145A and 145B, and the like that configure a readout circuit together with the TGs 14A and 14B.

(Intermediate Layer 40)

The intermediate layer 40 may include, for example, the insulating layer 41 and an optical filter 42 embedded in the insulating layer 41. The intermediate layer 40 may further include the inter-pixel region light-shielding wall 44 as a first light-shielding member that shields at least light having a wavelength in a infrared light range (e.g., a wavelength of 880 nm to 1040 nm both inclusive) as a second wavelength range. The insulating layer 41 includes, for example, a monolayer film including one kind of inorganic insulating materials such as silicon oxide ($SiO_x$), silicon nitride (SiNx), and silicon oxynitride (SiON), or a stacked film including two or more kinds thereof. Furthermore, an organic insulating material such as polymethyl methacrylate (PMMA), polyvinyl phenol (PVP), polyvinyl alcohol (PVA), polyimide, polycarbonate (PC), polyethylene terephthalate (PET), polystyrene, N-2(aminoethyl)3-aminopropyltrimethoxysilane (AEAPTMS), 3-mercaptopropyl trimethoxysilane (MPTMS), tetraethoxysilane (TEOS), and octadecyltrichlorosilane (OTS) may be used as a material included in the insulating layer 41. In addition, a wiring layer M is embedded in the insulating layer 41. The wiring layer M is coupled to the electric charge accumulation electrode 25 to be described later or the like, and includes various kinds of wiring lines including a transparent electrically conductive material. The inter-pixel region light-shielding wall 44 includes, for example, a monolayer film including one kind of materials that shields mainly light in the infrared light range, e.g., inorganic insulating materials such as silicon oxide ($SiO_x$), silicon nitride (SiNx), and silicon oxynitride (SiON), or a stacked film including two or more kinds thereof. The inter-pixel region light-shielding wall 44 may be formed integrally with the insulating layer 41. The inter-pixel region light-shielding wall 44 surrounds the optical filter 42 along the XY plane orthogonal to the thickness direction (Z-axis direction) to at least partially overlap the optical filter 42 in the XY plane. As with the inter-pixel region light-shielding wall 16, the inter-pixel region light-shielding wall 44 suppresses oblique incidence of unnecessary light onto the photoelectric conversion regions 12 of adjacent pixels P and prevents color mixture.

The optical filter 42 has a transmission band in the infrared light range where photoelectric conversion is performed in the photoelectric conversion region 12. That is, light having a wavelength in the infrared light range passes through the optical filter 42 more easily than light having a wavelength in a visible light range (e.g., a wavelength of 400 nm to 700 nm both inclusive) as a first wavelength range. Specifically, it is possible to configure the optical filter 42 with use of an organic material, for example, and the optical filter 42 absorbs at least a portion of light having a wavelength in the visible light range while selectively allowing light in the infrared light range to pass therethrough. The optical filter 42 includes, for example, an organic material such as a phthalocyanine derivative.

A SiN layer 45 may be provided on a back surface, that is, a surface opposed to the organic photoelectric converter 20, of the optical filter 42. In addition, a SiN layer 46 may be provided on a front surface, that is, a surface opposed to the photoelectric converter 10, of the optical filter 42. Furthermore, an insulating layer 47 including, for example, SiOx may be provided between the semiconductor substrate 11 and the SiN layer 46.

(Organic Photoelectric Converter 20)

The organic photoelectric converter 20 includes, for example, the readout electrode 26, a semiconductor layer 21, an organic photoelectric conversion layer 22, and an upper electrode 23 that are stacked in order from a position close to the photoelectric converter 10. The organic photoelectric converter 20 further includes an insulating layer 24 and the electric charge accumulation electrode 25, The insulating layer 24 is provided below the semiconductor layer 21, and the electric charge accumulation electrode 25 is provided to be opposed to the semiconductor layer 21 with the insulating layer 24 interposed therebetween. The electric charge accumulation electrode 25 and the readout electrode 26 are apart from each other, and are provided at the same level, for example. The readout electrode 26 is in contact with an upper end of the through electrode 17. In addition, for example, as illustrated in FIG. 3C, the organic photoelectric converter 20 is coupled to a lead wiring line 58 through a contract layer 57 in the peripheral region 100R2. It is to be noted that the upper electrode 23, the organic photoelectric conversion layer 22, and the semiconductor layer 21 may each be provided common to some pixel P1 of the plurality of pixels P1 (FIG. 2A) in the pixel section 100, or may each be provided common to all the plurality of pixels P in the pixel section 100. The same applies to other embodiments, modification examples, and the like to be described after the present embodiment.

It is to be noted that another organic layer may be provided each between the organic photoelectric conversion layer 22 and the semiconductor layer 21 and between the organic photoelectric conversion layer 22 and the upper electrode 23.

The readout electrode 26, the upper electrode 23, and the electric charge accumulation electrode 25 each include an electrically conductive film having light transmissivity, and include, for example, ITO (indium tin oxide). However, in addition to ITO, a tin oxide ($SnO_x$)-based material doped with a dopant, or a zinc oxide-based material obtained by doping zinc oxide (ZnO) with a dopant may be used as constituent materials of the readout electrode 26, the upper electrode 23, and the electric charge accumulation electrode 25. Examples of the zinc oxide-based material include aluminum zinc oxide (AZO) doped with aluminum (Al) as a dopant, gallium zinc oxide (GZO) doped with gallium (Ga), and indium zinc oxide (IZO) doped with indium (In).

In addition, as the constituent materials of the readout electrode 26, the upper electrode 23, and the electric charge accumulation electrode 25, CuI, InSbO$_4$, ZnMgO, CuInO$_2$, MgIN$_2$O$_4$, CdO, ZnSnO$_3$, TiO$_2$, or the like may be used. Furthermore, a spinel oxide, an oxide having a YbFe$_2$O$_4$ structure may be used.

The organic photoelectric conversion layer 22 converts light energy into electrical energy, and is formed including two or more kinds of organic materials functioning as a p-type semiconductor and a n-type semiconductor. The p-type semiconductor relatively functions as an electron donor (a donor), and the n-type semiconductor relatively functions as an electron acceptor (an acceptor). The organic photoelectric conversion layer 22 has a bulk heterojunction structure in a layer. The bulk heterojunction structure is a p/n junction surface that is formed by mixing the p-type semiconductor and the n-type semiconductor, and excitons generated upon absorption of light are dissociated into electrons and holes at the p/n junction surface.

The organic photoelectric conversion layer 22 may further include, in addition to the p-type semiconductor and the n-type semiconductor, three kinds of so-called dye materials that photoelectrically convert light in a predetermined wavelength band while allowing light in another wavelength band to pass therethrough. The p-type semiconductor, the n-type semiconductor, and the dye materials preferably have absorption maximum wavelengths different from each other. This makes it possible to absorb wavelengths in a visible light region in a wide range.

For example, various kinds of organic semiconductor materials described above are mixed, and spin coating technology is used, thereby making it possible to form the organic photoelectric conversion layer 22. In addition, the organic photoelectric conversion layer 22 may be formed with use of a vacuum deposition method, printing technology, or the like, for example.

As a material included in the semiconductor layer 21, it is preferable to use a material having a large band gap value (e.g., a band gap value of 3.0 eV or greater) and having higher mobility than a material included in the organic photoelectric conversion layer 22. Specific materials thereof may include organic semiconductor materials such as oxide semiconductor materials including IGZO and the like, transition metal dichalcogenide, silicon carbide, diamond, graphene, carbon nanotubes, and organic semiconductor materials such as a condensed polycyclic hydrocarbon compound, and a condensed heterocyclic compound.

The electric charge accumulation electrode 25 forms a kind of capacitor together with the insulating layer 24 and the semiconductor layer 21, and accumulates electric charges generated in the organic photoelectric conversion layer 22 in a portion of the semiconductor layer 21, e.g., a region portion, corresponding to the electric charge accumulation electrode 25 with the insulating layer 24 interposed therebetween, of the semiconductor layer 21. In the present embodiment, one electric charge accumulation electrode 25 is provided corresponding to one color filter 52, and one on-chip lens 54. The electric charge accumulation electrode 25 is coupled to the vertical drive circuit 111, for example.

It is possible to form the insulating layer 24 with use of, for example, an inorganic insulating material and an organic insulating material, as with the insulating layer 41.

The organic photoelectric converter 20 detects some or all of the wavelengths in the visible light range, as described above. In addition, it is desirable that the organic photoelectric converter 20 not have sensitivity to light in the infrared light range.

In the organic photoelectric converter 20, light incident from side of the upper electrode 23 is absorbed by the organic photoelectric conversion layer 22. Excitons (electron-hole pairs) thereby generated move to an interface between the electron donor and the electron acceptor included in the organic photoelectric conversion layer 22, and the excitons are dissociated, that is, the excitons are dissociated into electrons and holes. Electric charges generated herein, that is, electrons and holes move to the upper electrode 23 or the semiconductor layer 21 by diffusion resulting from a difference in concentration between carriers and an internal electric field resulting from a potential difference between the upper electrode 23 and the electric charge accumulation electrode 25, and are detected as photocurrent. For example, it is assumed that the readout electrode 26 is at a positive potential and the upper electrode 23 is at a negative potential. In this case, holes generated by photoelectric conversion in the organic photoelectric conversion layer 22 move to the upper electrode 23. Electrons generated by photoelectric conversion in the organic photoelectric conversion layer 22 are drawn to the electric charge accumulation electrode 25, and are accumulated in the portion of the semiconductor layer 21, e.g., the region portion, corresponding to the electric charge accumulation electrode 25 with the insulating layer 24 interposed therebetween, of the semiconductor layer 21.

Electric charges (e.g., electrons) accumulated in the region portion, corresponding to the electric charge accumulation electrode 25 with the insulating layer 24 interposed therebetween, of the semiconductor layer 21 are read out as follows. Specifically, a potential V26 is applied to the readout electrode 26, and a potential V25 is applied to the electric charge accumulation electrode 25. Herein, the potential V26 is higher than the potential V25 (V25<V26). By doing so, the electrons accumulated in the region portion, corresponding to the electric charge accumulation electrode 25, of the semiconductor layer 21 are transferred to the readout electrode 26.

As described above, the semiconductor layer 21 is provided below the organic photoelectric conversion layer 22, and electric charges (e.g., electrons) are accumulated in the region portion, corresponding to the electric charge accumulation electrode 25 with the insulating layer 24 interposed therebetween, of the semiconductor layer 21, thereby achieving the following effects. That is, as compared with a case where electric charges (e.g., electrons) are accumulated in the organic photoelectric conversion layer 22 without providing the semiconductor layer 21, it is possible to prevent recombination of holes and electrons during electric charge accumulation, and increase transfer efficiency of accumulated electric charges (e.g., electrons) to the readout electrode 26, and it is possible to suppress generation of a dark current. A case where electrons are read out is described above as an example; however, holes may be read out. In a case where holes are read out, the potentials described above are described as potentials sensed by holes.

(Readout Circuit of Photoelectric Converter 10)

FIG. 5 is a circuit diagram illustrating an example of a readout circuit of the photoelectric converter 10 included in the pixel P illustrated in FIG. 2A.

The readout circuit of the photoelectric converter 10 includes, for example, the TGs 14A and 14B, an OFG 146, the FDs 15A and 15B, the RSTs 143A and 143B, the AMPs 144A and 144B, and the SELs 145A and 145B.

The TGs 14A and 14B are respectively coupled between the photoelectric conversion region 12 and the FD 15A and between the photoelectric conversion region 12 and the FD 15B. A drive signal is applied to the gate electrodes of the TGs 14A and 14B to turn the TGs 14A and 14B to an active state, which turns transfer gates of the TGs 14A and 14B to an electrically conductive state. As a result, signal electric charges converted in the photoelectric conversion region 12 are transferred to the FDs 15A and 15B respectively through the TGs 14A and 14B.

The OFG 146 is coupled between the photoelectric conversion region 12 and a power supply. A drive signal is applied to a gate electrode of the OFG 146 to turn the OFG 146 to the active state, which turns the OFG 146 to the electrically conductive state. As a result, signal electric charges converted in the photoelectric conversion region 12 are discharged to the power supply through the OFG 146.

The FDs 15A and 15B are respectively coupled between the TG 14A and AMP 144A and between the TG 14B and the AMP 144B. The FDs 15A and 15B respectively perform electric charge-voltage conversion of the signal electric charges transferred from the TGs 14A and 14B into voltage signals, and output the voltage signals to the AMPS 144A and 144B.

The RSTs 143A and 143B are respectively coupled between the FD 15A and the power supply and between the FD 15B and the power supply. A drive signal is applied to gate electrodes of the RSTs 143A and 143B to turn the RSTs 143A and 143B to the active state, which turns reset gates of the RSTs 143A and 143B to the electrically conductive state. As a result, potentials of the FDs 15A and 15B are reset to a power supply level.

The AMPS 144A and 144B respectively include gate electrodes coupled to the FDs 15A and 15B, and include drain electrodes coupled to the power supply. The AMPS 144A and 144B are input sections of readout circuits of voltage signals held by the FDs 15A and 15B, that is, so-called source follower circuits. That is, the AMPS 144A and 144B respectively have source electrodes coupled to the vertical signal line Lsig through the SELs 145A and 145B, thereby configuring source follower circuits with a constant current source coupled to one end of the vertical signal line Lsig.

The SELs 145A and 145B are respectively coupled between the source electrode of the AMP 144A and the vertical signal line Lsig and between the source electrode of the AMP 144B and the vertical signal line Lsig. A drive signal is applied to the respective gate electrodes of the SELs 145A and 145B to turn the SELs 145A and 145B to the active state, which turns the SELs 145A and 145B to the electrically conductive state to turn the pixel P to a selection state. Accordingly, readout signals (pixel signals) outputted from the AMPS 144A and 144B are respectively outputted to the vertical signal line Lsig through the SELs 145A and 145B.

In the solid-state imaging device 1, a light pulse in an infrared range is applied to a subject, and the photoelectric conversion region 12 of the photoelectric converter 10 receives the light pulse reflected from the subject. In the photoelectric conversion region 12, a plurality of electric charges are generated by incidence of the light pulse in the infrared range. The plurality of electric charges generated in the photoelectric conversion region 12 are alternately distributed to the FD 15A and the FD 15B by alternately supplying a drive signal to the pair of TGs 14A and 14B over equal time intervals. A shutter phase of the drive signal to be applied to the TGs 14A and 14B is changed with respect to the light pulse to be applied, which causes the amount of electric charges accumulated in the FD 15A and the amount of electric charges accumulated in the FD 15B to be phase-modulated values. A round trip time of the light pulse is estimated by demodulating these values, thereby determining a distance between the solid-state imaging device 1 and the subject.

(Readout Circuit of Organic Photoelectric Converter 20)

FIG. 6 is a circuit diagram illustrating an example of the readout circuit of the organic photoelectric converter 20 included in the pixel P1 illustrated in FIG. 2A.

The readout circuit of the organic photoelectric converter 20 includes, for example, the FD 131, a RST 132, the AMP 133, and a SEL 134.

The FD 131 is coupled between the readout electrode 26 and the AMP 133. The FD 131 performs electric charge-voltage conversion of signal electric charges transferred from the readout electrode 26 into voltage signals, and outputs the voltage signals to the AMP 133.

The RST 132 is coupled between the FD 131 and the power supply. A drive signal is applied to a gate electrode of the RST 132 to turn the RST 132 to the active state, which turns a reset gate of the RST 132 to the electrically conductive state. As a result, a potential of the FD 131 is reset to the power supply level.

The AMP 133 includes a gate electrode coupled to the FD 131 and a drain electrode coupled to the power supply. A source electrode of the AMP 133 is coupled to the vertical signal line Lsig through the SEL 134.

The SEL 134 is coupled between the source electrode of the AMP 133 and the vertical signal line Lsig. A drive signal is applied to a gate electrode of the SEL 134 to turn the SEL 134 to the active state, which turns the SEL 134 to the electrically conductive state to turn the pixel P to the selection state. Thus, a readout signal (a pixel signal) outputted from the AMP 133 is outputted to the vertical signal line Lsig through the SEL 134.

[Workings and Effects of Solid-State Imaging Device 1]

The solid-state imaging device 1 according to the present embodiment includes the organic photoelectric converter 20, the optical filter 42, and the photoelectric converter 10 that are stacked in order from incident side. The organic photoelectric converter 20 detects light having a wavelength in the visible light range and photoelectrically convert the light. The optical filter 42 has a transmission band in the infrared light range. The photoelectric converter 10 detects light having a wavelength in the infrared light range and photoelectrically converts the light. This makes it possible to simultaneously obtain a visible light image and an infrared light image at the same position in an in-plane direction of the XY plane. The visible light image is configured by a red light signal, a green light signal, and a blue light signal respectively obtained from a red pixel PR, a green pixel PG, and a blue pixel PB, and the infrared light image uses infrared light signals obtained from all the plurality of pixels P. It is therefore possible to achieve high integration in the in-plane direction of the XY plane.

Furthermore, the photoelectric converter 10 includes the pair of TGs 14A and 14B, and the FDs 15A and 15B, which makes it possible to obtain an infrared light image as a distance image including information about a distance to a subject. Therefore, according to the solid-state imaging device 1 according to the present embodiment, it is possible to obtain both a visible light image having high resolution and an infrared light image having depth information.

In addition, in the pixel P1 according to the present embodiment, the inter-pixel region light-shielding wall 44 that surrounds the optical filter 42 is provided. This makes it possible to suppress entering of leaked light from other adjacent pixels P1 or unnecessary light from the surroundings into the photoelectric converter 10 directly or through the optical filter 42. Accordingly, it is possible to reduce noise received by the photoelectric converter 10, and it is possible to expect improvements in S/N ratio, resolution, distance measurement accuracy, and the like as the solid-state imaging device 1.

In the present embodiment, the organic photoelectric converter 20 includes the insulating layer 24 and the electric charge accumulation electrode 25, in addition to a structure in which the readout electrode 26, the semiconductor layer 21, the organic photoelectric conversion layer 22, and the upper electrode 23 are stacked in order. The insulating layer 24 is provided below the semiconductor layer 21, and the electric charge accumulation electrode 25 is provided to be opposed to the semiconductor layer 21 with the insulating layer 24 interposed therebetween. This makes it possible to accumulate electric charges generated by photoelectric conversion in the organic photoelectric conversion layer 22 in the portion of the semiconductor layer 21, e.g., the region portion, corresponding to the electric charge accumulation electrode 25 with the insulating layer 24 interposed therebetween, of the semiconductor layer 21. This makes it possible to achieve removal of electric charges in the semiconductor layer 21, that is, full depletion of the semiconductor layer 21 upon start of exposure, for example. As a result, it is possible to reduce kTC noise, which makes it possible to suppress a decrease in image quality caused by random noise. Furthermore, as compared with a case where electric charges (e.g., electrons) are accumulated in the organic photoelectric conversion layer 22 without providing the semiconductor layer 21, it is possible to prevent recombination of holes and electrons during electric charge accumulation, and increase transfer efficiency of accumulated electric charges (e.g., electrons) to the readout electrode 26, and it is possible to suppress generation of a dark current.

Furthermore, in the pixel P1 according to the present embodiment, a plurality of on-chip lenses 54, a plurality of color filters 53, a plurality of electric charge accumulation electrodes 25 are provided, corresponding to one photoelectric conversion region 12, at positions overlapping each other in the Z-axis direction. Accordingly, as long as at least some of the plurality of color filters 53 are of different colors, it is possible to reduce a difference in infrared light detection sensitivity, as compared with a case where one on-chip lens 54, one color filter 53, one electric charge accumulation electrode 25, and one photoelectric conversion region 12 are provided at positions corresponding to each other in the Z-axis direction. In general, in a case where one on-chip lens 54, one color filter 53, one electric charge accumulation electrode 25, and one photoelectric conversion region 12 are provided at positions corresponding to each other in the Z-axis direction, transmittance of infrared light passing through the color filter 53 differs depending on colors of the color filters 53. Accordingly, intensity of infrared light reaching the photoelectric conversion region 12 differs among, for example, a red pixel, a blue pixel, and a green pixel, which consequently causes variations in infrared light detection sensitivity in each of a plurality of pixels. In that respect, according to the pixel P1 according to the present embodiment, infrared light having passed through each of the plurality of color filters 53 enters the photoelectric conversion region 12. This makes it possible to reduce a difference in infrared light detection sensitivity among the plurality of pixels P1.

It is to be noted that in the present embodiment, the color filters 53 of red, green, and blue are included, and respectively receive red light, green light, and blue light to obtain a color visible light image; however, a monochromatic visible light image may be obtained without providing the color filter 53.

First Modification Example of First Embodiment

FIG. 7 schematically illustrates an example of a vertical cross-sectional configuration along the thickness direction of a pixel P1A according to a first modification example (Modification Example 1-1) of the first embodiment. In the present disclosure, as with the pixel P1A illustrated in FIG. 7, the semiconductor layer 21 may not be provided. In the pixel P1A illustrated in FIG. 7, the organic photoelectric conversion layer 22 is coupled to the readout electrode 26, and the electric charge accumulation electrode 25 is provided to be opposed to the organic photoelectric conversion layer 22 with the insulating layer 24 interposed therebetween. In a case of such a configuration, electric charges generated by photoelectric conversion in the organic photoelectric conversion layer 22 are accumulated in the organic photoelectric conversion layer 22. Even in this case, upon photoelectric conversion in the organic photoelectric conversion layer 22, a kind of capacitor is formed by the organic photoelectric conversion layer 22, the insulating layer 24, and the electric charge accumulation electrode 25. This makes it possible to achieve removal of electric charges in the organic photoelectric conversion layer 22, that is, full depletion of the organic photoelectric conversion layer 22 upon start of exposure, for example. As a result, it is possible to reduce kTC noise, which makes it possible to suppress a decrease in image quality caused by random noise.

Second Modification Example of First Embodiment

FIG. 8 schematically illustrates a configuration example of a horizontal cross-section, which includes the optical filter 42, of a pixel P1B according to a second modification example (Modification Example 1-2) of the first embodiment. FIG. 9A and FIG. 9B each illustrate a configuration example of a vertical cross-section along the Z-axis direction of the pixel P1B illustrated in FIG. 8 in an enlarged manner. Note that FIG. 9A illustrates a cross-section taken along a section line IXA-IXA illustrated in FIG. 8 as viewed from the direction of an arrow, and FIG. 9B illustrates a cross-section taken along a section line IXB-IXB illustrated in FIG. 8 as viewed from the direction of an arrow.

The pixel P1B according to the second modification example of the first embodiment further includes a metal partition wall 48 provided in a gap between adjacent optical filters 42. The metal partition wall 48 is embedded in the inter-pixel region light-shielding wall 44, and surrounds the optical filter 42 along the XY plane orthogonal to the thickness direction (Z-axis direction) to at least partially overlap the optical filters 42 in the XY plane. The pixel P1B has substantially the same configuration as the configuration of the pixel P1, except for further including the metal partition wall 48.

The metal partition wall 48 includes, for example, an electrically conductive material including an elemental metal such as Al (aluminum), W (tungsten), and Cu (copper). Accordingly, as illustrated in FIG. 8 and FIG. 9B, the inter-pixel region light-shielding wall 44 having electrical insulation is provided between the through electrode 17 and the metal partition wall 48.

According to the pixel P1B according to the second modification example, the metal partition wall 38 that surrounds the optical filter 42 is provided. This makes it possible to further suppress entering of leaked light from other adjacent pixels P1B or unnecessary light from the surroundings into the photoelectric converter 10 directly or through the optical filter 42. Accordingly, it is possible to reduce noise received by the photoelectric converter 10, and it is possible to expect improvements in S/N ratio, resolution, distance measurement accuracy, and the like as the solid-state imaging device 1.

Third Modification Example of First Embodiment

FIG. 10A and FIG. 10B schematically illustrates a configuration example of a vertical cross-section, which includes the optical filter 42, of a pixel P1C according to a third modification example (Modification Example 1-3) of the first embodiment. FIG. 10A and FIG. 10B respectively correspond to FIG. 9A and FIG. 9B that illustrate the pixel P1B according to the second modification example described above. However, the pixel P1C according to the third modification example is thinner than the pixel P1B according to the second modification example. Specifically, in the pixel P1B according to the second modification example, the insulating layer 47 covering the back surface 11B that forms a RIG structure of the semiconductor substrate 11 is relatively thick, which causes a top surface of the insulating layer 47 to be flat. In contrast, in the pixel P1C according to the third modification example, the insulating layer 47 covering the back surface 11B is relatively thin. Even in such a pixel P1C according to the third modification example, as with the pixel P1B and the like, it is possible to suppress entering of leaked light from other adjacent pixels P1C or unnecessary light from the surroundings into the photoelectric converter 10 directly or through the optical filter 42. It is to be noted that the coupling electrode portion 17-3 is provided at a position overlapping the optical filter 42 in the in-plane direction of the XY plane. This contributes to thinning as a whole, as compared with the pixel P1 and the like in which the coupling electrode portion 17-3 is provided at a level different from the optical filter 42.

Fourth Modification Example of First Embodiment

FIG. 11A and FIG. 11B schematically illustrate a configuration example of a vertical cross-section, which includes an optical filter 42A, of a pixel P1D according to a fourth modification example (Modification Example 1-4) of the first embodiment. FIG. 11A and FIG. 11B respectively correspond to FIG. 9A and FIG. 9B that illustrate the pixel P1B according to the second modification example described above. However, the pixel P1D according to the fourth modification example adopts, for example, the optical filter 42A in place of the optical filter 42 including an organic material. The optical filter 42A has, for example, a multilayer structure in which a plurality of inorganic layers each including an inorganic material is stacked. Except for this point, the configuration of the pixel P1D is substantially the same as the configuration of the pixel P1B. Specifically, the optical filter 42A has a stacked structure in which first inorganic layers 421 having a relatively high refractive index to visible light and second inorganic layers 422 having a relatively low refractive index to visible light are alternately stacked. The first inorganic layers 421 may include, for example, hydrogenated amorphous silicon (a-Si:H) or the like. The second inorganic layers 422 may include, for example, silicon oxide (SiO) or the like. In an example illustrated in FIG. 11A and FIG. 11B, the optical filter 42A has a five-layer structure in which a first inorganic layer 421A, a second inorganic layer 422A, a first inorganic layer 421B, a second inorganic layer 422B, and a first inorganic layer 421C are stacked in order on the insulating layer 47. However, the present disclosure is not limited thereto.

Such an optical filter 42A allows infrared light to pass therethrough without reflecting the infrared light, while causing multiple reflection of visible light. Accordingly, visible light having passed through the organic photoelectric converter 20 is reflected by the optical filter 42A, and then enters the organic photoelectric converter 20 again. This makes it possible to expect an improvement in photoelectric conversion efficiency of the organic photoelectric converter 20.

In addition, even in the pixel P1D according to the fourth modification example, the inter-pixel region light-shielding wall 44 and the metal partition wall 48 are provided, which makes it possible to suppress entering of leaked light from other adjacent pixels P1D or unnecessary light from the surroundings into the photoelectric converter 10 directly or through the optical filter 42A, as with the pixel P1B.

Fifth Modification Example of First Embodiment

FIG. 12A and FIG. 12B schematically illustrate a configuration example of a vertical cross-section, which includes an optical filter 42B, of a pixel P1E according to a fifth modification example (Modification Example 1-5) of the first embodiment. FIG. 12A and FIG. 12B respectively correspond to FIG. 9A and FIG. 9B that illustrate the pixel P1B according to the second modification example described above. However, the pixel P1E according to the fifth modification example adopts, for example, the optical filter 42B in place of the optical filter 42. The optical filter 42B has a monolayer structure including an inorganic material. Except for this point, the configuration of the pixel P1E is substantially the same as the configuration of the pixel P1B. Specifically, the optical filter 42B includes, for example, hydrogenated amorphous silicon (a-Si:H) or a-Si/Ge:H.

Such an optical filter 42B allows infrared light to pass therethrough without absorbing the infrared light, while absorbing visible light. This makes it possible to detect infrared light in the photoelectric converter 10.

In addition, even in the pixel P1E according to the fifth modification example, the inter-pixel region light-shielding wall 44 and the metal partition wall 48 are provided, which makes it possible to suppress entering of leaked light from other adjacent pixels P1B or unnecessary light from the surroundings into the photoelectric converter 10 directly or through the optical filter 42B, as with the pixel P1B and the like.

Sixth Modification Example of First Embodiment

FIG. 13 schematically illustrates a configuration example of a horizontal cross-section, which includes the coupling electrode portion 17-3, of a pixel P1F according to a sixth modification example (Modification Example 1-6) of the first embodiment. FIG. 14 schematically illustrates a configuration example of a vertical cross-section of the pixel P1E. FIG. 13 and FIG. 14 respectively correspond to FIG. 2C and FIG. 3B that illustrate the pixel P1 according to the first embodiment described above. However, in the pixel P1F according to the sixth modification example, the coupling electrode portion 17-3 is provided to have a large occupation area, as compared with the pixel P1. For example, in the pixel P1, the coupling electrode portion 17-3 is provided to have a dimension smaller than a distance of a gap between adjacent optical filters 42, that is, not to overlap the optical filters 42 in the Z-axis direction. In contrast, in the pixel P1F according to the sixth modification example, the coupling electrode portion 17-3 is provided to extend in the X-axis direction or the Y-axis direction to a region overlapping the optical filters 42 in the Z-axis direction. Except for this point, the configuration of the pixel P1F is substantially the same as the configuration of the pixel P1. In the pixel P1F, the coupling electrode portion 17-3 expands along the XY plane, which makes it possible to confine infrared light incident on the semiconductor substrate 11 inside the semiconductor substrate 11, and enhance photoelectric conversion efficiency of the photoelectric conversion region 12.

2. Second Embodiment

[Cross-Sectional Configuration Example of Pixel P2]

FIG. 15A is an enlarged vertical cross-sectional view of a main part of a pixel P2 that is an imaging element according to a second embodiment of the present technology. FIG. 15B schematically illustrates an example of a horizontal cross-sectional configuration along the stacking surface direction orthogonal to the thickness direction of the pixel P2 at a height position in the Z-axis direction indicated by an arrow XVB in FIG. 15A. It is to be noted that FIG. 15A illustrates a cross-section taken along a section line XVA-XVA illustrated in FIG. 15B as viewed from the direction of an arrow. The pixel P2 is applicable to the pixel section 100 of the first embodiment described above, as with the pixel P1 and the like.

The pixel P2 further includes an effective region light-shielding film 61 and a pillar 62. The pixel P2 has substantially the same configuration as the configuration of the pixel P1 except for further including the effective region light-shielding film 61 and the pillar 62.

The pillar 62 is provided to penetrate through the optical filter 42 in the Z-axis direction. The pillar 62 includes a monolayer film including one kind of materials that shields mainly light in the infrared light range, e.g., inorganic insulating materials such as silicon oxide ($SiO_x$), silicon nitride (SiNx), and silicon oxynitride (SiON), or a stacked film including two or more kinds thereof, as with the constituent material of the inter-pixel region light-shielding wall 44. In a case where the pillar 62 includes silicon oxide ($SiO_x$), for example, TEOS (tetraethoxysilane) may be used as a raw material for generation of the silicon oxide. The pillar 62 is provided, for example, in a gap between the color filters 53 in the XY plane.

The effective region light-shielding film 61 is provided, for example on the SiN layer 46, and is provided at a position different from a position overlapping the pillar 62 in the Z-axis direction. The effective region light-shielding film 61 is provided, for example, at a position overlapping a central position of each color filter 53. It is possible to configure the effective region light-shielding film 61 with use of, for example, a metal material such as W (tungsten). The effective region light-shielding film 61 reflects visible light or absorbs visible light.

[Method of Manufacturing Pixel P2]

Each of FIGS. 16A to 16L is a cross-sectional view of a process of a method of manufacturing the pixel P2 according to the present embodiment. A method of manufacturing the optical filter 42, the effective region light-shielding film 61, and the pillar 62 is mainly described here.

First, as illustrated in FIG. 16A, the insulating layer 47, the coupling electrode portion 17-3, and the SiN layer 46 are formed on the photoelectric converter 10, and thereafter, a metal layer 61Z is formed to cover the SiN layer 46.

Next, as illustrated in FIG. 16B, a resist film R1 is formed to cover the metal layer 61Z.

Next, as illustrated in FIG. 16C, the resist film R1 is patterned by, for example, a photolithography method or the like to form a resist pattern RP1 that selectively covers a portion of the metal layer 61Z. Here, the resist pattern PR1 is formed to cover a position where the pillar 62 is to be formed in a region corresponding to the photoelectric conversion region 12 of the photoelectric converter 10 in the Z-axis direction.

Next, as illustrated in FIG. 16D, the metal layer 61Z is etched with use of, for example, the resist pattern RP1 as a mask to form the effective region light-shielding film 61.

Next, as illustrated in FIG. 16E, the resist pattern RP1 is removed with use of a predetermined chemical solution, and thereafter, as illustrated in FIG. 16F, an insulating layer 44Z is formed. It is possible to form the insulating layer 44Z by, for example, a CVD method using TEOS as a raw material.

Next, as illustrated in FIG. 16G, a resist film R2 is formed to cover the insulating layer 44Z, and thereafter the resist film R2 is patterned as illustrated in FIG. 16H to form a resist pattern RP2 that selectively covers a portion of the insulating layer 44Z.

Next, as illustrated in FIG. 16I, the insulating layer 44Z is etched with use of, for example, the resist pattern RP2 as a mask to form the inter-pixel region light-shielding wall 44 and the pillar 62.

Next, as illustrated in FIG. 16J, the resist pattern RP2 is removed with use of a predetermined chemical solution, and thereafter, as illustrated in FIG. 16K, coating with a predetermined organic material is performed to fill gaps between the inter-pixel region light-shielding wall 44 and the pillar 62 to form an organic material layer 42Z. The organic material layer 42Z becomes, for example, the optical filter 42 later, and is formed with use of an organic material through which light having a wavelength in the infrared light range light passes more easily than light having a wavelength in the visible light range.

Next, as illustrated in FIG. 16L, the organic material layer 42Z is polished with use of, for example, a CMP method to expose upper ends of the inter-pixel region light-shielding wall 44 and the pillar 62. As a result, the optical filter 42 is formed.

Thereafter, the wiring layer M, the insulating layer 41, the organic photoelectric converter 20, the sealing film 51, the low refractive index layer 52, the color filter 53, the on-chip lens 54, the antireflection film 55 and the like are formed to complete the pixel P2.

[Workings and Effects of Pixel P2]

Even in the pixel P2 according to the present embodiment, as with the pixel P1 and the like, it is possible to suppress entering of leaked light from other adjacent pixels P2 or unnecessary light from the surroundings into the photoelectric converter 10 directly or through the optical filter 42.

In addition, in the pixel P2, the pillar 62 is provided to penetrate through the optical filter 42 in the Z-axis direction. This makes it possible to reduce variations in the thickness of the optical filter 42 in the XY plane in the pixel P2, for example, in a case where the optical filter 42 is formed by a coating method, as compared with, for example, the pixel P1 and the like that do not include the pillar 62. Accordingly, variations in transmittance of light in an infrared range passing through the optical filter 42 in the in-plane direction of the XY plane is reduced, and it is possible to expect desired photoelectric conversion performance. For example, in a case where the pixel P2 is used for the solid-state imaging device 1, occurrence of color mixture is suppressed, and it is possible to expect further improvements in SN ratio, resolution, distance measurement accuracy, and the like.

In addition, in the pixel P2, the effective region light-shielding film 61 is provided, for example, at a position overlapping the central portion of each color filter 53. Accordingly, in a case where the effective region light-shielding film 61 includes, for example, a metal material such as tungsten that reflects visible light, it is possible to reflect visible light and return the visible light to the organic photoelectric converter 20 again. This improves, photoelectric conversion efficiency of the organic photoelectric converter 20.

First Modification Example of Second Embodiment

FIG. 17A schematically illustrates an example of a vertical cross-sectional configuration along the thickness direction of a pixel P2A according to a first modification example (Modification Example 2-1) of the second embodiment. FIG. 17B schematically illustrates an example of a horizontal cross-sectional configuration along the stacking surface direction orthogonal to the thickness direction of the pixel P2A at a height position in the Z-axis direction indicated by an arrow XVIIB in FIG. 17A. It is to be noted that FIG. 17A illustrates a cross-section taken along a section line XVIIA-XVIIA illustrated in FIG. 17B as viewed from the direction of an arrow.

In the pixel P2A according to the first modification example, the effective region light-shielding film 61 is provided, for example, at a position overlapping the pillar 62. This makes it possible to reduce intensity of visible light passing through the pillar 62, and, for example, in a case where the pixel P2A is used for the solid-state imaging device 1, occurrence of color mixture is suppressed, and it is possible to expect further improvements in S/N ratio, resolution, distance measurement accuracy, and the like.

Second Modification Example of Second Embodiment

FIG. 18 schematically illustrates an example of a vertical cross-sectional configuration along the thickness direction of a pixel P2B according to a second modification example (Modification Example 2-2) of the second embodiment. In the pixel P2 according to the second embodiment, the effective region light-shielding film 61 is provided in proximity to a bottom surface of the optical filter 42; however, as with the pixel P2B according to the present modification example, the effective region light-shielding film 61 may be provided in proximity to a top surface of the optical filter 42.

3. Third Embodiment

[Cross-Sectional Configuration Example of Pixel P3]

FIG. 19 is an enlarged vertical cross-sectional view of a main part of a pixel P3 that is an imaging element according to a third embodiment of the present technology. The pixel P3 further includes a transition metal chalcogenide (TMD) layer 49 sandwiched between the photoelectric converter 10 and the organic photoelectric converter 20 in the Z-axis direction. The TMD layer 49 includes a transition metal chalcogenide material (Transition Metal Dichalcogenide; hereinafter referred to as TMD). The TMD layer 49 may have, for example, a thickness of 1 nm or more. Except for further including the TMD layer 49, the pixel P3 according to the present embodiment has substantially the same configuration as the configuration of the pixel P1B according to the first embodiment described above.

TMD has an extremely high extinction coefficient for visible light. Accordingly, providing the TMD layer 49 makes it possible to reduce the thickness of the optical filter 42, as compared with a case where the TMD layer 49 is not provided. Thinning of the optical filter 42 makes it possible to suppress attenuation of infrared light that passes through the optical filter 42, and correct a malfunction caused by oblique incidence of infrared light. In addition, thinning of the optical filter 42 makes it possible to reduce the entire thickness of the pixel P3.

It is to be noted that the pixel P3 according to the present embodiment has a configuration in which the TMD layer 49 is further added to the configuration of the pixel P1B according to the first embodiment described above; however, the present disclosure is not limited thereto. For example, a configuration may be adopted in which the TMD layer 49 is further added to the configuration of any of the pixels P1, P1A, and P1C to P1F according to the first embodiment described above. In addition, the pixel P3 includes a stacked structure of the TMD layer 49 and the optical filter 42; however, only the TMD layer 49 of the TMD layer 49 and the optical filter 42 may be provided. In addition, the material included in the optical filter 42 is not limited to the organic material, and the optical filter 42 may include an inorganic material.

4. Fourth Embodiment

[Cross-Sectional Configuration Example of Pixel P4]

FIG. 20 is an enlarged vertical cross-sectional view of a main part of a pixel P4 that is an imaging element according to a fourth embodiment of the present disclosure. In the pixel P4, the metal partition wall 48 includes a metal embedding layer 48-1 and a liner layer 48-2 that is a base of the metal embedding layer 48-1. In addition, in the pixel P4, the inter-pixel region light-shielding wall 16 includes a metal embedding layer 16-1 and a liner layer 16-2 that is a base of the metal embedding layer 16-1. Except for these points, the configuration of the pixel P4 according to the present embodiment is substantially the same as the configuration of the pixel P1B according to the first embodiment described above.

The metal embedding layer 48-1 and the metal embedding layer 16-1 each include, for example, an electrically conductive material including an elemental metal such as Al (aluminum), W (tungsten), and Cu (copper). The constituent material of the metal embedding layer 48-1 and the constituent material of the metal embedding layer 16-1 may be of the same kind or different kinds.

The liner layer 48-2 and the liner layer 16-2 each include, for example, Co (cobalt). Examples of each of the constituent materials of the liner layer 48-2 and the liner layer 16-2 may include metals such as Ru (ruthenium), Nb (niobium), W (tungsten), Ti (titanium), CoAl, RuAl, NbAl, WAl, and TiAl, and nitrides of these metals, in addition to Co (cobalt). The constituent material of the liner layer 48-2 and the constituent material of the liner layer 16-2 may be of the same kind or different kinds. In addition, the insulating inter-pixel region light-shielding wall 44 including SiOx or the like is interposed between the liner layer 48-2 and the optical layer 42. An insulating layer 16Z including SiOx or the like is interposed between the liner layer 16-2 and the semiconductor substrate 11.

As a method of forming each of the metal embedding layer 48-1, the metal embedding layer 16-1, the liner layer 48-2, and the liner layer 16-2, a CVD method, an ALD method, a sputtering method, or the like may be used.

As described above, in the pixel P4, the metal partition wall 48 includes the metal embedding layer 48-1 and the liner layer 48-2 that is the base of the metal embedding layer 48-1, which makes it possible to use aluminum as the metal embedding layer 48-1. That is, it is possible to form the metal embedding layer 48-1 including aluminum or the like on the liner layer 48-2, which makes it possible to provide an aluminum layer having favorable film quantity as the metal embedding layer 48-1. This makes it possible to expect an improvement in Qe characteristics.

First Modification Example of Fourth Embodiment

FIG. 21 schematically illustrates an example of a vertical cross-sectional configuration of a portion of a pixel P4A according to a first modification example (Modification Example 4-1) of the fourth embodiment. In the present modification example, the metal partition wall 48 further includes, for example, a liner base layer 48-3 including TiAl as a base of the liner layer 48-2. The liner base layer 48-3 is further provided in such a manner; therefore, film quality of the liner layer 48-2 and film quality of the metal embedding layer 48-1 are further homogenizied, and it is possible to expect a further improvement in Qe characteristics. As the constituent material of the liner base layer 48-3, it is possible to use Ti, TiN, Ta, TaN, W, WN, or the like, other than TiAl.

5. Fifth Embodiment

[Cross-Sectional Configuration Example of Pixel P5]

FIG. 22 is an enlarged vertical cross-sectional view of a main part of a pixel P5 that is an imaging element according to a fifth embodiment of the present disclosure. The pixel P5 further includes a hydrogen sealing film 63 sandwiched between the organic photoelectric converter 20 and the optical filter 42 in the Z-axis direction. Except for this point, the configuration of the pixel P5 according to the present embodiment is substantially the same as the configuration of the pixel P1 according to the first embodiment described above.

The hydrogen sealing film 63 includes, for example, an aluminum oxide ($AlO_x$) film formed by an ALD (Atomic Layer Deposition) method, that is an ALD-AlOx film, and has a high hydrogen sealing property. The hydrogen sealing film 63 covers, for example, a front surface 42S of the optical filter 42 with the SiN layer 45 interposed therebetween.

As described above, in the pixel P5 according to the present embodiment, the hydrogen sealing film 63 is further provided between the organic photoelectric converter 20 and the optical filter 42 in the Z-axis direction, which makes it possible to further reduce, for example, the amount of hydrogen that is released from the optical filter 42 and enters into the organic photoelectric converter 20. This suppresses deterioration in performance of the organic photoelectric converter 20. It is to be noted that the $AlO_x$ film included in the hydrogen sealing film 63 may be an $AlO_x$ film formed by any method other than the ALD method. In addition, the hydrogen sealing film 63 may include a metal oxide other than $AlO_x$ as a main constituent material. Examples of such a metal oxide include $ZrO_2$ (zirconium oxide), $HfO_2$ (hafnium oxide), $TiO_2$ (titanium oxide), and the like.

First Modification Example of Fifth Embodiment

FIG. 23 schematically illustrates an example of a vertical cross-sectional configuration of a pixel P5A according to a first modification example (Modification Example 5-1) of the fifth embodiment. In the present modification example, the hydrogen sealing film 63 is provided to cover not only the front surface 42S of the optical filter 42 but also a side surface 42T of the optical filter 42. Except for this point, the configuration of the pixel P5A is substantially the same as the configuration of the pixel P5.

In the pixel P5A according to Modification Example 5-1, a region from the front surface 42S to the side surface 42T of the optical filter 42 is conformally coated with the hydrogen sealing film 63, which makes it possible to further reduce hydrogen that is released from the optical filter 42 and enters into the organic photoelectric converter 20, as compared with the pixel P5 according to the fifth embodiment. This makes it possible to further suppress deterioration in performance of the organic photoelectric converter 20.

It is to be noted that the pixel P5 and the like according to the present embodiment has a configuration in which the hydrogen sealing film 63 is further added to the configuration of the pixel P1B according to the first embodiment described above; however, the present disclosure is not limited thereto. For example, the pixel P5 may have a configuration in which the hydrogen sealing film 63 is further added to the configuration of any of the pixels P1, MA, and P1C to P1F according to the first embodiment described above.

6. Sixth Embodiment

[Cross-Sectional Configuration Example of Pixel P6]

FIG. 24 is an enlarged vertical cross-sectional view of a main part of a pixel P6 that is an imaging element according to a sixth embodiment of the present disclosure. The pixel P6 further includes an optical member 64. The optical member 64 is sandwiched between the organic photoelectric converter 20 and the photoelectric converter 10 in the Z-axis direction, and has a concave surface 64U opposed to the organic photoelectric converter 20 to reflect visible light. The concave surface 64U is a reflection surface that reflects visible light toward the organic photoelectric converter 20, and a plurality of concave surfaces 64U are provided corresponding one by one to the plurality of color filters 53 arranged in an XY plane direction, for example. Except for this point, the configuration of the pixel P6 according to the present embodiment is substantially the same as the configuration of the pixel P1 according to the first embodiment described above.

As described above, the pixel P6 includes the optical member 64, which makes it possible to reflect visible light having passed through the organic photoelectric converter 20 to return the visible light to the organic photoelectric converter 20 again. This makes it possible to expect an improvement in photoelectric conversion efficiency of the organic photoelectric converter 20. Specifically, the plurality of concave surfaces 64U is provided corresponding one by one to the plurality of color filter 53, which makes it possible to cause visible light having passed through each color filter 53 and the organic photoelectric converter 20 in order to enter a region portion corresponding to each color filter 53 of the organic photoelectric converter 20 again. This makes it possible to achieve an improvement in photoelectric conversion efficiency of the organic photoelectric converter 20 while preventing color mixture and flare.

First Modification Example of Sixth Embodiment

FIG. 25 schematically illustrates an example of a vertical cross-sectional configuration of a pixel P6A according to a first modification example (Modification Example 6-1) of the sixth embodiment. In the pixel P6A according to the present modification example, the optical filter 42 also serves an optical member. That is, a top surface opposed to the organic photoelectric converter 20 of the optical filter 42 has a plurality of concave surfaces 42SU, and visible light having passed through the organic photoelectric converter 20 is reflected toward the organic photoelectric converter 20 by the plurality of concave surfaces 42SU. Even in the pixel P6A according to the present modification example, it is possible to achieve an improvement in photoelectric conversion efficiency of the organic photoelectric converter 20 while preventing color mixture and flare.

Second Modification Example of Sixth Embodiment

FIG. 26 schematically illustrates an example of a vertical cross-sectional configuration of a pixel P6B according to a second 2odification example (Modification Example 6-2) of the sixth embodiment. In the pixel P6B according to the present modification example, an optical filter 65 standing in a boundary portion between the color filters 53 is provided in place of the optical member 64 having the concave surfaces 64U. Visible light having passed through each color filter 53 is reflected by a side surface of the optical filter 65 and enters a region of the organic photoelectric converter 20 at a position corresponding to the same color filter 53 again. Even in the pixel P6B according to the present modification example, it is possible to achieve an improvement in photoelectric conversion efficiency of the organic photoelectric converter 20 while preventing color mixture and flare.

7. Seventh Embodiment

[Cross-Sectional Configuration Example of Pixel P7]

FIG. 27 is an enlarged vertical cross-sectional view of a main part of a pixel P7 that is an imaging element according to a seventh embodiment of the present disclosure. The pixel P7 further includes a first antireflection film 66A and a second antireflection film 66B. Except for this point, the configuration of the pixel P7 according to the present embodiment is substantially the same as the configuration of the pixel P1 according to the first embodiment described above.

In the pixel P7, the optical filter 42 has a first front surface 42S1 opposed to the organic photoelectric converter 20 and a second front surface 42S2 opposed to the photoelectric converter 10. The first antireflection film 66A covers the first front surface 42S1, and the second antireflection film 66B covers the second front surface 42S2.

The first antireflection film 66A and the second antireflection film 66B each include, for example, a material having a refractive index nC that is smaller than a refractive index nA of the constituent material of the optical filter 42 and larger than a refractive index nB of the constituent materials of the insulating layers 41 and 47. Specifically, the first antireflection film 66A and the second antireflection film 66B each include a monolayer structure including $Ta_2O_5$ (a refractive index of 2.1) or $TiO_2$ (a refractive index of 2.5). It is to be noted that the constituent material of the first antireflection film 66A and the constituent material of the second antireflection film 66B may be the same as or different from each other. In addition, the first antireflection film 66A and the second antireflection film 66B each include a stacked film of a $TiO_2$ layer (a refractive index of 2.5) and a SiN layer (a refractive index of 1.9).

As described above, the pixel P7 includes the first antireflection film 66A, which makes it possible to suppress reflection of infrared light incident on the optical filter 42. Furthermore, the pixel P7 includes the second antireflection film 66B, which makes it possible to suppress reflection of infrared light having passed through the optical filter 42. Thus, reflection of infrared light is suppressed in a case where infrared light is incident on the optical filter 42 and in a case where infrared light is outputted from the optical filter 42, which makes it possible to increase the light amount of infrared light incident on the photoelectric converter 10, and expect an improvement in photoelectric conversion efficiency of the photoelectric converter 10.

First Modification Example of Seventh Embodiment

FIG. 28 schematically illustrates an example of a vertical cross-sectional configuration of a pixel P7A according to a first modification example (Modification Example 7-1) of the seventh embodiment. In the pixel P7A according to the present modification example, the first front surface 42S1 of the optical filter 42 has a RIG structure. The RIG structure on the first front surface 42S1 is a recessed and projected structure that is repeated, for example, in a period of less than 100 nm that is smaller than a period of a RIG structure formed on the back surface 11B of the semiconductor substrate 11. It is to be noted that the second front surface 42S2 of the optical filter 42 may be also provided with a similar RIG structure, that is, a recessed and projected structure that is repeated, for example, in a period of less than 100 nm.

Second Modification Example of Seventh Embodiment

FIG. 29 schematically illustrates an example of a vertical cross-sectional configuration of a pixel P7B according to a second modification example (Modification Example 7-2) of the seventh embodiment. In the pixel P7B according to the present modification example, the first front surface 42S1 and the second front surface 42S2 of the optical filter 42 each have, for example, a RIG structure that is a recessed and projected structure repeated in a period substantially equal to that of the RIG structure formed on the back surface 11B of the semiconductor substrate 11.

It is to be noted that the pixel P7 and the like according to the present embodiment has a configuration in which the first antireflection film 66A and the second antireflection film 66B are further added to the configuration of the pixel P1 according to the first embodiment described above; however, the present disclosure is not limited thereto. For example, the pixel P7 may have a configuration in which the first antireflection film 66A and the second antireflection film 66B are further added to the configuration of any of the pixels P1A to P1F according to the first embodiment described above. In addition, only one of the first antireflection film 66A and the second antireflection film 66B may be provided.

8. Eighth Embodiment

[Cross-Sectional Configuration Example of Pixel P8]

FIG. 30 is an enlarged vertical cross-sectional view of a main part of a pixel P8 that is an imaging element according to an eighth embodiment of the present disclosure. In the pixel P8, the first front surface 42S1 of the optical filter 42 is a curved surface projecting toward the organic photoelectric converter 20. Except for this pint, the configuration of the pixel P8 according to the present embodiment is substantially the same as the configuration of the pixel P1B according to the second modification example of the first embodiment described above.

As described above, in the pixel P8, the first front surface 42S1 of the optical filter 42 is a curved surface projecting toward the organic photoelectric converter 20; therefore, the optical filter 42 has positive refractive power. Accordingly, infrared light incident on the optical filter 42 is focused by the optical filter 42 and is outputted from the second front surface 42S2. This makes it possible to reduce an infrared light component to enter a metal material such as the through electrode 17 and the metal partition wall 48. As a result, it is possible to prevent infrared light from being absorbed by the through electrode 17, the metal partition wall 48, and the like, and it is possible to expect an improvement in Qe characteristics.

First Modification Example of Eighth Embodiment

FIG. 31 schematically illustrates an example of a vertical cross-sectional configuration of a pixel P8A according to a first modification example (Modification Example 8-1) of the eighth embodiment. In the pixel P8A according to the modification example, the first front surface 42S1 of the optical filter 42 has a curved surface recessed toward the photoelectric converter 10. Except for this point, the configuration of the pixel P8 according to the present embodiment is substantially the same as the configuration of the pixel P1B according to the second modification example of the first embodiment described above.

As described above, in the pixel PBA, the first front surface 42S1 of the optical filter 42 is a curved surface recessed toward the photoelectric converter 10; therefore, the optical filter 42 has negative refractive power. Accordingly, infrared light incident on the optical filter 42 is scattered by the optical filter 42, which increases an optical path length of infrared light traveling inside the photoelectric converter 10. This makes it possible to expect an improvement in Qe characteristics.

9. Ninth Embodiment

[Cross-Sectional Configuration Example of Pixel P9]

FIG. 32 is an enlarged vertical cross-sectional view of a main part of a pixel P9 that is an imaging element according to a ninth embodiment of the present disclosure.

In general, in a case where an optical filter allowing infrared light to pass therethrough while blocking visible light includes an organic material, the thickness of the optical filter is, for example, 1000 nm or more. However, as the thickness of the optical filter increases, it is possible to decrease transmittance of visible light, but transmittance of infrared light is also decreased. In addition, it is possible to form an optical filter that allows infrared light to pass therethrough while reflecting visible light with a multilayer structure in which high refractive index layers including an inorganic high refractive index material such as amorphous silicon (a-Si) and low refractive index layers including an inorganic low refractive index material such as silicon dioxide ($SiO_2$) are alternately stacked. However, as the number of the high refractive index layers and the number of low refractive index layers increase, a possibility that a foreign matter is intruded between the high refractive index layer and the low refractive index layer is increased, and in a case where the foreign matter is intruded, there are concerns about occurrence of a blank defect in which a direction where incident light is reflected is changed.

Accordingly, in the pixel P9 according to the present embodiment, as illustrated in FIG. 32, an optical filter 70 is adopted having a configuration in which an organic material portion 71 including an organic material and an inorganic material portion 72 including an inorganic material are stacked. Except for adopting the optical filter 70 in place of the optical filter 42, the configuration of the pixel P9 according to the present embodiment is substantially the same as the configuration of the pixel P1 according to the first embodiment described above.

The organic material portion 71 includes, for example, an organic material similarly to that of the optical filter 42 of the pixel P1. The inorganic material portion 72 includes, for example, on the organic material portion 71, a stacked structure in which first inorganic layers 721 having a relatively high refractive index to visible light and second inorganic layers 722 having a relatively low refractive index to visible light are alternately stacked. The first inorganic layer 721 may include, for example, hydrogenated amorphous silicon (a-Si:H), or the like. The second inorganic layer 722 may include, for example, silicon oxide (SiO) or the like. It is to be noted that FIG. 32 exemplifies a case where the inorganic material portion 72 includes a four-layer structure in which two first inorganic layers 721 and two second inorganic layer 722 are alternately stacked. However, the present disclosure is not limited thereto.

[Method of Manufacturing Pixel P9]

Each of FIGS. 33A to 33G is a cross-sectional view of a process of a method of manufacturing the pixel P9 according to the present embodiment. A method of manufacturing the optical filter 70 is mainly described here.

First, as illustrated in FIG. 33A, the insulating layer 47 in which the coupling electrode portion 17-3 and the like are embedded, the SiN layer 46, and the insulating layer 44Z are formed on the photoelectric converter 10. The insulating layer 44Z includes, for example, SiO, and it is possible to form the insulating layer 44Z by, for example, a CVD method using TEOS as a raw material.

Next, as illustrated in FIG. 33B, the insulating layer 44Z is selectively etched with use of, for example, a photolithography method to form the inter-pixel region light-shielding wall 44 and a recessed section 44U.

Next, as illustrated in FIG. 33C, a predetermined organic material is applied by a coating method to fill the recessed section 44U, thereby forming an organic material layer 71Z.

Next, as illustrated in FIG. 33D, the organic material layer 71Z is polished with use of, for example, a CMP method to expose an upper end of the inter-pixel region light-shielding wall 44. As a result, the organic material portion 71 is formed.

Next, as illustrated in FIG. 33E, the first inorganic layers 721 and the second inorganic layers 722 are alternately stacked with use of, for example, a CVD method to form the inorganic material portion 72 on the organic material portion 71. It is to be noted that the inorganic material portion 72 may be provided to cover the entire effective region 100R1, that is, provided common to a plurality of pixels P9.

Next, as illustrated in FIG. 33F, a trench 17U is formed by selectively digging portions of the inorganic material portion 72 and the inter-pixel region light-shielding wall 44 until reaching the coupling electrode portion 17-3.

Thereafter, as illustrated in FIG. 33G, a predetermined electrically conductive material is formed to fill the trench 17U, thereby forming the first through electrode portion 17-1.

Thereafter, the wiring layer M, the insulating layer 41, the organic photoelectric converter 20, the sealing film 51, the low refractive index layer 52, the color filter 53, the on-chip lens 54, the antireflection film 55, and the like are formed to complete the pixel P9.

[Workings and Effects of Pixel P9]

As described above, the pixel P9 adopts the optical filter 70 including a structure in which the organic material portion 71 and the inorganic material portion 72 are stacked in the Z-axis direction. Accordingly, even in a case where thinning is achieved, it is possible to reduce transmittance of visible light to the same level as in the pixel P1 that adopts the optical filter 42 including an organic material, for example. Furthermore, thinning makes it possible to improve transmittance of infrared light. In addition, even in a case where the number of stacked layers is reduced, it is possible to maintain reflectivity of visible light at the same level (that is, it is possible to reduce transmittance of visible light to the same level) as in the pixel P1D that adopts the optical filter 42A including a multilayer structure of the inorganic material. Furthermore, reduction in the number of layers makes it possible to improve transmittance of infrared light while preventing a blank defect caused by intrusion of a foreign matter.

10. Tenth Embodiment

[Cross-Sectional Configuration Example of Pixel P10]

FIG. 34 is an enlarged vertical cross-sectional view of a main part of a pixel P10 that is an imaging element according to a tenth embodiment of the present disclosure. The pixel P10 includes an optical filter 80 including a plurality of optical filter layers 81 to 86 stacked in the Z-axis direction, as illustrated in FIG. 34. Light having a wavelength in the infrared light range passes through the optical filter 80 more easily than light having a wavelength in the visible light range. A transparent wiring line TW included in the wiring layer M is embedded in the optical filter 80. The transparent wiring line TW may be embedded in each of the plurality of optical filter layers 81 to 86. It is to be noted that it is sufficient if, in the XY plane direction, for example, a position where the transparent wiring line TW1 penetrating through the optical filter layer 81 in the Z-axis direction and the transparent wiring line TW2 embedded in the optical filter layers 82 to 84 are coupled is different from a position where the transparent wiring line TW2 and the transparent wiring line TW3 embedded in the optical filter layers 85 to 86 are coupled. In addition, the optical filter 80 includes the metal partition wall 48 as a inter-pixel region light-shielding wall. It is to be noted that FIG. 34 exemplifies six optical filter layers 81 to 86; however, the number of optical filter layers included in the optical filter 80 is freely settable.

In addition, each of the plurality of optical filter layers 81 to 86 may be an organic optical filter layer including an organic material, or an inorganic optical filter layer including an inorganic material. In a case where the optical filter layers 81 to 86 are inorganic optical filter layers, each of the optical filter layers 81 to 86 may be a multilayer film in which high refractive index films having a relatively high refractive index and low refractive index films having a relatively low refractive index are alternately stacked. In addition, in the optical filter 80, an organic optical filter layer including an organic material and an inorganic optical filter layer including an inorganic material may be mixed. For example, the optical filter layers 81, 83, and 85 may be inorganic optical filter layers, and the optical filter layers 82, 84, and 86 may be organic optical filter layers.

[Workings and Effects of Pixel P10]

As described above, in the pixel P10, the transparent wiring line TW included in the wiring layer M is embedded in the optical filter 80. Accordingly, as compared with the pixel P1 and the like according to the first embodiment in which the wiring layer M and the optical filter 42 are provided at different levels, it is possible to reduce a distance from the OCL 54 to the photoelectric conversion region 12 in the Z-axis direction, that is, the thickness. Accordingly, in the pixel P10, it is possible to reduce a decrease in resolution in pixels due to oblique incidence characteristics, that is, obliquely incident light. Furthermore, thinning facilitates microfabrication of the inter-pixel region light-shielding wall 44.

11. Eleventh Embodiment

FIG. 35A is a schematic view of an example of an entire configuration of a photodetection system 201 according to an eleventh embodiment of the present disclosure. FIG. 35B is a schematic view of an example of a circuit configuration of the photodetection system 201. The photodetection system 201 includes a light-emitting device 210 as a light source section that emits infrared light L2, and a photodetector 220 as a light-receiving section including a photoelectric conversion element. As the photodetector 220, it is possible to use the solid-state imaging device 1 described above. The photodetection system 201 may further include a system controller 230, a light source driving section 240, a sensor controller 250, a light source-side optical system 260, and a camera-side optical system 270.

The photodetector 220 is able to detect light L1 and light L2. The light L1 is ambient light from outside reflected by a subject (a measurement object) 200 (FIG. 35A). The light L2 is light emitted from the light-emitting device 210 and then reflected by the subject 200. The light L1 is, for example, visible light, and the light L2 is, for example, infrared light. The light L1 is detectable by an organic photoelectric converter in the photodetector 220, and the light L2 is detectable by a photoelectric converter in the photodetector 220. It is possible to obtain image information of the subject 200 from the light L1 and obtain distance information between the subject 200 and the photodetection system 201 from the light L2. It is possible to mount the photodetection system 201 on, for example, an electronic apparatus such as a smartphone and a mobile body such as a car. It is possible to configure the light-emitting device 210 with, for example, a semiconductor laser, a surface-emitting semiconductor laser, or a vertical cavity surface emitting laser (VCSEL). As a method of detecting the light L2 emitted from the light-emitting device 210 by the photodetector 220, for example, it is possible to adopt an iTOF method; however, the method is not limited thereto. In the iTOF method, the photoelectric converter is able to measure a distance to the subject 200 by time of flight (Time-of- Flight; TOF), for example. As a method of detecting the light L2 emitted from the light-emitting device 210 by the photodetector 220, it is possible to adopt, for example, a structured light method or a stereovision method. For example, in the structured light method, light having a predetermined pattern is projected on the subject 200, and distortion of the pattern is analyzed, thereby making it possible to measure the distance between the photodetection system 201 and the subject 200. In addition, in the stereovision method, for example, two or more cameras are used to obtain two or more images of the subject 200 viewed from two or more different viewpoints, thereby making it possible to measure the distance between the photodetection system 201 and the subject 200. It is to be noted that it is possible to synchronously control the light-emitting device 210 and the photodetector 220 by the system controller 230.

12. Application Example to Electronic Apparatus

FIG. 36 is a block diagram illustrating a configuration example of an electronic apparatus 2000 to which the present technology is applied. The electronic apparatus 2000 has a function as a camera, for example.

The electronic apparatus 2000 includes an optical section 2001 including a lens group and the like, a photodetector 2002 to which the solid-state imaging device 1 or the like described above (hereinafter referred to as the solid-state imaging device 1 or the like) is applied, and a DSP (Digital Signal Processor) circuit 2003 that is a camera signal processing circuit. In addition, the electronic apparatus 2000 further includes a frame memory 2004, a display section 2005, a recording section 2006, an operation section 2007, and a power supply section 2008. The DSP circuit 2003, the frame memory 2004, the display section 2005, the recording section 2006, the operation section 2007, and the power supply section 2008 are coupled to one another through a bus line 2009.

The optical section 2001 captures incident light (image light) from a subject and forms an image of the incident light on an imaging plane of the photodetector 2002. The photodetector 2002 converts the light amount of the incident light of which the image is formed on the imaging plane by the optical section 2001 into an electric signal on a pixel-by-pixel basis, and outputs the electric signal as a pixel signal.

The display section 2005 includes, for example, a panel type display device such as a liquid crystal panel and an organic EL panel, and displays a moving image or a still image captured by the photodetector 2002. The recording section 2006 records the moving image or the still image captured by the photodetector 2002 on a recording medium such as a hard disk or a semiconductor memory.

The operation section 2007 is operated by a user to issue operation instructions for various functions of the electronic apparatus 2000. The power supply section 2008 supplies the DSP circuit 2003, the frame memory 2004, the display section 2005, the recording section 2006, and the operation section 2007 with various types of power as power for operating these supply targets as appropriate.

As described above, use of the solid-state imaging device 1 or the like described above as the photodetector 2002 makes it possible to expect obtainment of a favorable image.

13. Practical Application Example to In-vivo Information Acquisition System

The technology (present technology) according to the present disclosure is applicable to various products. For example, the technology according to the present disclosure may be applied to an endoscopic surgery system.

FIG. 37 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 37, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure may be applied has been described above. The technology according to the present disclosure is applicable to, for example, the image pickup unit 10112 among the configurations described above. This makes it possible to achieve high image detection accuracy in spite of a small size.

14. Practical Application Example to Endoscopic Surgery System

The technology (present technology) according to the present disclosure is applicable to various products. For example, the technology according to the present disclosure may be applied to an endoscopic surgery system.

FIG. 38 is a view depicting an example of a schematic configuration of an endoscopic surgery system to which the technology according to an embodiment of the present disclosure (present technology) can be applied.

In FIG. 38, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 39 is a block diagram depicting an example of a functional configuration of the camera head 11102 and the CCU 11201 depicted in FIG. 38.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure may be applied has been described above. The technology according to the present disclosure is applicable to, for example, the image pickup unit 11402 of the camera head 11102 among the configurations described above. Applying the technology according to the present disclosure to the image pickup unit 11402 makes it possible to obtain a clearer image of the surgical region, thereby improving viewability of the surgical region for a surgeon.

It is to be noted that the endoscopic surgery system has been described here as an example, but the technology according to the present disclosure may be additionally applied to, for example, a microscopic surgery system and the like.

15. Practical Application Example to Mobile Body

The technology (present technology) according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, and a robot.

FIG. 40 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 40, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (FF) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 40, an audio speaker 12061, a display section 12062, and an instrument panel 12063 are illustrated as the output device. The display section 12062 may, for example, include at least one of an on-board display and a head-up display.

FIG. 41 is a diagram depicting an example of the installation position of the imaging section 12031.

In FIG. 41, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 41 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

One example of the vehicle control system to which the technology according to the present disclosure may be applied has been described above. The technology according to the present disclosure is applicable to the imaging section 12031 among the configurations described above. Applying the technology according to the present disclosure to the imaging section 12031 makes it possible to obtain a shot image that is easier to see. This makes it possible to decrease the fatigue of the driver.

16. Other Modification Examples

The present disclosure has been described above with reference to some embodiments and the modification examples, as well as application examples thereof or practical application examples thereof (hereinafter referred to as "embodiments and the like"), but the present disclosure are not limited to the embodiments and the like described above, and may be modified in a variety of ways. For example, the present disclosure is not limited to a back-illuminated image sensor, and is also applicable to a front-illuminated image sensor.

In addition, an imaging device of the present disclosure may have a form of a module in which an imaging section and a signal processor or an optical system are integrally packaged.

Furthermore, in the embodiments and the like described above, the solid-state imaging device in which the light amount of incident light of which an image is formed on an imaging plane through an optical lens system is converted into an electric signal on a pixel-by-pixel basis and the electric signal is outputted as a pixel signal, and the imaging element mounted to the solid-state imaging device have been described as examples; however, a photoelectric conversion element of the present disclosure is not limited to such an imaging element. For example, it is sufficient if the photoelectric conversion element detects and receives light from an subject, and generates electric charges corresponding to the amount of received light by photoelectric conversion and accumulates the electric charges. The signal to be outputted may be a signal of image information or a signal of distance measurement information.

In addition, in the embodiments and the like described above, a case where the photoelectric converter 10 as a second photoelectric converter is an iTOF sensor is described as an example; however, the present disclosure is not limited thereto. That is, the second photoelectric converter is not limited to a photoelectric converter that detects light having a wavelength in the infrared light range, and may be a photoelectric converter that detects light having a wavelength in another wavelength range. In addition, in a case where the photoelectric converter 10 is not an iTOF sensor, only one transfer transistor (TG) may be provided.

Furthermore, in the embodiments and the like described above, the imaging element in which the photoelectric converter 10 including the photoelectric conversion region 12 and the organic photoelectric converter 20 including the organic photoelectric conversion layer 22 are stacked with the intermediate layer 40 interposed therebetween is described as an example of the photoelectric conversion element of the present disclosure; however, the present disclosure is not limited thereto. For example, the photoelectric conversion element of the present disclosure may have a configuration in which two organic photoelectric conversion regions are stacked, or a configuration in which two inorganic photoelectric conversion regions are stacked. In addition, in the embodiments and the like described above, the photoelectric converter 10 detects mainly light having a wavelength in the infrared light range and photoelectrically converts the light, and the organic photoelectric converter 20 detects mainly light having a wavelength in the visible light range and photoelectrically converts the light; however, the photoelectric conversion element of the present disclosure is not limited thereto. In the photoelectric conversion element of the present disclosure, wavelength ranges to which the first photoelectric converter and the second photoelectric converter have sensitivity are freely settable.

In addition, constituent materials of respective components of the photoelectric conversion element of the present disclosure are not limited to the materials described in the embodiments and the like described above. For example, in a case where the first photoelectric converter or the second photoelectric converter receives light in the visible light region and photoelectrically convert the light, the first photoelectric converter or the second photoelectric converter may include a quantum dot.

According to a photoelectric conversion element according to an embodiment of the present disclosure, the configuration described above makes it possible to obtain, for example, visible light image information having high image quality and infrared light image information including distance information.

It is to be noted that the effects described herein are merely illustrative and non-limiting, and other effects may be provided. In addition, the present technology may have the following configurations.

(1)
A photoelectric conversion element including:
a semiconductor substrate;
a first photoelectric converter that is provided on the semiconductor substrate, and detects light in a first wavelength range and photoelectrically converts the light;
a second photoelectric converter that is provided at a position overlapping the first photoelectric converter in a thickness direction of the semiconductor substrate in the semiconductor substrate, and detects light in a second wavelength range and photoelectrically converts the light;
an optical filter that is sandwiched between the first photoelectric converter and the second photoelectric converter in the thickness direction, and through which the light in the second wavelength range passes more easily than the light in the first wavelength range; and
a first light-shielding member that surrounds the optical filter along a plane orthogonal to the thickness direction to at least partially overlap the optical filter in a plane direction along the plane, and shields at least the light in the second wavelength range.

(2)
The photoelectric conversion element according to (1), in which
the first wavelength range includes a visible light range, and
the second wavelength range includes an infrared light range.

(3)
The photoelectric conversion element according to (1) or (2), further including a second light-shielding member provided to surround the second photoelectric converter in the plane direction.

(4)
The photoelectric conversion element according to any one of (1) to (3), further including a through electrode extending in the thickness direction to couple a surface of the semiconductor substrate and the first photoelectric converter, the surface being on side opposite to the first photoelectric converter as viewed from the second photoelectric converter.

(5)
The photoelectric conversion element according to (4), in which the through electrode penetrates inside the first light-shielding member in the thickness direction.

(6)
The photoelectric conversion element according to (4) or (5), further including a second light-shielding member provided to surround the second photoelectric converter in the in-plane direction, in which
the through electrode includes
a first through electrode portion that penetrates inside the first light-shielding member in the thickness direction, and
a second through electrode portion that penetrates inside the second light-shielding member in the thickness direction.

(7)
The photoelectric conversion element according to any one of (1) to (6), in which the first light-shielding member mainly includes an oxide.

(8)
The photoelectric conversion element according to any one of (1) to (6), in which the first light-shielding member mainly includes a metal.

(9)
The photoelectric conversion element according to (4), in which
the first light-shielding member includes an electrically conductive material, and
an insulating layer is provided between the through electrode and the first light-shielding member.

(10)
The photoelectric conversion element according to any one of (6) to (8), in which
the through electrode further includes a coupling electrode portion that couples the first through electrode portion and the second through electrode portion, and
a maximum dimension in the in-plane direction of the coupling electrode portion is larger than both a maximum dimension in the in-plane direction of the first through electrode portion and a maximum dimension in the in-plane direction of the second through electrode portion.

(11)
The photoelectric conversion element according to (10), in which the coupling electrode portion is provided at a position overlapping the optical filter in the in-plane direction.

(12)
The photoelectric conversion element according to (10), in which the coupling electrode portion is provided to overlap the optical filter in the thickness direction.

(13)
The photoelectric conversion element according to any one of (1) to (12), further including a pillar that penetrates through the optical filter in the thickness direction.

(14)
The photoelectric conversion element according to (13), in which
the pillar includes an inorganic material, and
the optical filter includes an organic material.

(15)

The photoelectric conversion element according to (13) or (14), further including a light-shielding film provided to overlap the pillar in the thickness direction.

(16)

The photoelectric conversion element according to (15), in which the light-shielding film includes a metal material.

(17)

The photoelectric conversion element according to (15) or (16), in which the light-shielding film reflects first wavelength light.

(18)

The photoelectric conversion element according to any one of (1) to (17), further including a transition metal chalcogenide layer that is sandwiched between the first photoelectric converter and the second photoelectric converter in the thickness direction, and includes a transition metal chalcogenide material.

(19)

The photoelectric conversion element according to (8), in which the first light-shielding member includes a liner layer and a metal layer that covers the liner layer.

(20)

The photoelectric conversion element according to (19), in which the first light-shielding member further includes a liner base layer as a base of the liner layer.

(21)

The photoelectric conversion element according to any one of (1) to (20), further including a hydrogen sealing film sandwiched between the first photoelectric converter and the optical filter in the thickness direction.

(22)

The photoelectric conversion element according to (21), in which the first photoelectric converter includes a stacked structure and an electric charge accumulation electrode, the stacked structure including a first electrode, a first photoelectric conversion layer, and a second electrode that are stacked in order, and the electric charge accumulation electrode disposed apart from the first electrode and disposed to be opposed to the first photoelectric conversion layer with an insulating layer interposed therebetween.

(23)

The photoelectric conversion element according to (21) or (22), in which
the optical filter has a front surface, and
the front surface of the optical filter is covered with the hydrogen sealing film.

(24)

The photoelectric conversion element according to any one of (21) to (23), in which
the optical filter has a front surface and a side surface, and
the front surface and the side surface of the optical filter are conformally coated with the hydrogen sealing film.

(25)

The photoelectric conversion element according to any one of (21) to (24), in which the hydrogen sealing film mainly includes a metal oxide.

(26)

The photoelectric conversion element according to (25), in which the metal oxide includes $AlO_x$ (aluminum oxide), $ZrO_2$ (zirconium oxide), $HfO_2$ (hafnium oxide), or $TiO_2$ (titanium oxide).

(27)

The photoelectric conversion element according to any one of (1) to (26), further including an optical member that is sandwiched between the first photoelectric converter and the second photoelectric converter in the thickness direction, and has a concave surface opposed to the first photoelectric converter to reflect the light in the first wavelength range.

(28)

The photoelectric conversion element according to (27), in which the optical filter also serves as the optical member.

(29)

The photoelectric conversion element according to (27) or (28), in which the concave surface includes a reflection surface that reflects the light in the first wavelength range toward the first photoelectric converter.

(30)

The photoelectric conversion element according to any one of (27) to (29), further including a plurality of color filters arranged in the plane direction on side opposite to the second photoelectric converter as viewed from the first photoelectric converter, in which
a plurality of the concave surfaces is provided corresponding one by one to the plurality of color filters.

(31)

The photoelectric conversion element according to any one of (1) to (30), further including:
a plurality of color filters arranged in the plane direction on side opposite to the second photoelectric converter as viewed from the first photoelectric converter; and
an inter-pixel light-shielding wall that is sandwiched between the optical filter and the first photoelectric converter and provided at a position corresponding to each of boundaries between the plurality of color filters.

(32)

The photoelectric conversion element according to any one of (1) to (31), further including at least one of a first antireflection film or a second antireflection film, in which
the optical filter has a first front surface opposed to the first photoelectric converter and a second front surface opposed to the second photoelectric converter, and
the first antireflection film covers the first front surface, and the second antireflection film covers the second front surface.

(33)

The photoelectric conversion element according to any one of (1) to (32), in which the optical filter includes a lens having negative refractive power or positive refractive power.

(34)

The photoelectric conversion element according to any one of (1) to (33), in which the optical filter has a structure in which an organic material portion including an organic material and an inorganic material portion including an inorganic material are stacked in the thickness direction.

(35)

The photoelectric conversion element according to (34), in which the inorganic material portion is sandwiched between the organic material portion and the first photoelectric converter.

(36)

The photoelectric conversion element according to (34) or (35), in which the inorganic material portion has a structure in which a first inorganic material layer having a first refractive index and a second inorganic material layer having a second refractive index are alternately stacked in the thickness direction.

(37)

The photoelectric conversion element according to any one of (1) to (36), further including a transparent wiring line embedded in the optical filter.

(38)
The photoelectric conversion element according to (37), in which
the optical filter includes a plurality of optical filter layers stacked, and
the transparent wiring line is embedded in each of the plurality of optical filter layers.

(39)
The photoelectric conversion element according to (38), in which the plurality of optical filter layers includes an organic optical filter layer and an inorganic optical filter layer.

(40)
The photoelectric conversion element according to (38) or (39), in which
the plurality of optical filter layers includes a first optical filter layer, a second optical filter layer, and a third optical filter layer,
the plurality of transparent wiring lines includes a first transparent wiring line that penetrates through the first optical filter in the thickness direction, a second transparent wiring line that penetrates through the second optical filter layer in the thickness direction, and a third transparent wiring line that penetrates through the third optical filter layer in the thickness direction, and
a first coupling position between the first transparent wiring line and the second transparent wiring line is different from a second coupling position between the second transparent wiring line and the third transparent wiring line in the plane direction orthogonal to the thickness direction.

(41)
A photodetection system provided with a light-emitting device that emits infrared light and a photodetector that includes a photoelectric conversion element, the photoelectric conversion element including:
a semiconductor substrate;
a first photoelectric converter that is provided on the semiconductor substrate, and detects visible light from outside and photoelectrically converts the visible light;
a second photoelectric converter that is provided at a position overlapping the first photoelectric converter in a thickness direction of the semiconductor substrate in the semiconductor substrate, and detects the infrared light from the light-emitting device and photoelectrically converts the infrared light;
an optical filter that is sandwiched between the first photoelectric converter and the second photoelectric converter in the thickness direction, and through which the infrared light passes more easily than the visible light; and
a first light-shielding member that surrounds the optical filter along a plane orthogonal to the thickness direction to at least partially overlap the optical filter in a plane direction along the plane, and shields at least the infrared light.

(42)
An electronic apparatus provided with an optical section, a signal processor, and a photoelectric conversion element, the photoelectric conversion element including:
a semiconductor substrate;
a first photoelectric converter that is provided on the semiconductor substrate, and detects light in a first wavelength range and photoelectrically converts the light;
a second photoelectric converter that is provided at a position overlapping the first photoelectric converter in a thickness direction of the semiconductor substrate in the semiconductor substrate, and detects light in a second wavelength range and photoelectrically converts the light;
an optical filter that is sandwiched between the first photoelectric converter and the second photoelectric converter in the thickness direction, and through which the light in the second wavelength range passes more easily than the light in the first wavelength range; and
a first light-shielding member that surrounds the optical filter along a plane orthogonal to the thickness direction to at least partially overlap the optical filter in a plane direction along the plane, and shields at least the light in the second wavelength range.

(43)
A mobile body provided with a photodetection system including a light-emitting device and a photodetector, the light-emitting device that emits irradiation light, the photodetector including a photoelectric conversion element, the photoelectric conversion element including:
a semiconductor substrate;
a first photoelectric converter that is provided on the semiconductor substrate, and detects light in a first wavelength range of the irradiation light and photoelectrically converts the light;
a second photoelectric converter that is provided at a position overlapping the first photoelectric converter in a thickness direction of the semiconductor substrate in the semiconductor substrate, and detects light in a second wavelength range of the irradiation light and photoelectrically converts the light;
an optical filter that is sandwiched between the first photoelectric converter and the second photoelectric converter in the thickness direction, and through which the light in the second wavelength range passes more easily than the light in the first wavelength range; and
a first light-shielding member that surrounds the optical filter along a plane orthogonal to the thickness direction to at least partially overlap the optical filter in a plane direction along the plane, and shields at least the light in the second wavelength range.

This application claims the priority on the basis of Japanese Patent Application No. 2020-208716 filed on Dec. 16, 2020 with Japan Patent Office, the entire contents of which are incorporated in this application by reference.

It should be understood by those skilled in the art that various modifications, combinations, sub-combinations, and alterations may occur depending on design requirements and other factors insofar as they are within the scope of the appended claims or the equivalents thereof.

The invention claimed is:
1. A light detecting device comprising:
a semiconductor substrate;
a first organic photoelectric converter that is provided on the semiconductor substrate, and detects light in a first wavelength range and photoelectrically converts the light;
a second photoelectric converter under the first organic photoelectric converter that detects light in a second wavelength range and photoelectrically converts the light;
an optical filter that is sandwiched between the first organic photoelectric converter and the second photoelectric converter and has a transmission band which is configured to pass the light in the second wavelength range and absorb at least a portion of the light in the first wavelength range; and a first light-shielding member that surrounds the optical filter, in plan view, to at least partially overlap the optical filter in an in-plane direction, and shields at least the light in the second wavelength range.

2. The light detecting device according to claim 1, wherein
the first wavelength range includes a visible light range, and
the second wavelength range includes an infrared light range.

3. The light detecting device according to claim 1, further comprising a second light-shielding member provided to surround the second photoelectric converter in the in-plane direction.

4. The light detecting device according to claim 1, further comprising a through electrode extending in a thickness direction of the semiconductor substrate to couple a surface of the semiconductor substrate and the first organic photoelectric converter, the surface being on side opposite to the first organic photoelectric converter as viewed from the second photoelectric converter.

5. The light detecting device according to claim 4, wherein the through electrode penetrates inside the first light-shielding member in the thickness direction.

6. The light detecting device according to claim 4, further comprising a second light-shielding member provided to surround the second photoelectric converter in the in-plane direction, wherein
the through electrode includes
a first through electrode portion that penetrates inside the first light-shielding member in the thickness direction, and
a second through electrode portion that penetrates inside the second light-shielding member in the thickness direction.

7. The light detecting device according to claim 1, wherein the first light-shielding member mainly includes an oxide.

8. The light detecting device according to claim 1, wherein the first light-shielding member mainly includes a metal.

9. The light detecting device according to claim 4, wherein
the first light-shielding member includes an electrically conductive material, and
an insulating layer is provided between the through electrode and the first light-shielding member.

10. The light detecting device according to claim 6, wherein
the through electrode further includes a coupling electrode portion that couples the first through electrode portion and the second through electrode portion, and
a maximum dimension in the in-plane direction of the coupling electrode portion is larger than both a maximum dimension in the in-plane direction of the first through electrode portion and a maximum dimension in the in-plane direction of the second through electrode portion.

11. The light detecting device according to claim 10, wherein the coupling electrode portion is provided at a position overlapping the optical filter in the in-plane direction.

12. The light detecting device according to claim 10, wherein the coupling electrode portion is provided to overlap the optical filter in the thickness direction.

13. The light detecting device according to claim 1, further comprising a pillar that penetrates through the optical filter in a thickness direction of the semiconductor substrate.

14. The light detecting device according to claim 13, wherein
the pillar includes an inorganic material, and
the optical filter includes an organic material.

15. The light detecting device according to claim 13, further comprising a light-shielding film provided to overlap the pillar in the thickness direction.

16. The light detecting device according to claim 15, wherein the light-shielding film includes a metal material.

17. The light detecting device according to claim 15, wherein the light-shielding film reflects first wavelength light.

18. The light detecting device according to claim 1, further comprising a transition metal chalcogenide layer that is sandwiched between the first organic photoelectric converter and the second photoelectric converter in a thickness direction of the semiconductor substrate, and includes a transition metal chalcogenide material.

19. The light detecting device according to claim 8, wherein the first light-shielding member includes a liner layer and a metal layer that covers the liner layer.

20. The light detecting device according to claim 19, wherein the first light-shielding member further includes a liner base layer as a base of the liner layer.

21. The light detecting device according to claim 1, further comprising a hydrogen sealing film sandwiched between the first organic photoelectric converter and the optical filter in a thickness direction of the semiconductor substrate.

22. The light detecting device according to claim 21, wherein the first organic photoelectric converter includes a stacked structure and an electric charge accumulation electrode, the stacked structure including a first electrode, a first photoelectric conversion layer, and a second electrode that are stacked in order, and the electric charge accumulation electrode disposed apart from the first electrode and disposed to be opposed to the first photoelectric conversion layer with an insulating layer interposed therebetween.

23. The light detecting device according to claim 21, wherein
the optical filter has a front surface, and
the front surface of the optical filter is covered with the hydrogen sealing film.

24. The light detecting device according to claim 21, wherein
the optical filter has a front surface and a side surface, and
the front surface and the side surface of the optical filter are conformally coated with the hydrogen sealing film.

25. The light detecting device according to claim 21, wherein the hydrogen sealing film mainly includes a metal oxide.

26. The light detecting device according to claim 25, wherein the metal oxide comprises AlOx (aluminum oxide), $ZrO_2$ (zirconium oxide), $HfO_2$ (hafnium oxide), or $TiO_2$ (titanium oxide).

27. The light detecting device according to claim 1, further comprising an optical member that is sandwiched between the first organic photoelectric converter and the second photoelectric converter in a thickness direction of the semiconductor substrate, and has a concave surface opposed to the first photoelectric converter to reflect the light in the first wavelength range.

28. The light detecting device according to claim 27, wherein the optical filter also serves as the optical member.

29. The light detecting device according to claim 27, wherein the concave surface comprises a reflection surface that reflects the light in the first wavelength range toward the first organic photoelectric converter.

30. The light detecting device according to claim 27, further comprising a plurality of color filters arranged in the plane direction on side opposite to the second photoelectric converter as viewed from the first organic photoelectric converter, wherein a plurality of the concave surfaces is provided corresponding one by one to the plurality of color filters.

31. The light detecting device according to claim 1, further comprising:
a plurality of color filters arranged in the plane direction on side opposite to the second photelectric converter as viewed from the first organic photoelectric converter; and
an inter-pixel light-shielding wall that is sandwiched between the optical filter and the first organic photoelectric converter and provided at a position corresponding to each of boundaries between the plurality of color filters.

32. The light detecting device according to claim 1, further comprising at least one of a first antireflection film or a second antireflection film, wherein the optical filter has a first front surface opposed to the first organic photoelectric converter and a second front surface opposed to the second photoelectric converter, and the first antireflection film covers the first front surface, and the second antireflection film covers the second front surface.

33. The light detecting device according to claim 1, wherein the optical filter comprises a lens having negative refractive power or positive refractive power.

34. The light detecting device according to claim 1, wherein the optical filter has a structure in which an organic material portion including an organic material and an inorganic material portion including an inorganic material are stacked in a thickness direction of the semiconductor substrate.

35. The light detecting device according to claim 34, wherein the inorganic material portion is sandwiched between the organic material portion and the first organic photoelectric converter.

36. The light detecting device according to claim 34, wherein the inorganic material portion has a structure in which a first inorganic material layer having a first refractive index and a second inorganic material layer having a second refractive index are alternately stacked in the thickness direction.

37. The light detecting device according to claim 1, further comprising a transparent wiring line embedded in the optical filter.

38. The light detecting device according to claim 37, wherein
the optical filter includes a plurality of optical filter layers stacked, and
the transparent wiring line is embedded in each of the plurality of optical filter layers.

39. The light detecting device according to claim 38, wherein the plurality of optical filter layers includes an organic optical filter layer and an inorganic optical filter layer.

40. The light detecting device according to claim 38, wherein
the plurality of optical filter layers includes a first optical filter layer, a second optical filter layer, and a third optical filter layer,
the plurality of transparent wiring lines includes a first transparent wiring line that penetrates through the first optical filter in a thickness direction of the semiconductor substrate, a second transparent wiring line that penetrates through the second optical filter layer in the thickness direction, and a third transparent wiring line that penetrates through the third optical filter layer in the thickness direction, and
a first coupling position between the first transparent wiring line and the second transparent wiring line is different from a second coupling position between the second transparent wiring line and the third transparent wiring line in the plane direction orthogonal to the thickness direction.

41. The light detecting device according to claim 1, wherein the first light-shielding member only shields light in the second wavelength range.

42. The light detecting device according to claim 1, wherein the first light-shielding member shields light in the first wavelength range and the second wavelength range.

43. A photodetection system provided with a light-emitting device that emits infrared light and a photodetector that includes a light detecting device, the light detecting device comprising:
a semiconductor substrate;
a first organic photoelectric converter that is provided on the semiconductor substrate, and detects visible light from outside and photoelectrically converts the visible light;
a second photoelectric converter under the first organic photoelectric converter that detects the infrared light from the light-emitting device and photoelectrically converts the infrared light;
an optical filter that is sandwiched between the first organic photoelectric converter and the second photoelectric converter and has a transmission band which is configured to pass the infrared light and absorb at least a portion of the visible light; and
a first light-shielding member that surrounds the optical filter, in plan view, to at least partially overlap the optical filter in an in-plane direction, and shields at least the infrared light.

44. An electronic apparatus provided with an optical section, a signal processor, and a light detecting device, the light detecting device comprising:
a semiconductor substrate;
a first organic photoelectric converter that is provided on the semiconductor substrate, and detects light in a first wavelength range and photoelectrically converts the light;
a second photoelectric converter under the first organic photoelectric converter that detects light in a second wavelength range and photoelectrically converts the light;
an optical filter that is sandwiched between the first organic photoelectric converter and the second photoelectric converter and has a transmission band which is configured to pass the light in the second wavelength range and absorb at least a portion of the light in the first wavelength range; and
a first light-shielding member that surrounds the optical filter, in plan view, to at least partially overlap the optical filter in an in-plane direction, and shields at least the light in the second wavelength range.

45. A mobile device provided with a photodetection system including a light-emitting device and a photodetector, the light-emitting device that emits irradiation light, the photodetector including a light detecting device, the light detecting device comprising:
- a semiconductor substrate;
- a first organic photoelectric converter that is provided on the semiconductor substrate, and detects light in a first wavelength range of the irradiation light and photoelectrically converts the light;
- a second photoelectric converter under the first photoelectric converter that detects light in a second wavelength range of the irradiation light and photoelectrically converts the light;
- an optical filter that is sandwiched between the first organic photoelectric converter and the second photoelectric converter and has a transmission band which is configured to pass the light in the second wavelength range and absorb at least a portion of the light in the first wavelength range; and
- a first light-shielding member that surrounds the optical filter, in plan view, to at least partially overlap the optical filter in an in-plane direction, and shields at least the light in the second wavelength range.

* * * * *